United States Patent [19]

Kusano et al.

[11] Patent Number: 5,754,576
[45] Date of Patent: May 19, 1998

[54] SEMICONDUCTOR LASER CONTROL APPARATUS AND IMAGE FORMING APPARATUS USING THE SAME

[75] Inventors: Akihisa Kusano, Kitsuki; Izumi Narita, Koganei; Yuzo Seino, Kawasaki; Kaoru Sato, Yokohama; Tatsuto Tachibana, Kawasaki, all of Japan

[73] Assignee: Canon Kabushiki Kaisha, Tokyo, Japan

[21] Appl. No.: 680,549

[22] Filed: Jul. 9, 1996

Related U.S. Application Data

[63] Continuation of Ser. No. 249,886, May 26, 1994, abandoned, which is a continuation-in-part of Ser. No. 125,397, Sep. 23, 1993, abandoned.

[30] Foreign Application Priority Data

| Sep. 24, 1992 | [JP] | Japan | 4-254287 |
| May 27, 1993 | [JP] | Japan | 5-126120 |
| Aug. 20, 1993 | [JP] | Japan | 5-206592 |

[51] Int. Cl.[6] .................................. H01S 3/00
[52] U.S. Cl. .................. 372/38; 372/29; 372/33
[58] Field of Search ............................ 372/29–33, 38

[56] References Cited

U.S. PATENT DOCUMENTS

| 4,837,787 | 6/1989 | Takesue et al. | 372/29 |
| 4,890,288 | 12/1989 | Inuyama et al. | 372/31 |
| 5,019,769 | 5/1991 | Levinson | 372/31 |
| 5,594,748 | 1/1997 | Jabr | 372/38 |

FOREIGN PATENT DOCUMENTS

| 63-56069 | 3/1988 | Japan . |
| 5-145154 | 6/1993 | Japan . |

*Primary Examiner*—John D. Lee
*Attorney, Agent, or Firm*—Fitzpatrick, Cella, Harper & Scinto

[57] ABSTRACT

An apparatus using a semiconductor laser comprises a measuring unit for measuring a slope efficiency of the semiconductor laser; a determination unit for determining whether or not the measurement value reaches a specified value; and a notification unit for notifying the determination result of said determination unit.

42 Claims, 51 Drawing Sheets

SEMICONDUCTOR LASER CONTROL APPARATUS AND IMAGE FORMING APPARATUS USING THE SAME

This application is a continuation of application Ser. No. 08/249,886 filed May 26, 1994, abandoned, which is a continuation-in-part of application Ser. No. 08/125,397 filed Sep. 23, 1993, abandoned.

BACKGROUND OF THE INVENTION

1. Field of the Invention

The present invention relates to a semiconductor laser control apparatus and an image forming apparatus using it.

2. Description of the Related Art

FIG. 6 shows a brief structure of a laser beam printer, and FIG. 7 shows its circuit arrangement.

When a microprocessor 101 disposed in a controller (not shown) which controls the drive sequence of the laser beam printer begins the printing control of the laser beam printer, a photosensitive body 54 and a developing cylinder 57 deposed in a developer 56 are rotated. After that, a primary charger 55 uniformly electrifies the surface of the photosensitive body 54, and a laser beam 53 according to the image signal, which will be described later, is irradiated on the surface of the photosensitive body 54. A latent image is formed on the surface of the photosensitive body 54 by the laser beam 53, toner is transferred from the developing cylinder 57 to the surface of the photosensitive body 54 to form a toner image on the surface of the photosensitive body 54. The toner image is transferred by a transfer charger 58 to a recording material P carried by paper feed means (not shown).

The toner image transferred to the recording material P is thermally fixed to the recording material by a fixer 60. Residual toner remaining on the surface of the photosensitive body 54 is removed by a cleaner 59 to be prepared for next image formation.

The laser beam 53 is emitted by a semiconductor laser 201, passed through a collimator lens 204 and a cylindrical lens 205, and irradiated to a scanning mirror 206. Since the scanning mirror 206 is rotated at a constant speed by a motor (not shown), the laser beam 53 reflected by the scanning mirror 206 is passed through a toric lens 207 and a focusing lens (fθ lens) 208, and scans the surface of the photosensitive body 54. The semiconductor laser 201 is turned on and off by the microprocessor 101 disposed in a controller (not shown) according to a laser drive signal (a) generated on the basis of the image signal. At this moment, it is necessary to maintain constantly for output intensity of the semiconductor laser 201, in order to obtain a uniform spot form of the laser beam 53 focused on the surface of the photosensitive body 54. For this purpose, the laser output intensity is detected as an intensity current (e) by a photodiode disposed in the package of the semiconductor laser 201, amplified by a preamplifier 203, I–V converted, and the value of the laser output intensity is inputted to the microprocessor 101 through an A/D converter 103. The microprocessor 101 sets a drive current reference data (c), and inputs a laser drive (operation) current reference signal (d) to the laser drive circuit 202 through a D/A converter 102, so that output intensity of the semiconductor laser 201 has a desired value. Since the laser drive circuit 202 flows a laser emitting current according to the laser emitting current reference signal (d), a desired laser output intensity can be obtained.

Due to changes with time etc., in the semiconductor laser 201, the laser emitting current in order to obtain preferable laser output intensity for image formation tends to increase. At this moment, the laser emitting current, to assure the image quality, is set a limit Iopmax in according to periods of rising time and falling time of the laser drive current, tolerable loss, variation in light wavelength due to temperature increase, and the like. Therefore, as shown in FIG. 9, when the laser emitting current reaches a laser emitting current upper limit Iopmax, the laser output intensity tends to decrease. In the result, degradation of image quality such as uneven density is caused. To prevent this, when the laser output intensity is not a desired value, even if the value of the laser emitting current is the laser emitting current upper limit Iopmax, the microprocessor determines that the laser service life is over, displays a message or an error code indicating a laser malfunction on a display 105, and stops operation of the apparatus.

FIG. 8 shows time changes in laser emitting current Iop when the laser emitting current Iop is controlled to CW-drive so that the laser output intensity is constant at a constant ambient temperature. With the passage of time, the laser emitting current Iop increases very slowly but, after the elapse of a time, sharply increases. The upper limit Iopmax of the laser emitting current shown by the laser emitting current reference signal (d) is limited by deviation of the laser threshold current, temperature dependency, tolerable loss, rising time and falling time of the laser emitting current. Therefore, as shown in FIG. 9, in order to obtain the optimum laser output intensity for the image formation, the laser emitting current Iop increases due to a change over time of the laser and, when the laser emitting current Iop reaches the laser emitting current upper limit Iopmax, it becomes impossible to obtain the optimum laser output intensity for the image formation. In the result, in the laser output intensity decreases soon. Therefore, there has been a problem in that, when the laser emitting current Iop increases exponentially, the laser output intensity sharply decreases, so that due to a change over time during use by the user, the image formation becomes impossible and the user is annoyed.

Furthermore, since a degree of decrease progress in the laser output intensity varies with the ambient temperature and characteristics of a specific laser, some laser shows a gradual decrease in laser output intensity, and then turns to a sharp decrease. As a result, there may be a case where printing is made at a laser output intensity lower than the desired value and, since the laser spot size focused on the photosensitive body becomes smaller, a degradation in image quality such as uneven density is generated.

Furthermore, when the desired laser output intensity is not obtained even if the laser emitting current Iop is the laser emitting current upper limit Iopmax, the microprocessor 101 determines that it is out of a service life of the laser, displays a message or an error code indicating a laser malfunction on a display 105, and stops operation of the apparatus, in order to prevent a degradation in image quality such as uneven density. Therefore, the laser output intensity decreases and the apparatus abruptly stops operation while the user is using the image formation device, so that the user is suffered from the trouble.

In addition, the laser is the one of the most important parts that determine the reliability of the image forming apparatus. However, laser is very weak to a surge and the like, and may be destroyed or degraded in characteristics by failure in providing a ground band, a current surge from a soldering iron, poor contact in connectors, and the like. In the past, most lasers underwent destruction malfunction but, at present, owing to thorough quality control, generation of a surge is basically prevented, however, occurrence of a malfunction due to a mistake or carelessness is not perfectly prevented. Furthermore, since, with the advance of the quality control system, generated surge is decreasing in energy amount, there is a high probability of parts defect generation in a semi-destruction (degradation in characteristics) condition. Therefore, there is a very high possibility that a laser with degraded characteristics may be incorporated in the apparatus.

When a laser with degraded characteristics is incorporated in the laser printer, laser malfunction detection means by a change over time of the laser described in the prior art example is almost impossible to detect a degradation in characteristics of the laser at the time of delivery. Therefore, when the laser beam printer is put on the market, the service life by a change over time of the laser is shorter than the normal laser, and MTBF (mean time between failure) of the laser beam printer becomes shorter, the problem that deteriorates the reliability and maintainability.

Furthermore, the laser intensity control apparatus used in this type of laser beam printer has means for controlling a drive current supplied to the semiconductor laser, means for detecting a light emission intensity of the semiconductor laser, and means for comparing the detected intensity with a target intensity. For example, an intensity control apparatus described in Japanese Patent Application Laying-open No. 56069/1988, executes the control for intensity in such a way that the count value corresponding to the drive current is incremented from zero (0) by a predetermined value and, if the intensity is within a range from the target intensity when the laser light emission exceeds the target intensity, the increase is ended, or if the intensity is out of the range, the above procedure is repeated from count zero (0).

To improve the efficiency of the intensity control by varying the drive current Stepwise, in an intensity control apparatus described in U.S. Pat. No. 4,837,787, a method is adopted such that the control is divided into a rough adjustment with a large increase in drive current at one time, and a fine adjustment with a small increase at one time, the rough adjustment is used until some portion of the target intensity, and the fine adjustment is used thereafter.

U.S. Pat. No. 4,837,787 also proposes a method in which control is started from a sufficiently small drive current in the initial intensity control and, after that, control is started from the output value at the time finally the target intensity was reached in the previous intensity control and adjusted Stepwise until the target intensity.

In laser intensity characteristics (I–l(el) characteristics) relative to the drive current of a semiconductor laser used in general, the semiconductor laser does not emit light up until a threshold value ($I_{th}$) of drive current I, as shown in FIG. 35, and in the light emission condition, the laser intensity l(el) has a given gradient α (=Δl(el.)/ΔI). The α is called a SLOPE efficiency.

Since the semiconductor laser has the above characteristics, the semiconductor laser has a danger that, while monitoring the intensity for controlling, when the drive current is substantially increased with the condition of non-light emission current up to Ith not emitting light, the drive laser abruptly begins light emission at the point where Ith is exceeded. In the result, this may cause degradation or thermal breakdown of the semiconductor laser.

Therefore, a method is used, in which the drive current is gradually varied Stepwise as the method shown in the above Japanese Patent Application Laying-open No. 56069/1988, but this method involves a problem that substantial time is required for the adjustment of the intensity.

When a method is used in which the rough adjustment and fine adjustment are separated to improve the efficiency of intensity adjustment as described in U.S. Pat. No. 4,837,787, it is effective to adjust the intensity by the rough adjustment to a value as close to the final target APCTGT of intensity as possible, however, to prevent the final target value APCTGT of intensity from being exceeded by the rough adjustment, the exchanging value CH between the rough adjustment and fine adjustment must be smaller than the final target value APCTGT of intensity at least by a intensity increases ΔPD for one rough adjustment (A>ΔPD). However, since the SLOPE efficiency a substantially varies according to each of the specific semiconductor laser, when the exchanging value CH between the rough adjustment and fine adjustment is determined for a greatest SLOPE efficiency a ((a) in FIG. 36), the fine adjustment has almost no effect for a small SLOPE efficiency a ((b) in FIG. 36).

Furthermore, there has been proposed a method in which controlling is started using an output value obtained in the previous intensity adjustment as an initial value to reduce the control time, however, even the drive current which has outputted the target intensity in the previous control timing may exceed the target intensity at the next control timing due to an environmental change or a change in characteristics of the laser itself.

In any control method, when monitoring the light emission energy of the semiconductor laser is executed, if it is necessary to read the light emission energy for a drive current for a plurality of times in order to prevent the occurrence of errors in readings due to a noise or the like, more time will be taken.

In particular, for use in a high-speed laser beam printer and the like, the above prior art method is not adaptable.

For the purpose to solve these problems, in Japanese Patent Application Laying-open No. 145154/1993, such a technique is disclosed that the semiconductor is driven by two types of the drive current, and on the basis of the light emission energy at this moment, differential efficiency (SLOPE efficiency) is required to determine the drive current to obtain a desired light emission energy.

However, this method has a problem that the accuracy is inferior since controlling for making a detective intensity coincident with a specified intensity is not executed.

SUMMARY OF THE INVENTION

A first object of the present invention is to provide an image forming apparatus which notifies a replacement time of the laser for the purpose of preventing from the trouble to users such as abrupt stoppage of the apparatus by measuring a slope efficiency of the laser, and printing malfunction and holds improved economy merit and reliability so as not to generate degradation in image quality.

A second object of the present invention is to provide an image forming apparatus with improved reliability and maintainability to prevent by measuring a slope efficiency of the laser, delivery of the laser with degraded characteristics.

A third object of the present invention is to provide an image forming apparatus which prevents a target intensity from being exceeded in a short time between sheets during continues printing even by a high-speed image forming apparatus.

A still further object of the present invention is to provide a semiconductor laser control apparatus which is possible to execute controlling for intensity in short time and with high accuracy so as not to destroy the semiconductor.

In a first aspect of the present invention, there is provided an apparatus using a semiconductor laser comprising:

measuring means for measuring a slope efficiency of the semiconductor laser;

determination means for determining whether or not the measurement value reaches a specified value; and notification means for notifying the determination result of the determination means.

In a second aspect of the present invention, there is provided an apparatus using a semiconductor laser comprising:

measuring means for measuring a slope efficiency of the semiconductor laser;

predicting means for predicting a slope efficiency after a specified time according to the measurement result;

determination means for determining whether or not the predicted slope efficiency reached a predetermined value; and notification means for notifying that the semiconductor laser is at exchanging timing, on the basis of the determination result.

In a third aspect of the present invention, there is provided an apparatus using a semiconductorlaser comprising:

measuring means for measuring a slope efficiency of the semiconductor laser;

instruction means; and output means for visually outputting the measurement result according to an instruction of the instruction means.

In a fourth aspect of the present invention, there is provided an apparatus using a semiconductor laser comprising:

measuring means for measuring a slope efficiency of the semiconductor laser;

detecting means for detecting emission intensity of a laser beam outputted from the semiconductor laser; and control means for controlling a drive current to the semiconductor laser;

wherein the control means includes first mode in which the drive current to the semiconductor is varied in stepwise on the basis of the output from the detecting means and a specified value and second mode in which the drive current to the semiconductor laser is determined on the basis of the slope efficiency measured by the measuring means.

In a fifth aspect of the present invention, there is provided an apparatus using a semiconductor laser comprising:

detection means for detecting laser emission intensity of the semiconductor laser; and control means for controlling supply current to the semiconductor laser to make the semiconductor laser generate at target emission intensity on the basis of the result of the detection of the detection means;

wherein the control means includes judge means for judging that a slope efficiency showing a change ratio of laser emission intensity of the semiconductor laser converged and calculation means for calculating a value of the supply current being necessary for making the semiconductor laser emit at specified intensity emission on the basis of the intensity of the emission detected by the detection means and the slope efficiency judged to be convergent by the judge means.

According to the present invention, with an eye on the fact that the slope (SLOPE) efficiency of the semiconductor laser reduces with the passage of time as shown in FIG. 10, in general the temperature dependency is small, when a constant surge voltage (100V in FIG. 11) is applied, it reduces in proportion to the application repetitions as shown in FIG. 11, and it reduces according to the degree of the surge voltage as shown in FIG. 12, by measuring or estimating the laser SLOPE efficiency, the laser replacement time or service life is detected, which is notified to the user.

According to the present invention, by outputting the measured slope efficiency itself at the delivery, a laser malfunction can be detected from the output value. Therefore, the present invention has following effects:

(1) Whether or not the laser is degraded in characteristics can be easily determined at the delivery, thereby preventing an apparatus incorporated with a degraded laser from being delivered, and assuring the laser-specific MTBF to improve the reliability and maintainability of the apparatus.

(2) The laser SLOPE efficiency can be easily measured to check degree of degradation of the SLOPE efficiency, thereby estimating the laser service life and improving the serviceability.

(3) Since changes in the SLOPE efficiency with the operation time of the apparatus can be determined, data for checking the reliability of the laser can be obtained. Therefore, the laser reliability can be traced and compared with the theoretical value, thereby improving the development efficiency.

Furthermore according to the present invention, the adjustment accuracy and the adjustment time can be well balanced by performing the intensity adjustment in two steps of a preliminary adjustment and a final adjustment. The preliminary adjustment is carried out in synchronization with an initial processing of another processing, use of a dedicated starting circuit is eliminated.

Still further, according to the present invention, initial data used for the final adjustment is corrected to improve the adjustment accuracy even further. Intensity adjustment is divided into two steps of a preliminary adjustment with conditions other than printing (e.g. rising condition, standby condition, etc.). The slope efficiency is determined in the preliminary adjustment, and intensity adjustment is carried out in the final adjustment utilizing the SLOPE efficiency, thereby efficiently achieving the final adjustment in a short control step and increasing the intensity adjustment speed.

The above and other object, effects, features and advantages of the present invention will become more apparent from the following description of embodiments thereof taken in conjunction with the accompanying drawings.

DETAILED DESCRIPTION OF THE PREFERRED EMBODIMENTS

Preferred embodiments of the present invention will now be described in detail with reference to the drawings.
(First embodiment)

Figure 1:
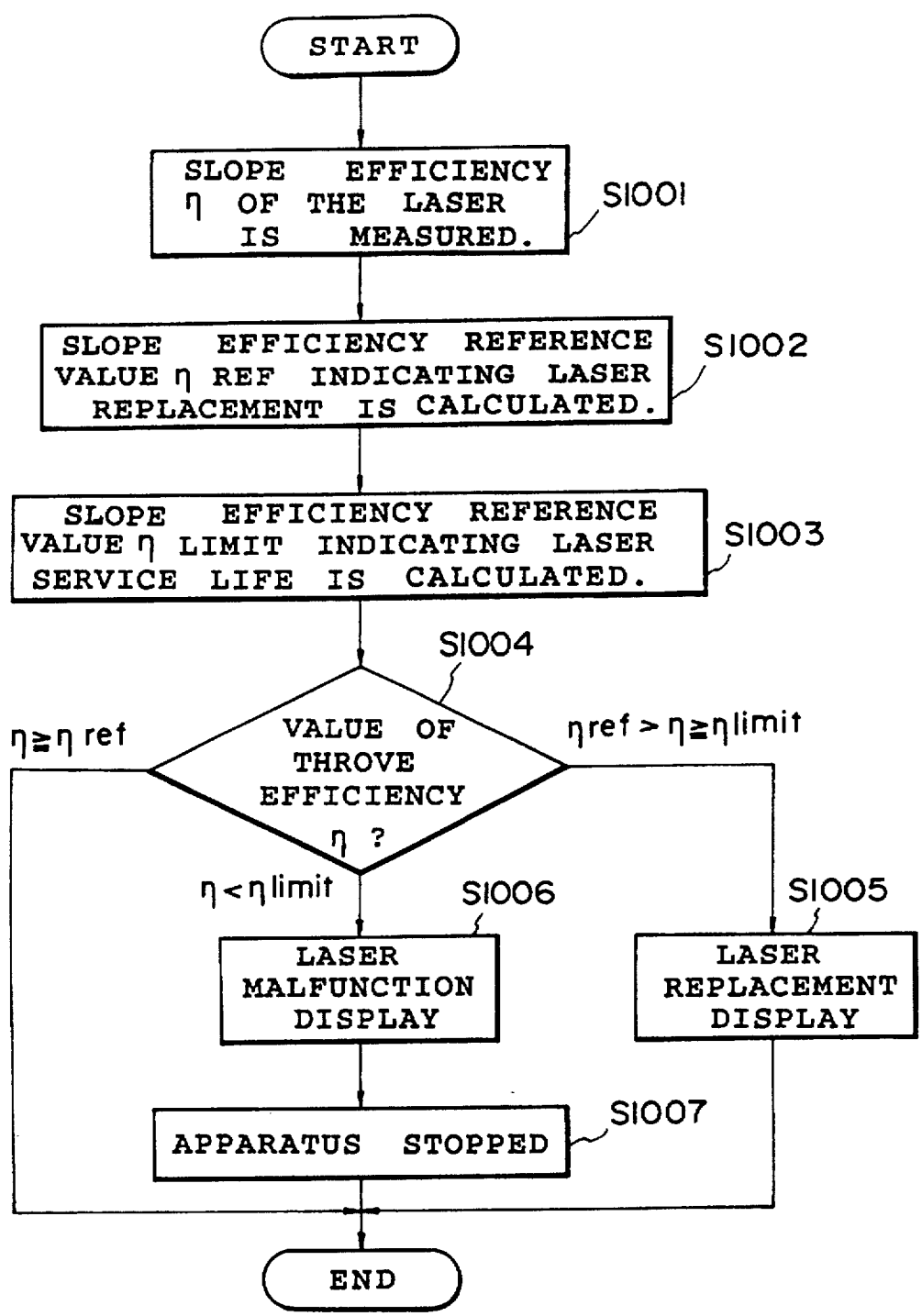
FIG. 1 is a flowchart showing a procedure of the first embodiment of the present invention.
Figure 6:
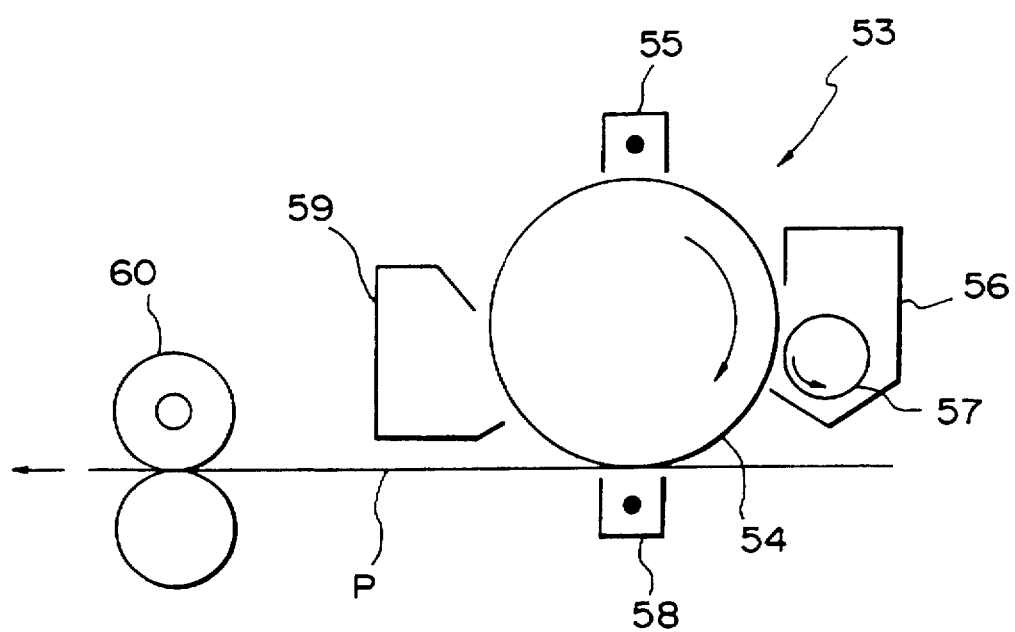
FIG. 6 is a cross sectional schematic diagram showing a brief structure of a prior art.
Figure 7:
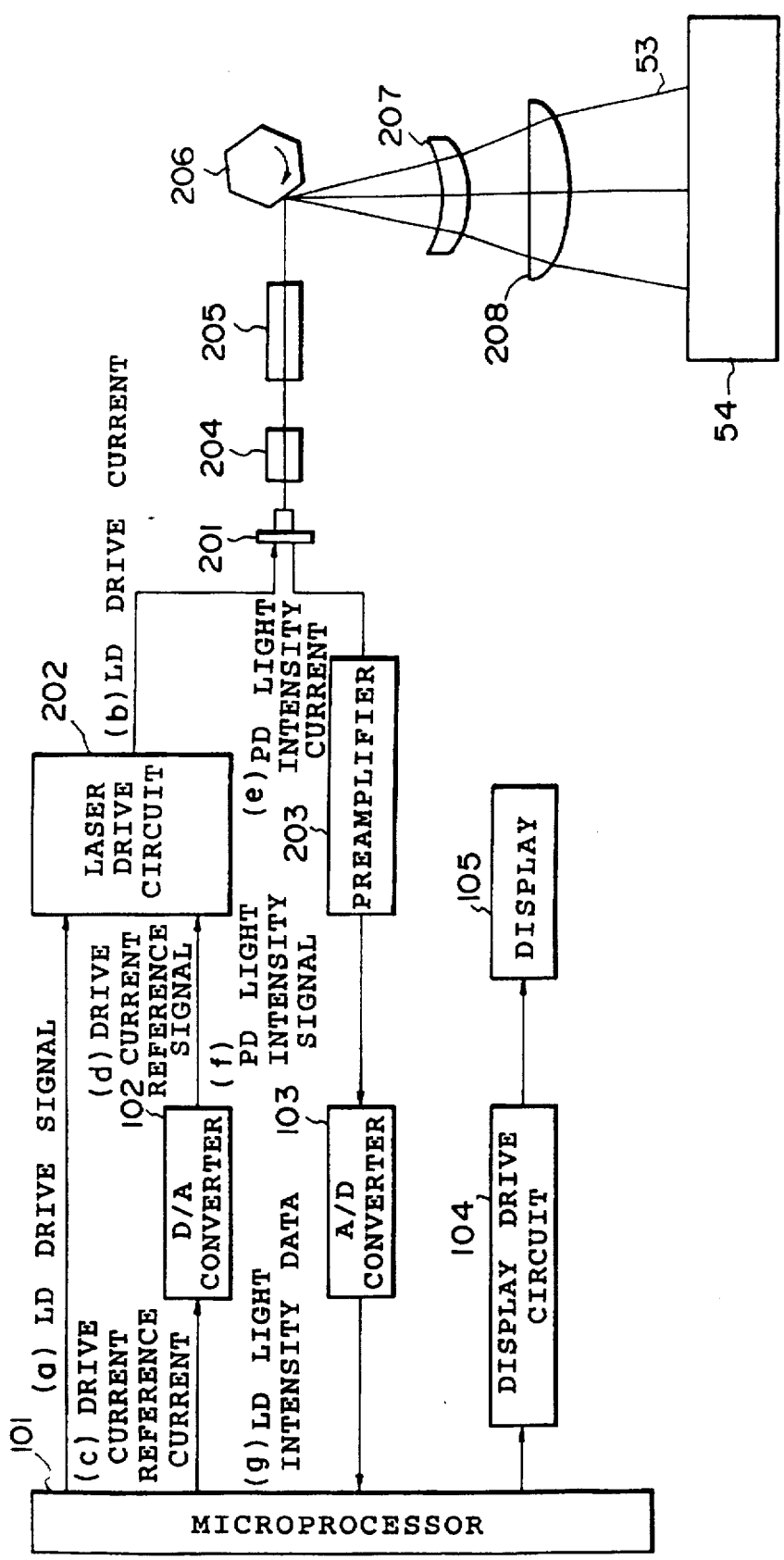
FIG. 7 is block diagram showing a circuit arrangement of the prior art.
Figure 8:
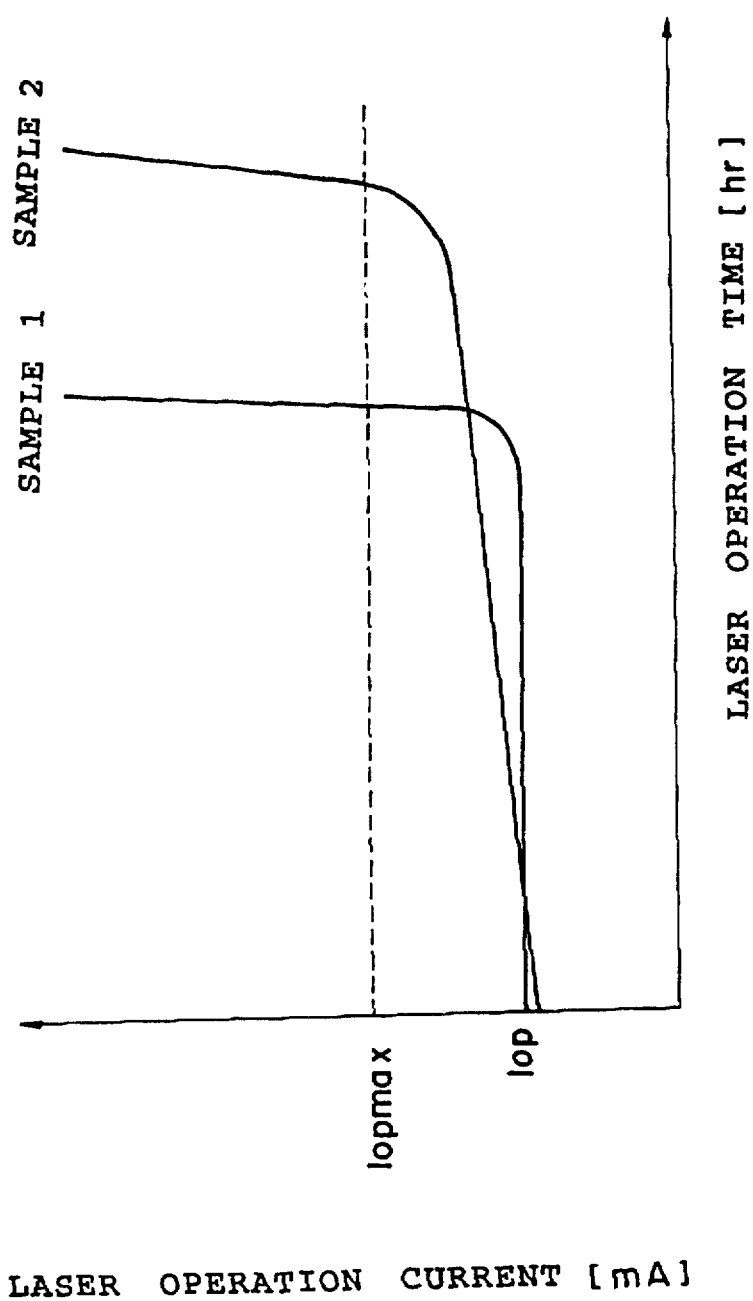
FIG. 8 is a graph showing changes in laser emitting current with time.
Figure 9:
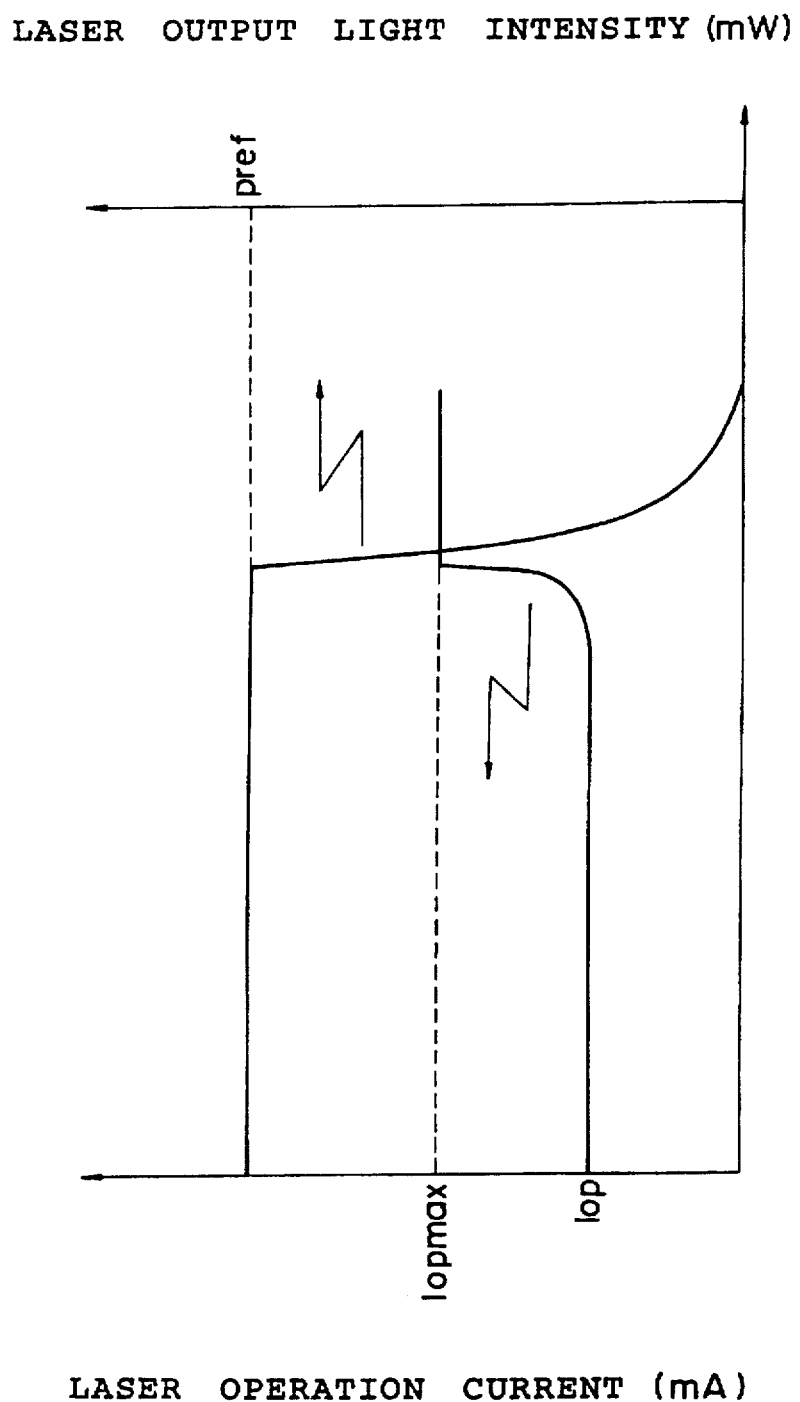
FIG. 9 is a graph showing changes in laser output intensity with time.
Figure 10:
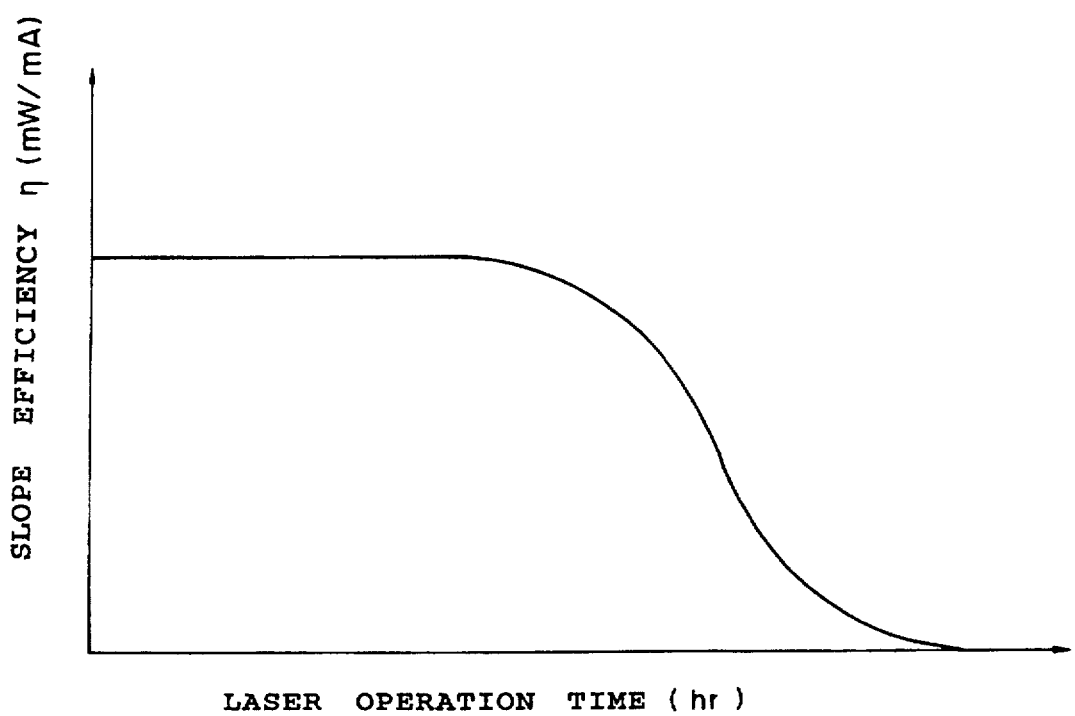
FIG. 10 is a graph showing changes in SLOPE efficiency with time.
Figure 11:
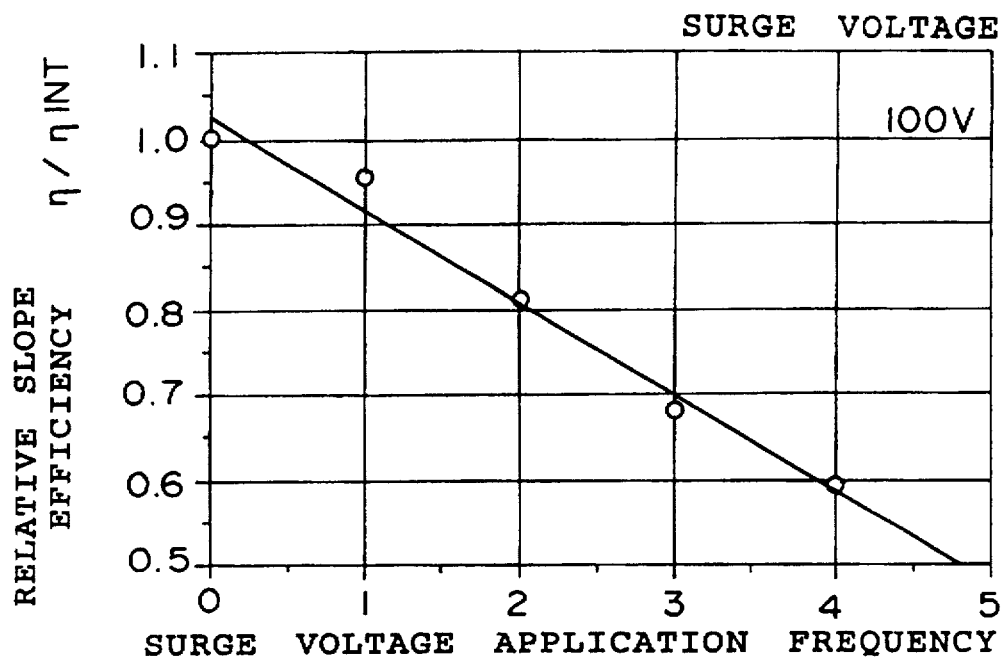
FIG. 11 is a graph showing the relation between surge voltage application repetition and SLOPE efficiency.
Figure 12:
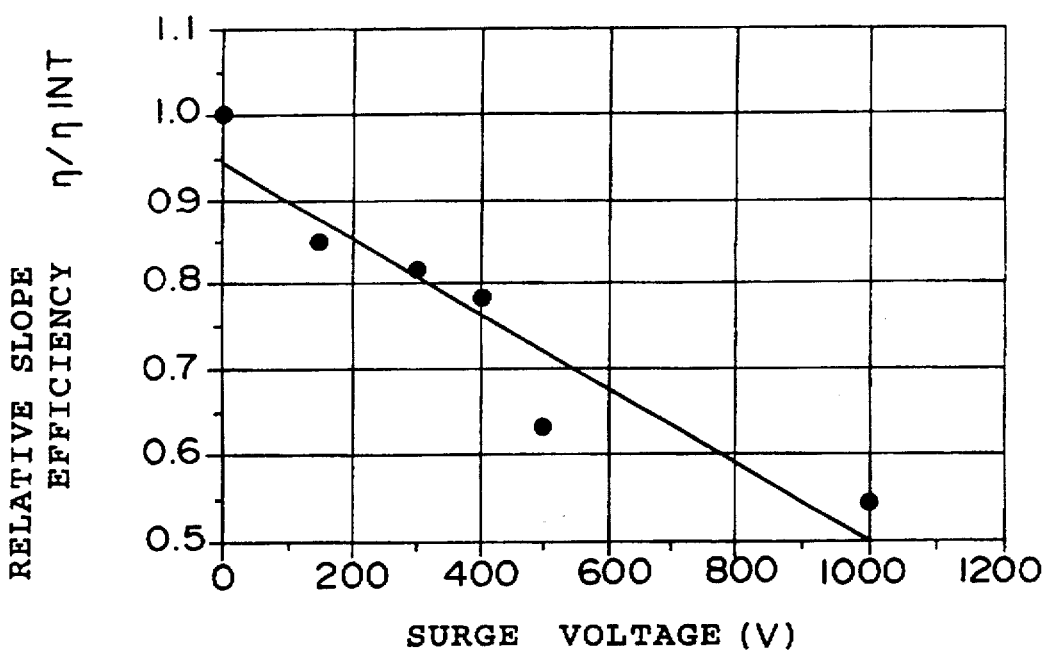
FIG. 12 is a graph showing the relation between surge voltage and SLOPE efficiency.

Since the arrangement of the first embodiment is the same as that of the prior art shown in FIG. 6 and FIG. 7, description of the same content is omitted, and only differences of the present invention are described. FIG. 1 shows the procedure according to the present invention.

Figure 2:
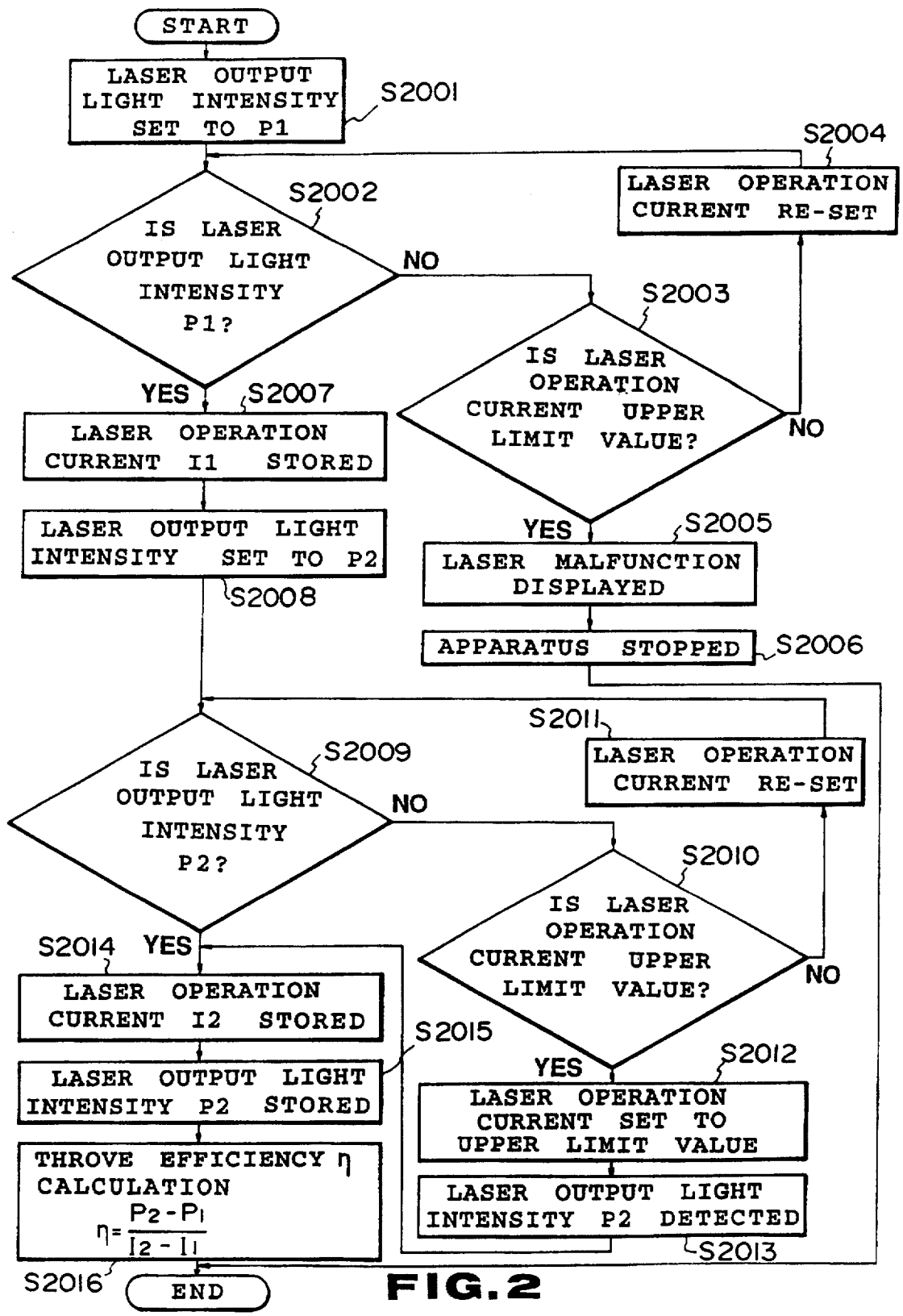
FIG. 2 is a flowchart showing a part of the procedure of FIG. 1 in detail.

First, in the step S1001, the laser SLOPE efficiency is measured using the procedure of the flowchart shown in FIG. 2. In FIG. 2, the microprocessor 101 sets the laser emitting current I1, that is, a laser operation reference data, while detecting the laser output intensity by the photodiode disposed in the package of the semiconductor laser 201, for the purpose that a desired output intensity P1 is obtained which is smaller than a laser output intensity Pref which is preferable for image formation (loop processing of Step S2002→Step S2003→Step S2004→Step S2002). At this moment, when the laser output intensity does not reach the laser output setting value P1 even if the laser emitting current I1 reaches Iopmax which is the upper limit of the tolerable laser emitting current, the microprocessor 101 determines the laser to be the end of the service life of the laser if the laser intensity does not reach the setting value P1 of the laser, next displays a message indicating a laser malfunction on the display 105, and then stops the operation of the apparatus (Step S2001→Step S2002→Step S2003→Step S2005→Step S2006).

When regarding to the laser output intensity, laser output setting value P1 is obtained in the smaller condition than the laser tolerable current upper limit value Iopmax, the value of the laser emitting current I1 at that time is stored in a random access memory (RAM) incorporated in the microprocessor 101 (Step S2001→Step S2002→Step S2007). Then, the microprocessor 101 set a laser emitting current I2 while detecting the laser output intensity so that the laser output intensity is a desired output intensity P2 which is higher than the output intensity P1, and lower than the laser output intensity Pref optimum for the image formation (Step S2009→Step S2011→Step S2009). At this moment, when the laser output intensity does not reach the desired laser output intensity P2 even if the laser emitting current I2 reaches the laser tolerable emitting current upper limit value Iopmax, the laser output intensity with the laser emitting current Iopmax is detected, and the laser tolerable emitting current upper limit value Iopmax as a laser emitting current I2 and the value of the detected laser output intensity as the output intensity P2 are stored in the RAM. When the desired laser output intensity P2 is obtained in the lower condition than the laser tolerable emitting current upper limit value Iopmax, the values of the laser emitting current I2 at that time and the desired laser output intensity P2 are stored in the RAM (Step S2015).

From the values of the laser operation currents I1, I2, the laser output intensity P2, and the desired laser output intensity P1 stored in the RAM of the microprocessor 101, a laser SLOPE efficiency η in use, now, is calculated (Step S2016):

$$\eta = \frac{(P2 - P1)}{(I2 - I1)} \quad (1)$$

In this case, a specified value ηref of laser SLOPE efficiency required under the operation condition of the apparatus is determined from the optimum laser output intensity Pref for the image formation and the laser tolerable emitting current upper limit value Iopmax as:

$$\eta ref = \frac{(Pref - P1)}{(Iopmax - I1)} \leq \eta, \quad (2)$$

The SLOPE efficiency limit value ηlimit for allowing a reduction in the laser output intensity to the limit, where uneven pitch or uneven density is not generated is determined by:

$$\eta \text{limit} = \frac{(K \times Pref - P1)}{(Iopmax - I1)} \leq \eta, \quad (3)$$

where K is a reduction factor of laser output intensity. The above calculation is executed in step S1002 and step S1003 of FIG. 1. The microprocessor 101 determines on the basis of the following comparison, that when the relation between the measured SLOPE efficiency and the described SLOPE efficiency limit ηref is η≧ηref, the use condition of the laser is normal, when ηref>η≧ηlimit, it is the laser replacement timing and, when ηlimit>η, it is the end of the service life of the laser. When the judgment of the replacement timing is obtained, a message that the laser replacement timing has come is displayed on the display 105 (Step S1005) and, when it is judged to be the end of the service life of the laser, a message indicating a laser malfunction is displayed on the display 105, and then the operation of the apparatus is stopped (Step S1007).

(Second embodiment)

A second embodiment will now be described with reference to FIG. 3.

Figure 3:
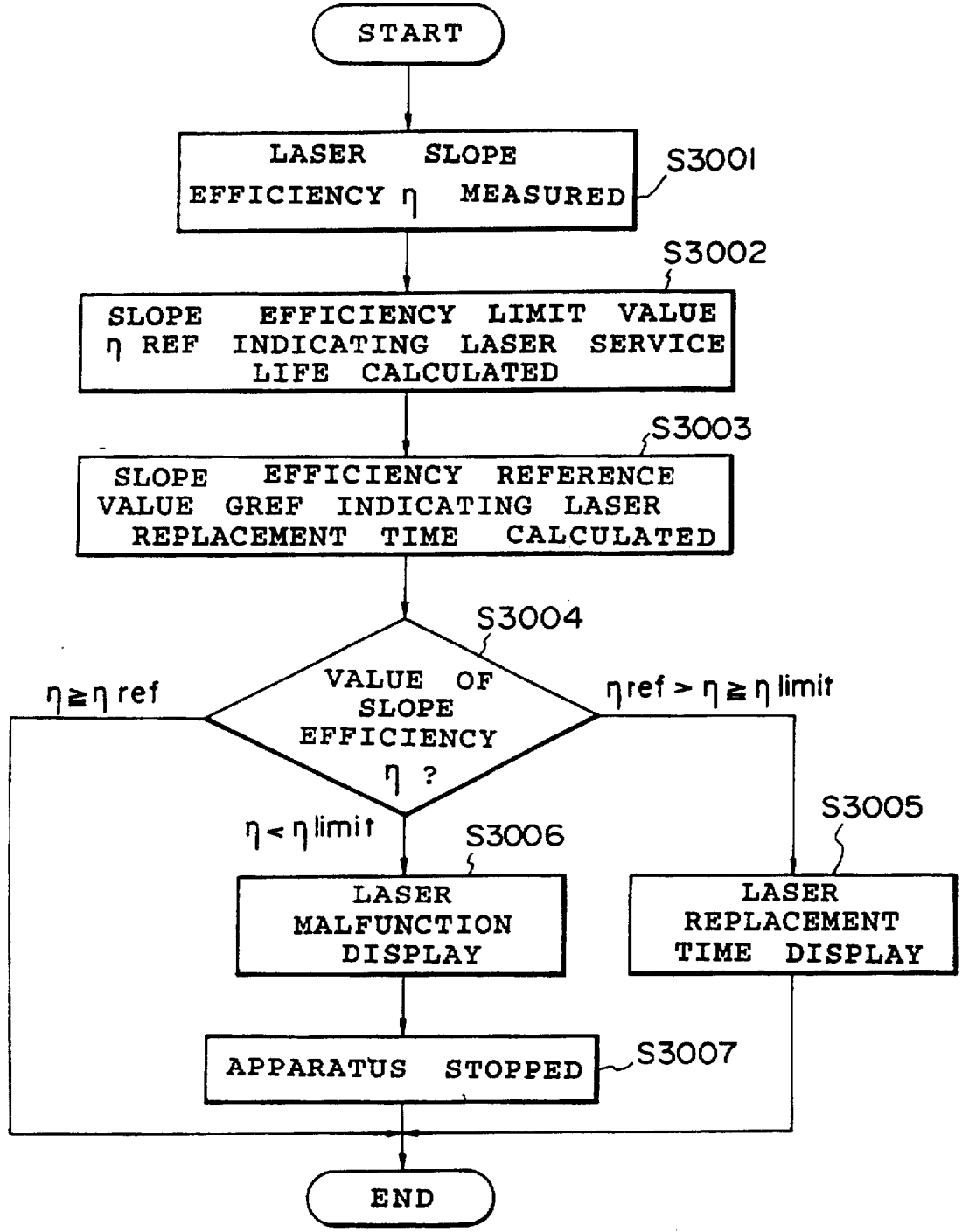
FIG. 3 is a flowchart showing another procedure as a second embodiment of the present invention.

Measurement of the laser SLOPE efficiency in Step S3001 of FIG. 3 is executed using the same procedure as in FIG. 2. The microprocessor 101 sets the laser operation reference data, that is, the laser emitting current I1, while detecting the laser output intensity by the photodiode disposed in the package of the semiconductor laser 201, so that the desired output intensity P1 is obtained in the smaller condition than the laser output intensity Pref which is optimum for image formation (loop processing of Step S2002→Step S2003→Step S2004→Step S2002). At this moment, when the laser output intensity does not reach the laser output setting value P1 even if the laser emitting current I1 reaches Iopmax which is the upper limit of the tolerable laser emitting current, the microprocessor 101 determines the laser to be perfectly degraded and the end of the service life of the laser, displays a message indicating a laser malfunction on the display 105, and stops the operation of the apparatus (Step S2001→Step S2002→Step S2003→Step S2005→Step S2006).

When regarding the laser output intensity, the laser output setting value P1 is obtained in the smaller condition than the laser tolerable current upper limit value Iopmax, the value of the laser emitting current I1 at that time is stored in a random access memory (RAM) incorporated in the microprocessor 101 (Step S2001→Step S2002→Step S2007). Then, the microprocessor 101 set the laser emitting current I2 while detecting the laser output intensity so that the laser output intensity is a desired output intensity P2 which is higher than the output intensity P1, and lower than the laser output intensity Pref being optimum for the image formation (Step S2009→Step S2010→Step S2011→Step S2009). At this moment, when the laser output intensity does not reach the desired laser output intensity P2 even if the laser emitting current I2 reaches the laser tolerable emitting current upper limit value Iopmax, the laser output intensity with the laser emitting current Iopmax is detected, and the laser tolerable emitting current upper limit value Iopmax as a laser emitting current I2 and the value of the detected laser output intensity as an output intensity P2 are stored in the RAM. When the desired laser output intensity P2 is obtained in the lower condition than the laser tolerable emitting current upper limit value Iopmax, the values of the laser emitting current I2 at that time and the desired laser output intensity P2 are stored in the RAM (Step S2015).

Then, the microprocessor 101, according to the values of the laser operation currents I1, I2, the laser output intensity P2, and the desired laser output intensity P1, calculates the laser SLOPE efficiency of the laser in use, now, by the Formula (1) (Step S2016).

Reverting back to FIG. 3, the microprocessor 101 determines the ηlimit which allows a reduction in the laser output intensity to the limit where uneven pitch or uneven density is not generated, by:

$$\eta \text{limit} = \frac{(K \times Pref - P1)}{(Iopmax - I1)} \leq \eta, \quad (4)$$

where K is a reduction factor of laser output intensity, and Pref is a laser output intensity which is optimum for image formation (Step S3002).

For the purpose that the servicemen can arrive at the machine place of the user until the laser SLOPE efficiency η reaches the SLOPE efficiency limit value ηlimit, in order to indicate the laser replacement time by estimated time variety characteristics, it is required to be:

$$\frac{\eta}{\eta \text{limit}} \geq \left(1 + \frac{x}{100}\right) \quad (5)$$

where x % is a margin of the SLOPE efficiency η to the SLOPE efficiency limit value ηlimit. If the right side of the above formula is represented by A as a proportional constant, the microprocessor 101 determines from the measure laser SLOPE efficiency η and the SLOPE efficiency limit value ηlimit, that the laser is normal when η≧Aηlimit, the laser is at the replacement time when Aηlimit>η≧ηlimit, and as the end of service life of the laser when η>ηlimit.

After that, according to the judgment of the laser replacement time, the microprocessor 101 displays a message that the laser replacement timing has come on the display (Step S3005). When the end of the laser service life is determined, the microprocessor displays a message indicating a laser malfunction on the display (Step S3006), and stops the operation of the apparatus (Step S3007).

(Third embodiment)

Figure 5:
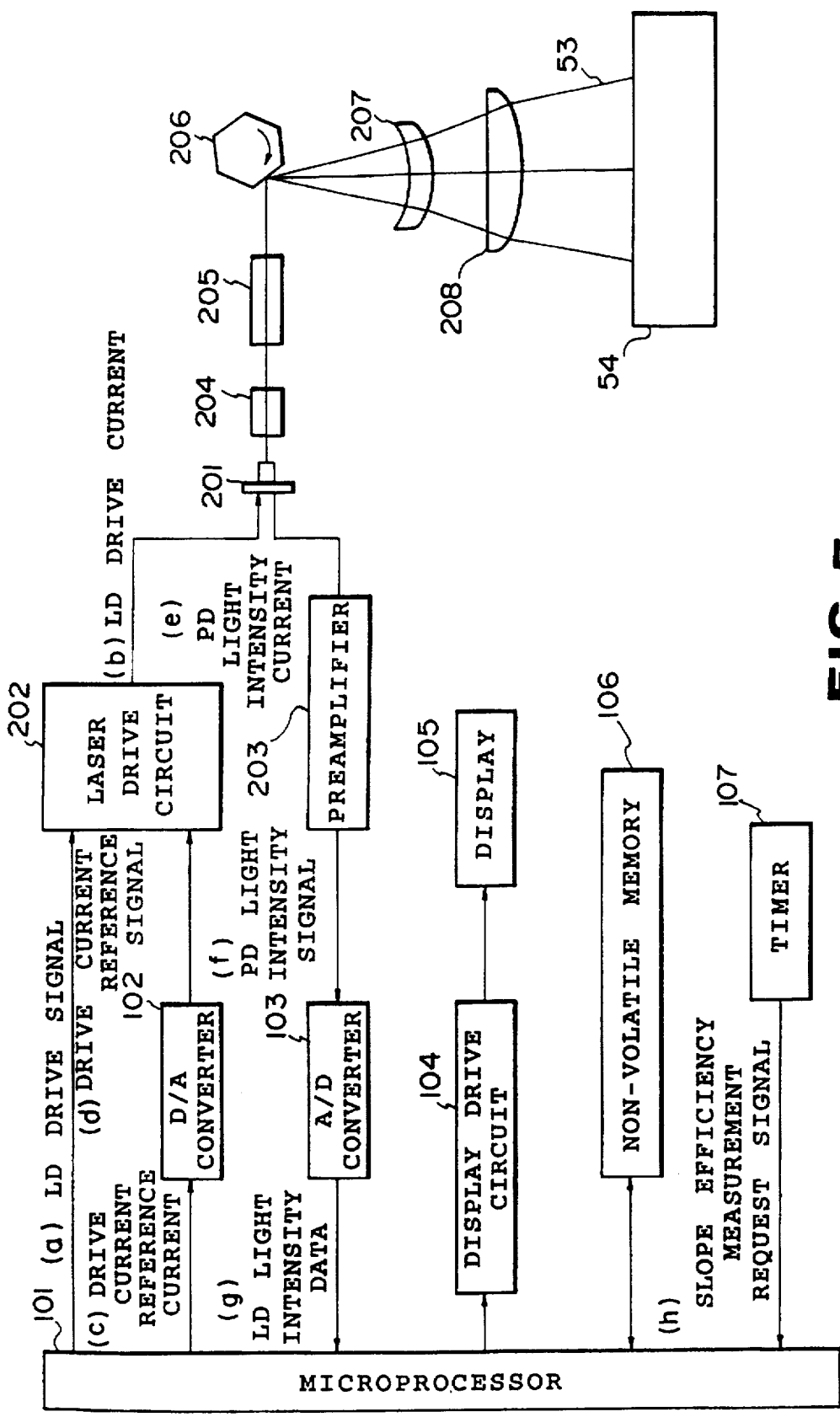
FIG. 5 is a block diagram showing a circuit arrangement for executing the procedure shown in FIG. 4.

The circuit arrangement of a third embodiment is shown in FIG. 5. The microprocessor 101 is connected with a non-volatile memory 106 and a timer 107. When the apparatus power is turned on, the timer 107 activates or restarts from the count value at the power off, and next, transmits a SLOPE efficiency measurement request signal to the microprocessor 101 for measuring the laser SLOPE efficiency at every interval ΔT, and recording in the non-volatile memory 106. Output of the SLOPE efficiency measurement request signal is a latch output and is inputted to an interrupt request terminal of the microprocessor 101. When the microprocessor 101 is executing a sequence control such as of printing, the interrupt is inhibited, thus, the SLOPE efficiency measurement request signal is latched in the enable status. When the microprocessor 101 becomes interrupt enable, the SLOPE efficiency measurement request signal is received. As described in the above embodiments, when the SLOPE efficiency is measured to calculate, the microprocessor 101 records the SLOPE efficiency η in the non-volatile memory 106, and resets the SLOPE efficiency measurement request signal.

Figure 4:
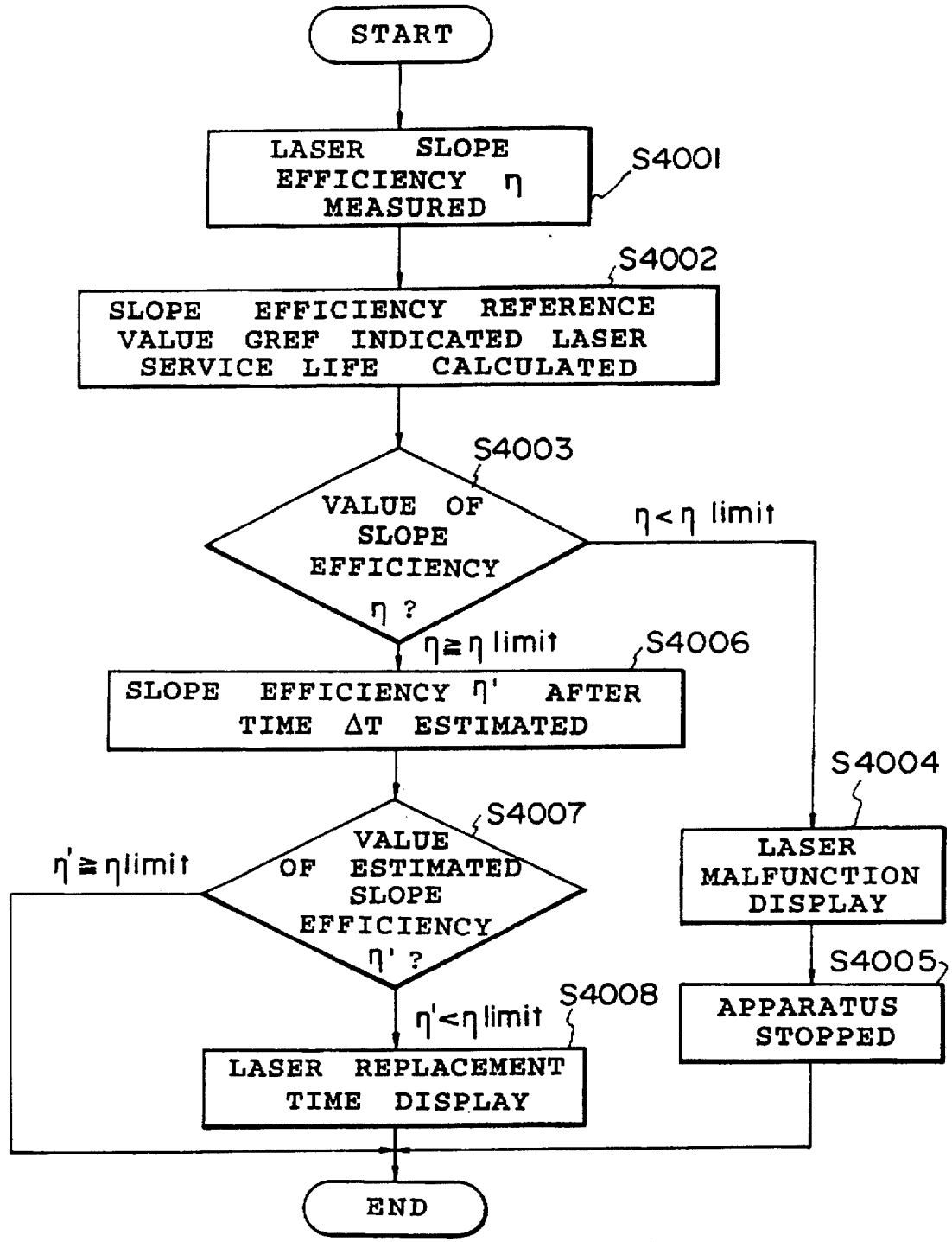
FIG. 4 is a flowchart showing a further procedure as a third embodiment of the present invention.

Normally, self-checking for laser degradation is executed before starting printing or during the transportation period for transporting the recording material during printing. FIG. 4 shows the self-checking procedure.

As described in the above embodiments, the microprocessor 101 measures to calculate the SLOPE efficiency limit value ηlimit which is a limit where no problem is caused in the laser SLOPE efficiency η in current use and the image quality (Step S4001). Then, the last-recorded SLOPE efficiency $\eta_N$ data in the non-volatile memory 106 and the previous SLOPE efficiency $\eta_{N-1}$ data are read to calculate a SLOPE efficiency changing rate Δη/ΔT $$\frac{\Delta \eta}{\Delta T} = \frac{\eta_{N-1} - \eta_N}{\Delta T} \quad (6)$$

An estimated SLOPE efficiency η after a time ΔT to the SLOPE efficiency η measured during the operation of the apparatus can be linearly approximated using the SLOPE efficiency changing rate Δη/ΔT as:

$$\eta' = \eta - \frac{\Delta \eta}{\Delta T} \times \Delta T = \eta - \{\eta_{N-1} - \eta_N\} \quad (7)$$

Thus, the microprocessor 101 can determine the laser to be normal when the SLOPE efficiency η' estimated at the timing passed ΔT time since the presently measure SLOPE efficiency η does not reach the SLOPE efficiency limit value ηlimit, and determine the laser to be at the replacement time when the SLOPE efficiency limit value ηlimit is reached. When the measure SLOPE efficiency η reaches the SLOPE efficiency limit value ηlimit, it is determined to be the laser malfunction.

After that, when the microprocessor 101 determines a laser replacement timing (Step S4007), it displays a message indicating that the laser replacement timing has come, on the display 105 (Step S4008). When the end of the laser service life is determined, a message indicating a laser malfunction is displayed on the display, and the operation of the apparatus is completed.

(Fourth embodiment)

Figure 13:
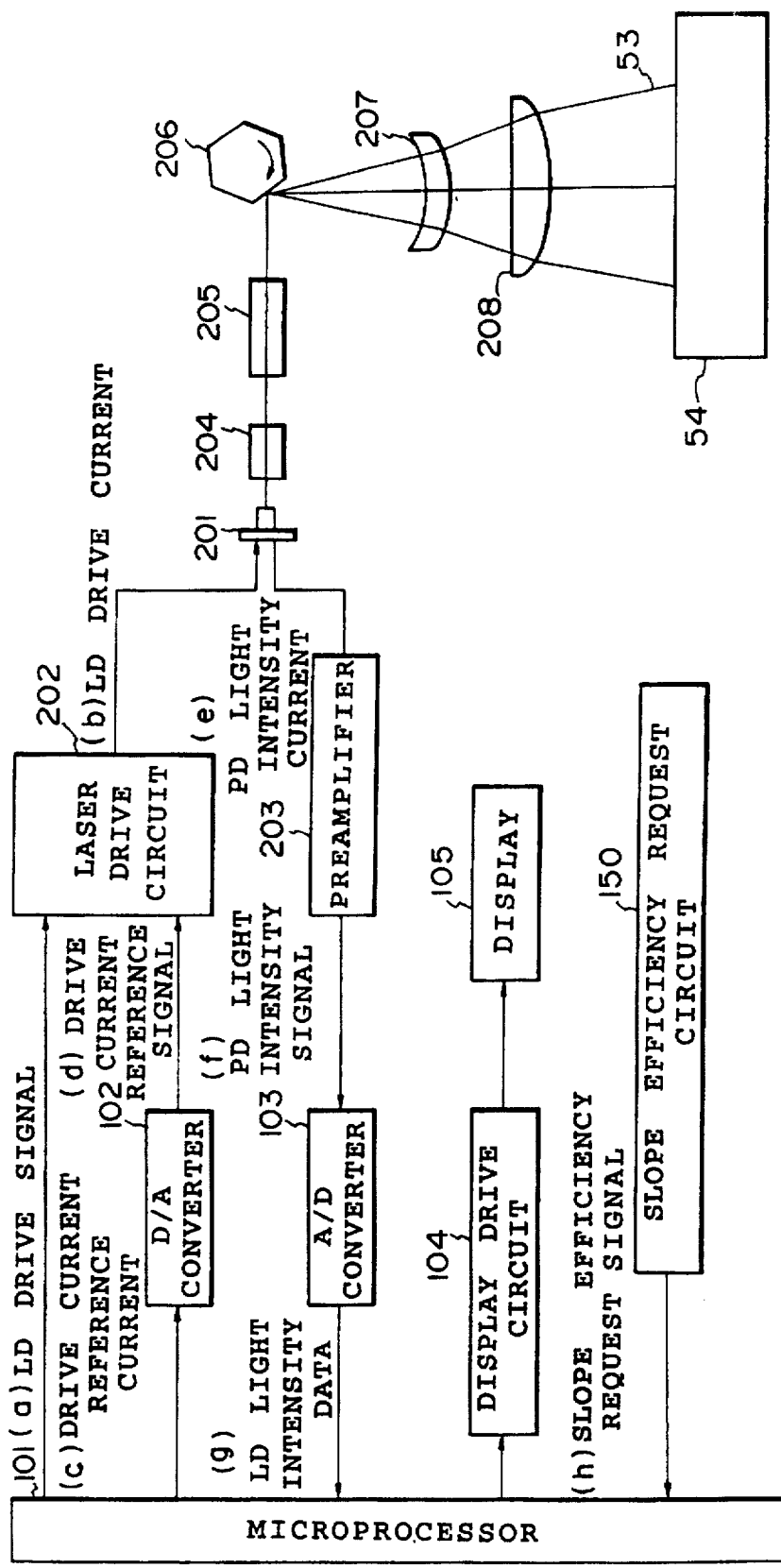
FIG. 13 is a block diagram showing a circuit arrangement of the fourth embodiment.
Figure 14:
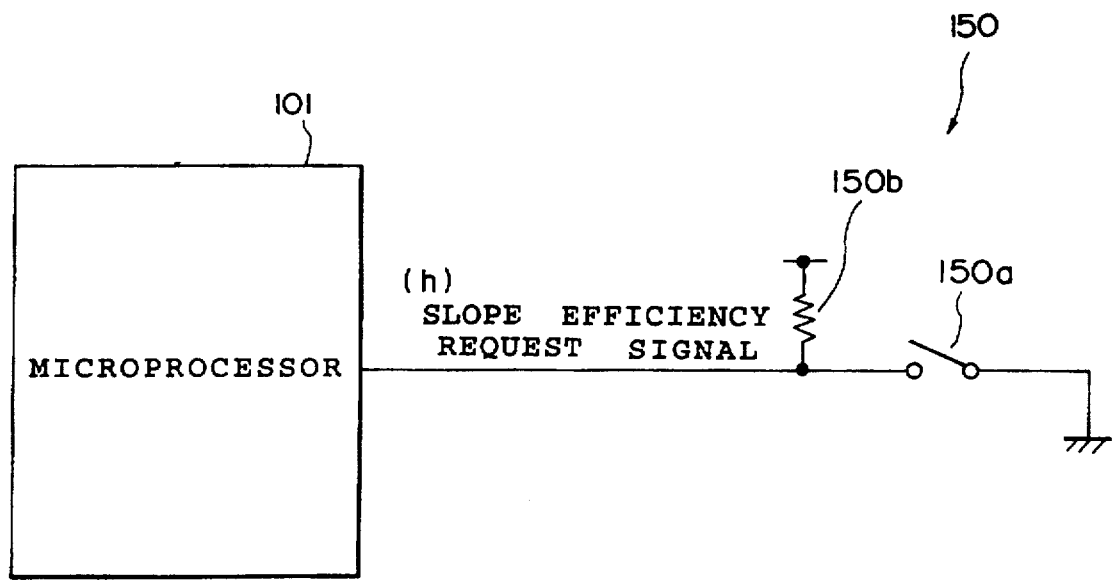
FIG. 14 is a circuit diagram showing a circuit arrangement of a SLOPE efficiency request circuit.
Figure 15:
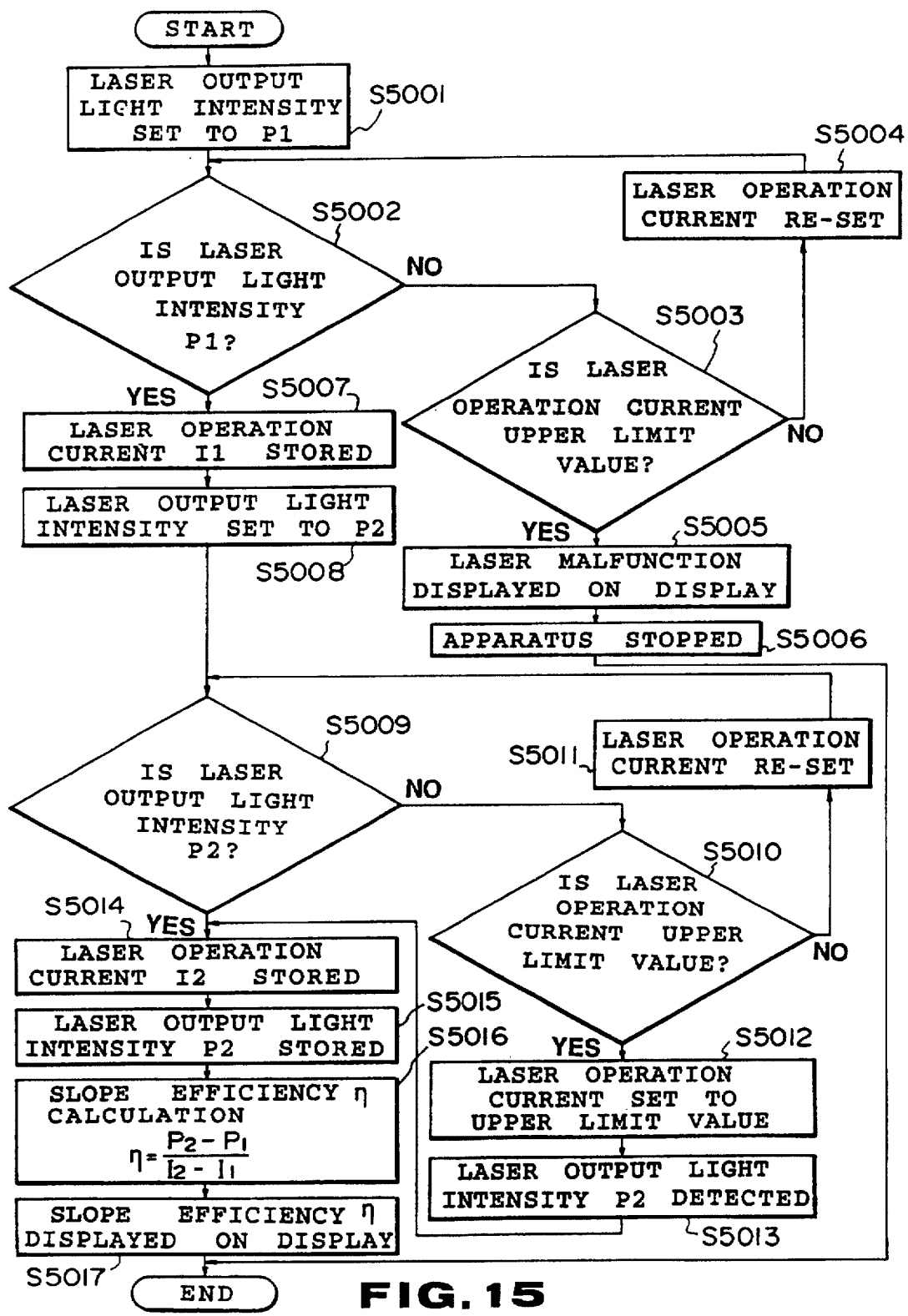
FIG. 15 is a flowchart showing a procedure of the fourth embodiment.

The circuit arrangement of a fourth embodiment is shown in FIG. 13. Similar parts to those used in the above embodiments have similar symbols. In this embodiment, the microprocessor 101 is connected with a SLOPE efficiency request signal (h) transmitted from a SLOPE efficiency request circuit 150. The SLOPE efficiency request circuit 150 is disposed on a controller (not shown), and comprises a pull-up resistor 150b and a switch 150a. The switch 150a is turned on at the factory delivery or when the serviceman intends to measure the SLOPE efficiency, and is normally turned off. When the switch 150a is turned on to measure the SLOPE efficiency, the SLOPE efficiency request signal (h) connected to the input port of the microprocessor 101 goes to "L" level. On the other hand, since the switch 150a is normally off, the SLOPE efficiency request signal (h) holds "H" level. That is, the microprocessor 101, when the SLOPE efficiency request signal (h) which changes in level in association with the operation of the switch 150a goes to "L" level, determines the SLOPE efficiency measurement to be requested, measures the SLOPE efficiency of the laser, and displays the measured SLOPE efficiency on the display 105. FIG. 15 shows the processing procedure in the microprocessor 101, which will be described.

The microprocessor 101 sets the laser emitting current I1 while detecting the laser output intensity by the photodiode disposed in the package of the semiconductor laser 201, so that a desired output intensity P1 is obtained, which is smaller than a laser output intensity Pref which is optimum for image formation (Step S5001). At this moment, when the laser output intensity does not reach the desired laser output intensity P1 even if the laser emitting current I1 reaches the laser tolerable emitting current Iopmax which is the upper limit of the tolerable laser emitting current, the microprocessor 101 determines the laser to be perfectly degraded and the end of the service life of the laser, next, displays a message indicating a laser malfunction on the display 105, and stops the operation of the apparatus (Steps of S5005–S5006). When regarding the laser output intensity, the desired laser output intensity P1 is obtained in the lower condition than the laser tolerable emitting current Iopmax which is the upper limit of the laser tolerable emitting current, the value of the laser emitting current I1 at that time is stored in the RAM in the microprocessor 101 (Step S5007). Then, the microprocessor 101 sets the laser emitting current I2 while detecting the laser output intensity so that the laser output intensity is a desired output intensity P2 which is higher than the output intensity P1, and lower than the laser output intensity Pref optimum for the image formation (Step S5008). At this moment, when the laser output intensity does not reach the desired laser output intensity P2 even if the laser emitting current I2 reaches the laser tolerable emitting current upper limit value Iopmax, the laser emitting current is set to the upper value Iopmax of the laser tolerable emitting current (Step S5010–Step S5012), the laser output intensity at that time is detected (Step S5013), and the laser tolerable emitting current upper limit value Iopmax as the laser emitting current I2 and the detected laser output intensity as P2 are stored in the RAM (Step S5014). Furthermore, when the desired laser output intensity P2 is obtained with a value smaller than the laser tolerable emitting current upper limit value Iopmax, the values of the laser emitting current I2 at that time and the desired laser output intensity P2 are stored in the RAM (Step S5014, Step S5015).

Then the laser SLOPE efficiency η in use is calculated from the values of the laser operation currents I1 and I2, the laser output intensity P2, and the desired laser output intensity P1 stored in the RAM of the microprocessor 101 (Step S5016):

$$\eta = \frac{(P2 - P1)}{(I2 - I1)} \quad (8)$$

Here, a liquid crystal panel (not shown) arranged in the display 105 displays the operation condition of the apparatus, environmental setting, error information and the like by the microprocessor 101 through the display drive circuit 104. The value of the SLOPE efficiency measured and calculated above is displayed on the liquid crystal panel (Step S5017). Normally, the laser SLOPE efficiency falls in a predetermined range with a deviation of the laser. Then, if the measured SLOPE efficiency is out of the range, the laser can be determined to be degraded.

As described above, the delivery inspector and the serviceman for the apparatus can easily check the laser SLOPE efficiency to determine whether or not the laser is degraded. Alternatively, the measured SLOPE efficiency may be printed and checked by the image formation sequence described in the prior art.

(Fifth embodiment)

Figure 16:
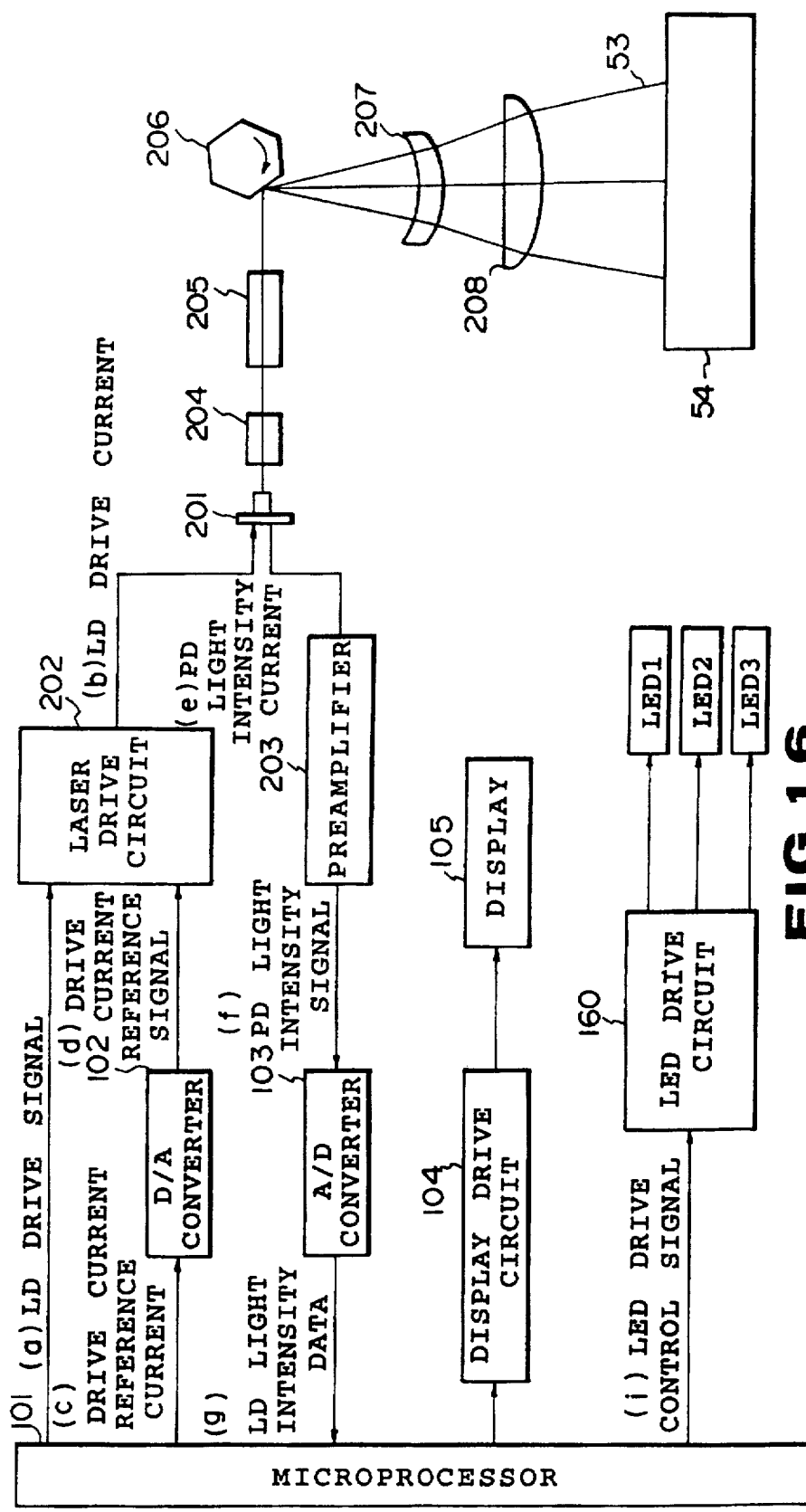
FIG. 16 is a block diagram showing another circuit arrangement as a fifth embodiment.

A fifth embodiment is shown in FIG. 16. In this example, the microprocessor 101 is connected with an LED drive circuit 160. Furthermore, three LEDs are connected to the LED drive circuit 107. The microprocessor 101 transmits an LED drive control signal (i) for controlling ON/OFF of LED1, LED2, LED3 to the LED drive circuit 107, and the LED drive circuit 160 drives the LED1, LED2, LED3 according to the LED drive control signal.

Figure 17:
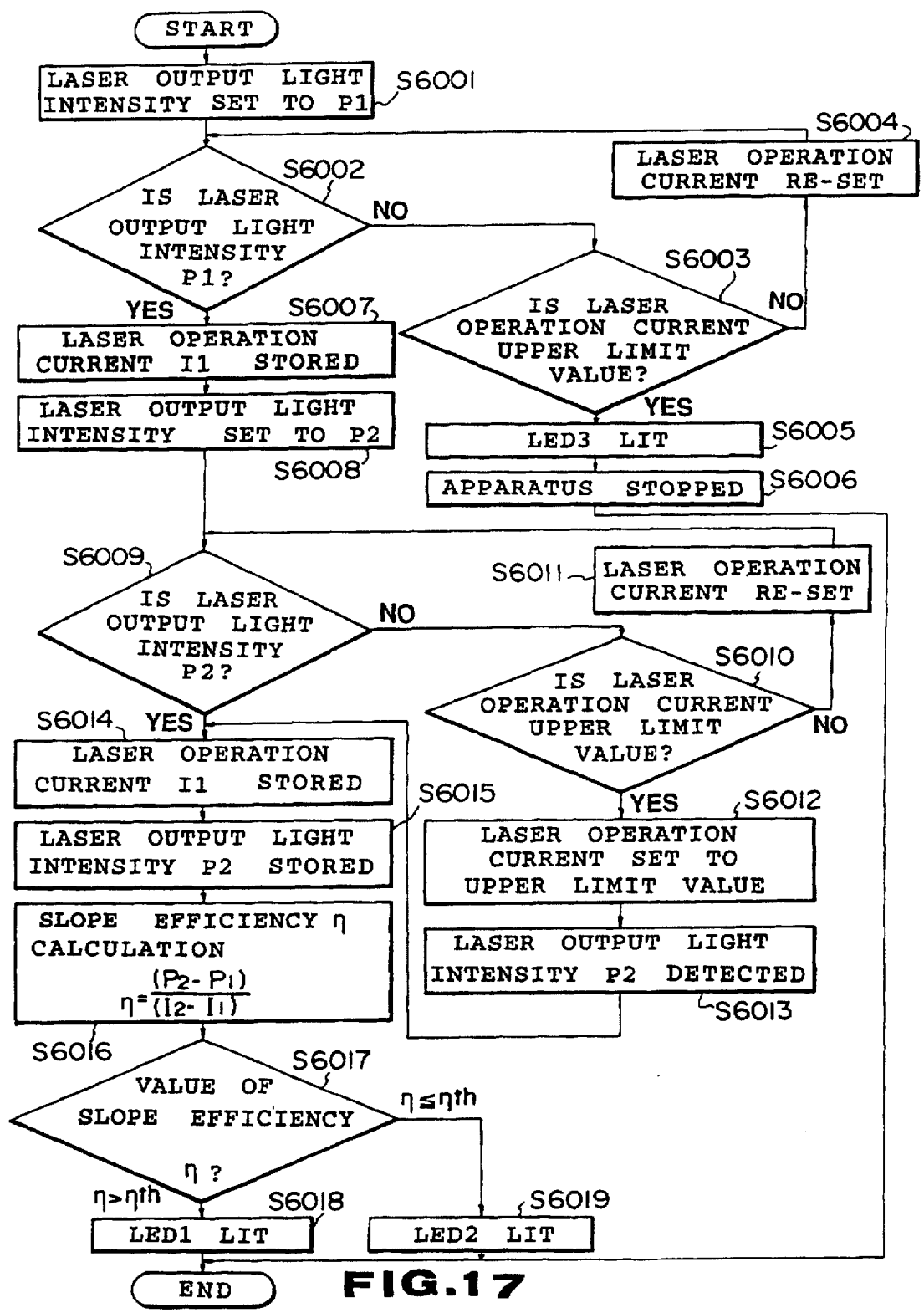
FIG. 17 is a flowchart showing a further procedure of the fifth embodiment.

Measurement of the SLOPE efficiency of the laser 201 disposed on the apparatus is executed before starting printing or during the transportation interval for transporting the recording material during printing. The measurement procedure will be described with reference to FIG. 17.

The microprocessor 101 sets the laser emitting current I1 while detecting the laser output intensity by the photodiode disposed in the package of the semiconductor laser 201, so that a desired output intensity P1 is obtained, which is smaller than a laser output intensity Pref which is optimum for image formation (Step S6001). At this moment, when the laser output intensity does not reach the desired laser output intensity P1 even if the laser emitting current I1 reaches the laser tolerable emitting current Iopmax which is the upper limit of the tolerable laser emitting current, the microprocessor 101 determines the laser to be perfectly degraded and a service life of the laser, the LED3 is lit, and operation of the apparatus is stopped (Step S6006). When the desired laser output intensity P1 is obtained in the lower condition than the laser tolerable emitting current Iopmax which is the upper limit of the laser tolerable emitting current, the value of the laser emitting current I1 at that time is stored in the RAM incorporated in the microprocessor 101 (Step S6007). Then, the microprocessor 101 sets the laser emitting current I2 while detecting the laser output intensity so that the laser output intensity is a desired output intensity P2 which is higher than the output intensity P1, and lower than the laser output intensity Pref optimum for the image formation. At this moment, when the laser output intensity does not reach the desired laser output intensity P2 even if the laser emitting current I2 reaches the laser tolerable emitting current upper limit value Iopmax, the laser emitting current is set to the upper limit value Iopmax of the laser tolerable emitting current (Step S6012), the value of the laser output intensity at that time is detected, and the laser tolerable emitting current upper limit value Iopmax as the laser emitting current I2 and the value of the detected laser output intensity as P2 are stored in the RAM (Step S6013–Step S6014). When the desired laser output intensity P2 is obtained in the condition of a value smaller than the laser tolerable emitting current upper limit value Iopmax, the laser emitting current value I2 at that time and the value of the desired laser output intensity P2 are stored in the RAM (Step S6014, Step S6015).

Then the laser SLOPE efficiency η in use now is calculated from the laser operation currents I1 and I2, the laser output intensity P2, and the desired laser output intensity P1 stored in the RAM of the microprocessor 101, by:

$$\eta = \frac{(P2 - P1)}{(I2 - I1)} \quad (9)$$

Here, a slice level ηth for tolerable reduction in the SLOPE efficiency is set in view of the value not affecting the laser SLOPE efficiency and the laser service life. When the measured SLOPE efficiency η is greater than the slice level ηth, the microprocessor 101 determines the laser to have no degradation in characteristics, and lights the LED1 (Step S6018). When the measured SLOPE efficiency η is smaller than the slice level gth, the microprocessor 101 determines that a degradation is caused in the laser or the SLOPE efficiency is reduced with the passage of time, and lights the LED2 (Step S6019).

Therefore, when the LEDs disposed on the apparatus are checked, the apparatus is normal if the LED1 is lit, a degradation is caused in the laser when the LED2 is lit, and the laser is at the end of the service life when the LED3 is lit.

As described above, the delivery inspector and the serviceman of the apparatus can easily check the LED1, LED2, and LED3 to determine the laser to be normal, degraded, or at the service life. Alternatively, a plurality of slice levels gth are set, and LEDs classified according to the reduction in the SLOPE efficiency are disposed, which can be used as a measure indicating the reduction degree of the SLOPE efficiency.

(Sixth embodiment)

Figure 18:
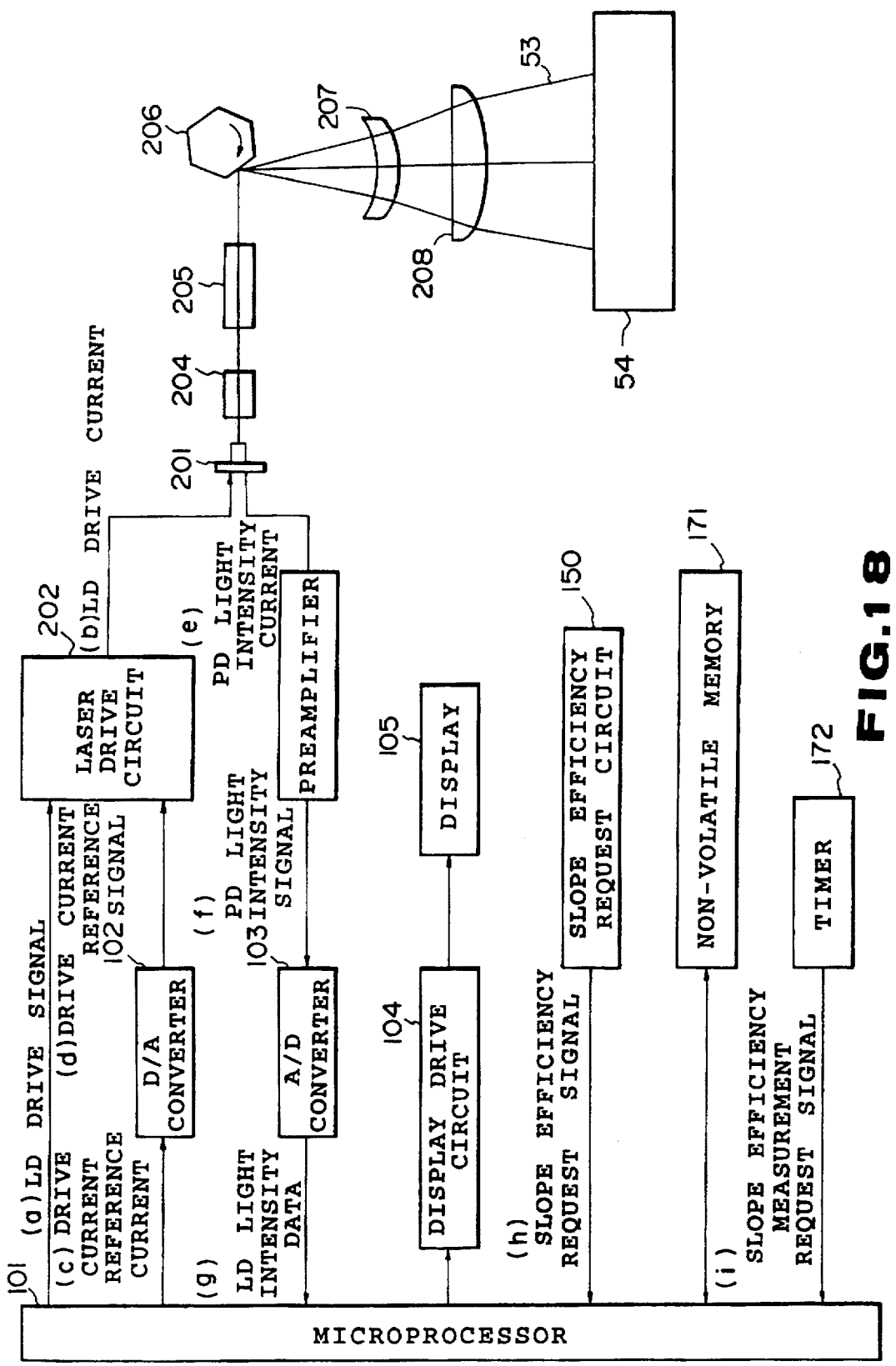
FIG. 18 is a block diagram showing a still further circuit arrangement as a sixth embodiment.

A sixth embodiment is shown in FIG. 18. In this example, the microprocessor 101 is connected with a non-volatile memory 171 and a timer 172. In the timer 172, the counter activates when the apparatus power is turned on or restarts from the count value at the power off, measures the laser SLOPE efficiency at every interval ΔT, and transmits a SLOPE efficiency measurement request signal (J) for recording in the non-volatile memory 171 to the microprocessor 101. Output of the SLOPE efficiency measurement request signal (J) is a latch output, which is inputted to an interrupt request terminal of the microprocessor 101. When the microprocessor 101 is executing sequence control such as printing, interrupt is inhibited, the SLOPE efficiency measurement request signal is latched in the enable status and, when the microprocessor 101 becomes interrupt enable, the SLOPE efficiency measurement request signal (J) is received, the SLOPE efficiency η is measured to calculate as described in the above embodiment, the SLOPE efficiency η is recorded in the non-volatile memory 171, and the SLOPE efficiency measurement request signal (J) is reset.

The microprocessor 101 is connected with a SLOPE efficiency request circuit 170, and inputs with a SLOPE efficiency request signal (h). As described in the second embodiment, the SLOPE efficiency request signal (h) can instruct the microprocessor 101 to output the measurement result of the SLOPE efficiency by turning on the switch 150a. When the microprocessor 101 receives the SLOPE efficiency request signal (h), the SLOPE efficiency recorded in the non-volatile memory 171 is printed according to the image formation sequence as in the prior art.

Normally, in the factory, the measurement result of the SLOPE efficiency from the assembly to the screening period can be checked by the above print output. With an eye on the initial value of the SLOPE efficiency measurement result, if one which should fall in the predetermined range is smaller than the predetermined value, it can be determined that a degraded laser has been incorporated in the apparatus. With an eye on the final value of the SLOPE efficiency, there should be almost no change in the SLOPE efficiency over time in the operation time of the apparatus. Therefore, if there is a change in the initial value and final value of the SLOPE efficiency, it can be determined that a degradation characteristics is caused in the laser. Furthermore, by analyzing the SLOPE efficiency measurement results, it is possible to estimate the location where degradation characteristics was caused, from the cumulative time of the periodical time ΔT.

(Seventh embodiment)

Figure 19:
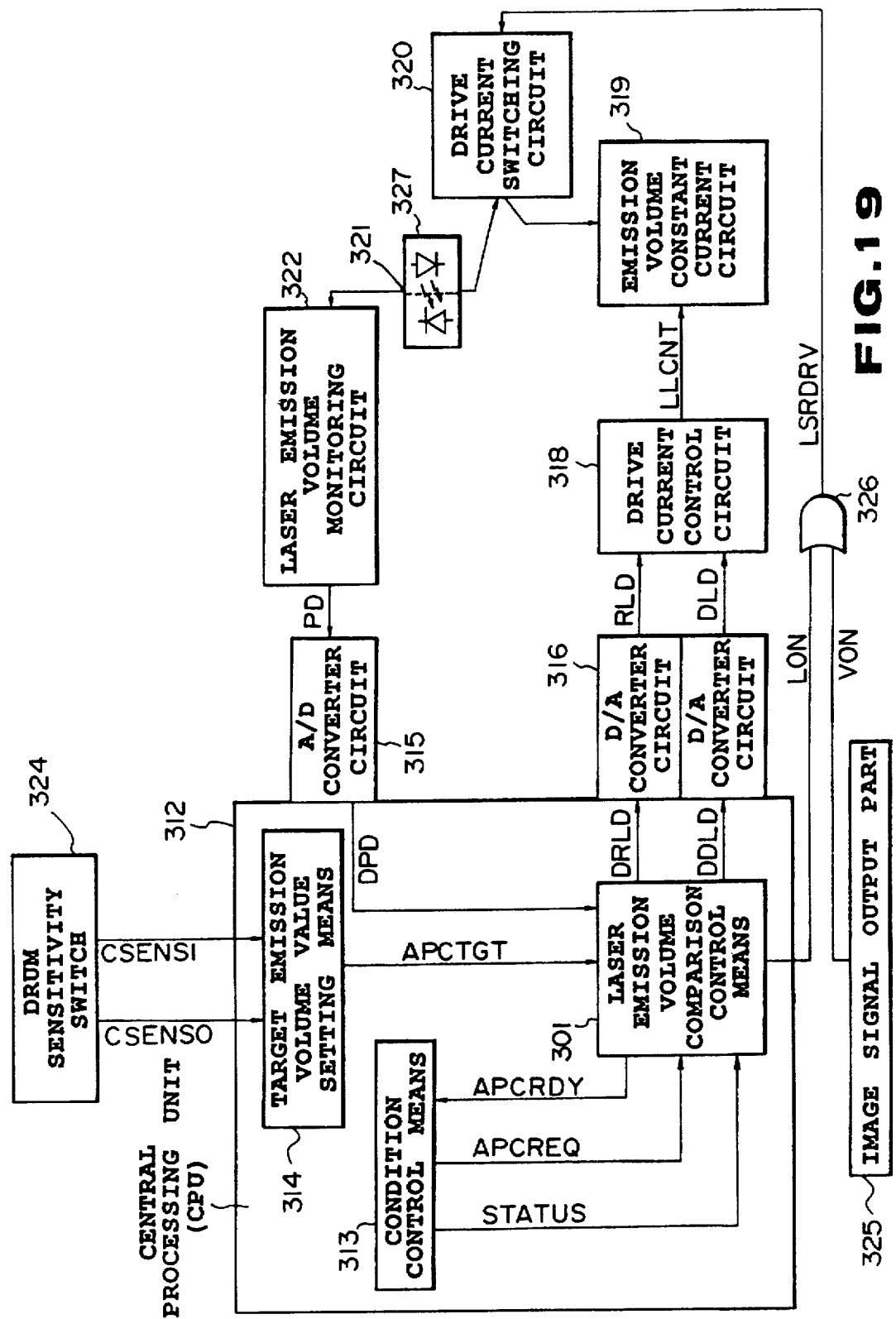
FIG. 19 is a block diagram showing a system arrangement as a seventh embodiment of the present invention.

FIG. 19 shows the system arrangement of the laser drive circuit of the present embodiment. In FIG. 19, the reference numeral 312 indicates a central processing unit (CPU), and the reference numeral 318 indicates a drive current control circuit. The reference numeral 319 indicates a light emission constant current circuit, and the reference numeral 320 indicates a drive current switching circuit. The reference numeral 321 indicates a laser unit, and the reference numeral 322 indicates a laser intensity monitoring circuit. The reference numeral 324 indicates a drum sensitivity switch, and the reference numeral 325 indicates an image signal output part. The reference numeral 326 indicates an OR gate.

The CPU 312 comprises condition control means 313, laser intensity comparison control means 301, a target intensity setting means 314, an A/D (analog-digital) converter circuit 315, D/A (digital-analog) converter circuits 316 and 317, and the like. The laser unit 321 comprises a semiconductor laser 327 and a photodiode 328. The above condition control means 313, the laser intensity comparison control means 301, and the target intensity setting means 314 are individually software programs, which are executed by the CPU 312 to execute these software programs for realizing functions described later. The CPU 312 executes control over the entire printer such as condition control and laser intensity of the laser beam printer.

The condition control means 313 executes management for conditions of the laser beam printer such as start-up processing at power-ON, stand-by, printing condition, and malfunction condition, and notifies the control condition STATUS of the laser beam printer to various control means such as the laser intensity comparison control means 301. Furthermore, it sends an APCREQ signal to the laser intensity comparison control means 301 at a predetermined timing in the start-up procedure and a predetermined timing during printing to instruct starting of laser intensity control.

The laser intensity comparison control means 301, while comparing a laser intensity monitoring value DPD from the laser intensity monitoring circuit 322 converted to a digital value through the A/D converter circuit 316 with a final target intensity value APCTGT give from the target intensity setting means 314, converts the output values DRLD and DDLD to analog outputs RLD and DLD through the D/A converter circuits 316 and 317, which are outputted to control the drive current control circuit 318 for adjusting so that the laser light emission reaches the target intensity. When it is determined the laser light emission to reach the target intensity, it sends an APCRDY signal to the condition control means 313 to notify the completion of laser intensity adjustment. Intensity control of the laser intensity comparison control means 301 will be described later in detail.

The drive current control circuit 318 controls the current value of the light emission constant current control circuit 319 according to the output from the laser intensity comparison control means 301. The output from the laser intensity comparison control means 301 includes two systems of RLD (D/A converter circuit 316) and DLD (D/A converter circuit 317), and the drive current control means adds the outputs RLD and DLD in a ratio of 8:1 to determine the value of drive current. That is, DLD can adjust the drive current with 8-times higher accuracy than RLD, and the laser intensity comparison control means 301 can use RLD for rough adjustment of the laser intensity and DLD for fine adjustment. The embodiment uses this arrangement bring the laser intensity as close as possible to the target value, but the output from the laser intensity comparison control means 301 may be single system.

The light emission constant current circuit 319 flows a predetermined current to the semiconductor laser 327 through the drive current switching circuit 320 according to the control from the drive current control circuit 318. In the laser unit 321, the photodiode 328 receives laser light of the semiconductor laser 327 which emits light by the drive current, and sends a corresponding signal to the laser intensity monitoring circuit 322. The laser intensity monitoring circuit 322 is supplied with the detection signal from the photodiode 328, converts a voltage PD corresponding to the detected intensity to a digital value DPD through the A/D converter circuit 316, and outputs it to the laser intensity comparison control means 301.

The drum sensitivity switch 324 sets the steps of sensitivity of a photosensitive drum (refer the reference numeral 54 in FIG. 5) disposed in the laser beam printer. In this embodiment, two switches CSENS and CSENSTEP S1 are arranged, and the drum sensitivity can be set in four Steps manually by turning on and off the switches or automatically when the drum is set. The target intensity setting means 313 outputs a final target intensity APCTGT according to the drum sensitivity set by the drum sensitivity switch 324 to the laser intensity comparison control means 301. The image signal output part outputs VON signal of the image for printing. The OR gate 326 ORs a LON signal outputted from the laser intensity comparison control means 301 with a VON signal outputted from the image signal output part 325, and outputs the calculation result to the drive current switching circuit 320. That is, when one of the LON and VON signals is ON, a predetermined current flows through the semiconductor laser 327. Digital data in the embodiment are all processed in 8 bits (0–255).

Figure 20:
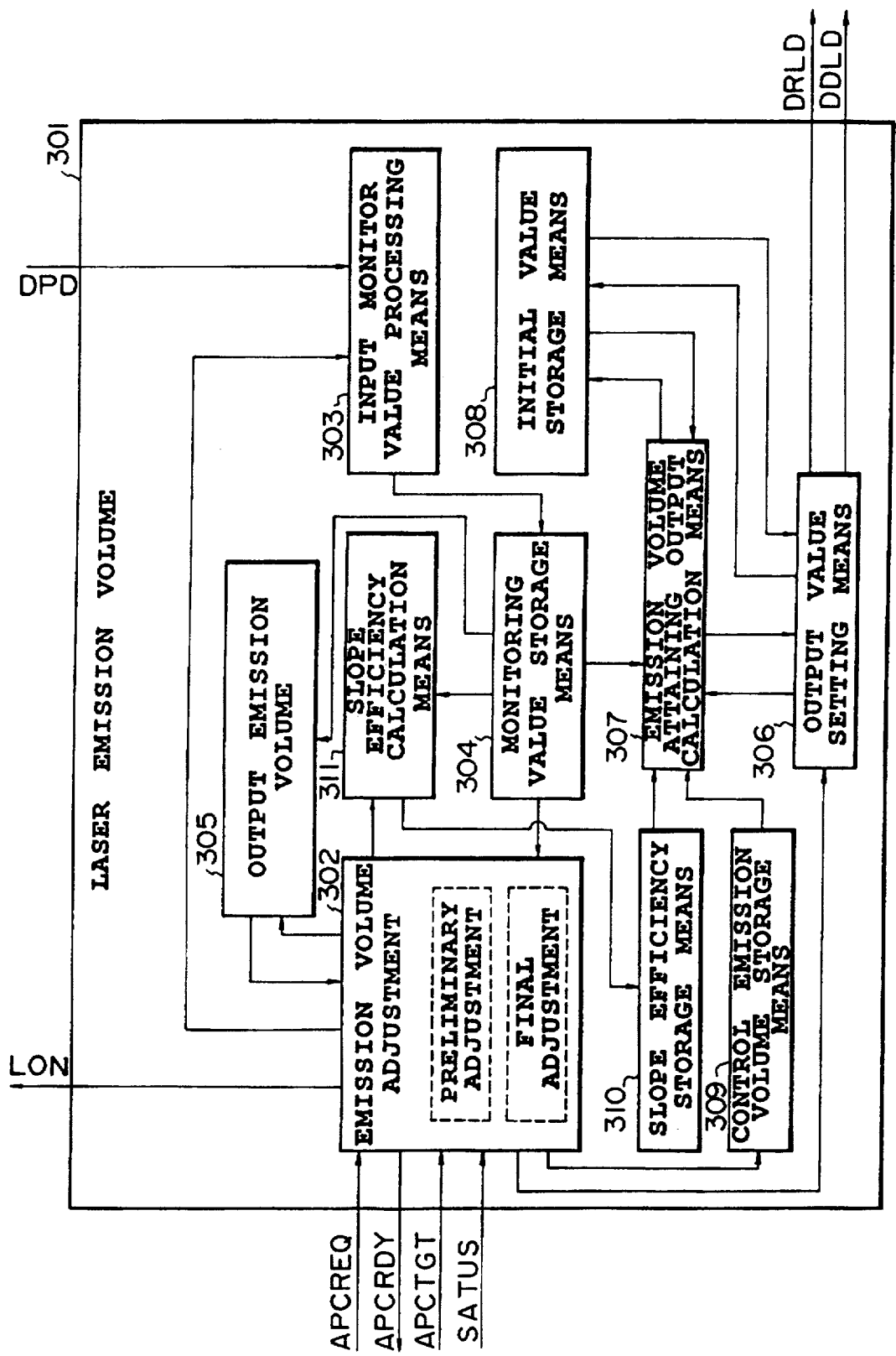
FIG. 20 is a block diagram showing an arrangement of the laser intensity comparing control means.

Then, control of the laser intensity comparison control means 301 will be described in detail. FIG. 20 is a block diagram showing an arrangement of the laser intensity comparison control means 301 of the embodiment. The laser intensity comparison control means 301 comprises intensity adjustment control means 302, input monitor value processing means 303, monitor value storage means 304, output intensity estimation means 305, output value setting means 306, target intensity attaining output value calculation means 307, initial value storage means 308, control intensity storage means 309, SLOPE efficiency storage means 310, and SLOPE efficiency calculation means 312.

The intensity adjustment control means 302 receives an APCREQ signal from the condition control means 313, and controls operation of the input monitor value processing means 303, the output intensity estimation means 305, the output value setting means 306, the intensity attaining output value calculation means 307, the SLOPE efficiency calculation means 311, and the like to execute intensity adjustment. In the intensity adjustment, determination is made as to the preliminary adjustment or the final adjustment according to the information of the STATUS signal, and when the individual adjustment is completed, an APCRDY signal is outputted to the condition control means 312.

Figure 21:
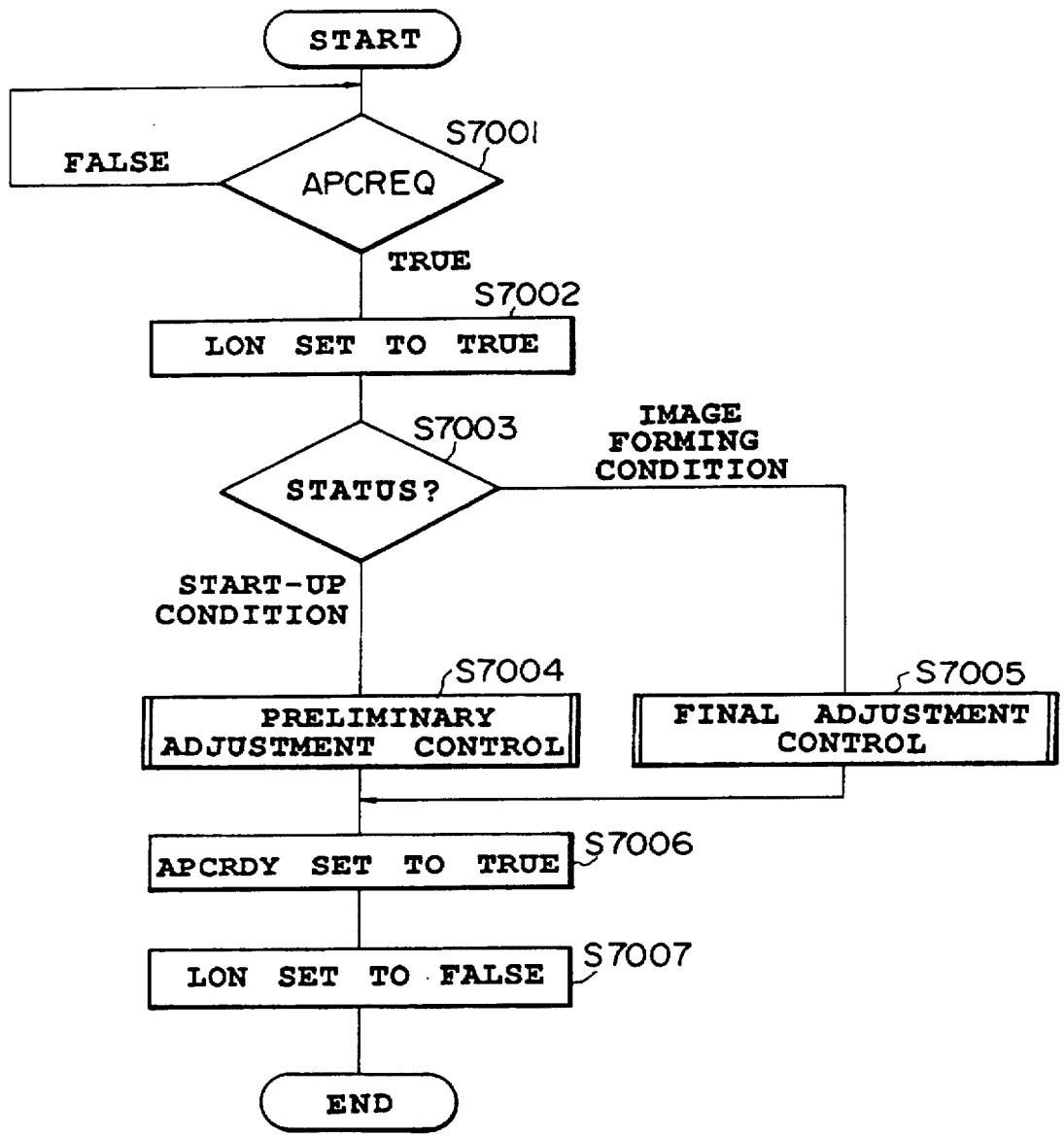
FIG. 21 is a flowchart showing the procedure for intensity control.

FIG. 21 is a flowchart showing the execution procedure of the CPU 312 to operate a the intensity adjustment control means 302. First, in the step S7001, the CPU 312 waits until the APCREQ signal is outputted from the condition control means 310. When APCREQ is TRUE, the execution procedure goes to the step S7002, where the LON signal is set to TRUE to make a condition to flow the drive current, and a condition in which intensity adjustment is possible. Then, in the step S7003, the STATUS signal is checked to determine the control condition of the printer at that time. When the printer control condition is start-up condition, the execution procedure goes to the step S7004, where the CPU 312 executes the preliminary adjustment. When the printer condition is printing condition, the execution procedure goes to the step S7005, where the CPU 312 executes the final adjustment control. When intensity adjustment of the individual conditions is completed, the execution procedure goes to the step S7006, where the CPU 312 sets the APCRDY signal to TRUE and, in the step S7007, sets the LON signal to FALSE.

Control details of the individual preliminary adjustment and final adjustment will be described in detail. In the preliminary adjustment, the intensity adjustment control means 302 begins intensity control with level zero (0) for both outputs DRLD (rough adjustment) and DDLD (fine adjustment), and instructs the output value setting means 306 to count up the output DRLD (rough adjustment) 1 by 1. During this procedure, the output intensity estimation means 305 estimates the output intensity for the next Step to determine the end point of the preliminary adjustment.

Figure 22:
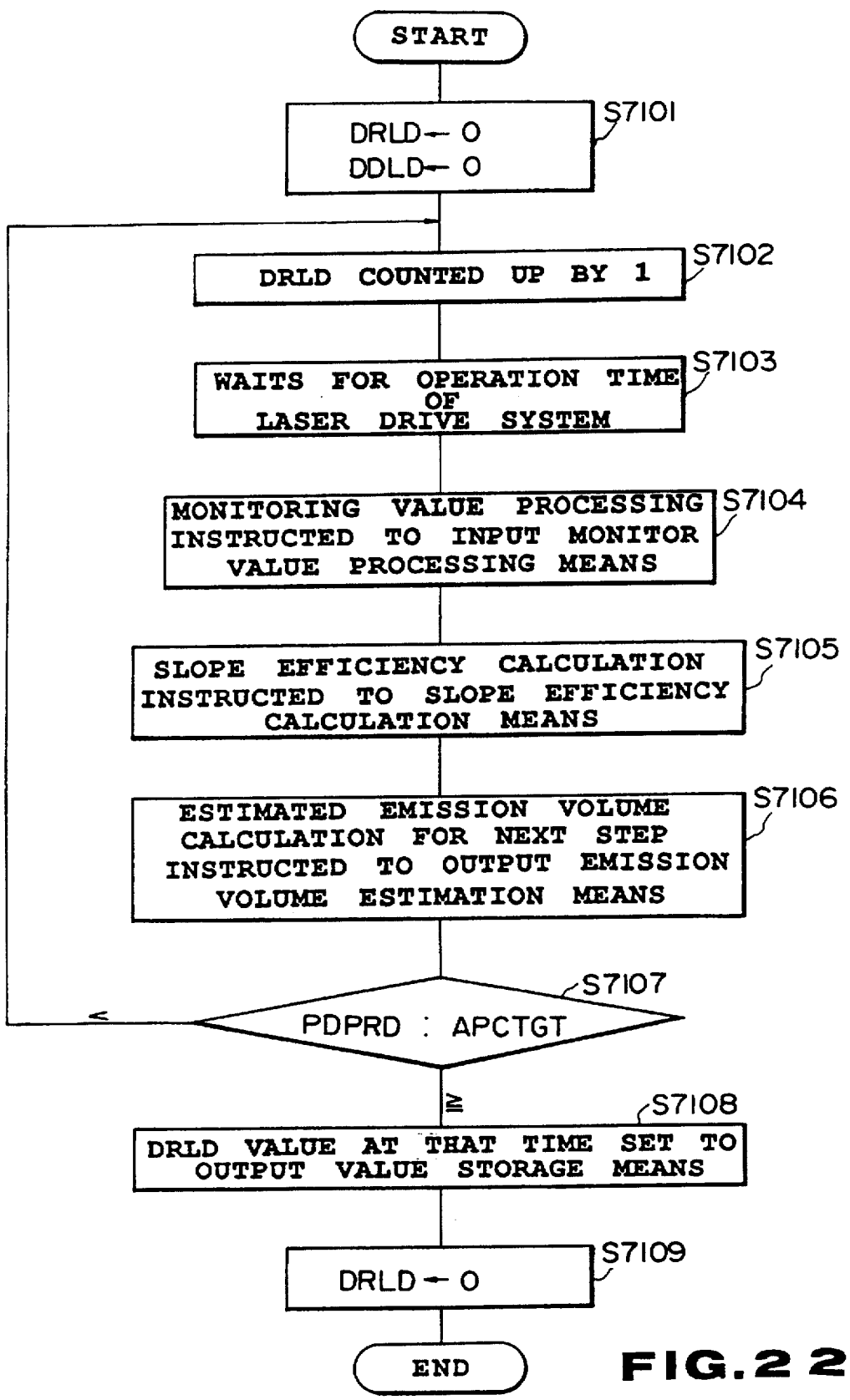
FIG. 22 is a flowchart showing the procedure for intensity control.

FIG. 22 is a flowchart showing a detailed procedure of the preliminary adjustment step (Step S7004) in FIG. 21. The CPU 312 in step S7101 first resets the individual outputs from the output value setting means 306 to zero (0). The CPU 312 in the step S7102 instructs the output value setting means 306 to count up the rough adjustment output by 1, and then in the step S7103 waits of the specified time while the laser intensity control system operates. This is a wait time, after the output value setting means 306 increases the output value, for the actual laser intensity to response and stabilize sufficiently, and until A/D conversion of the monitoring value is completed. After that, in the step S7104, the CPU 312 instructs the input monitor value processing means 303 to input and store the monitoring value which will be described later. In step S7105, the CPU 312 instructs the SLOPE efficiency calculation means 311 to make SLOPE efficiency calculation and, in the step S7106, instructs the output intensity estimation means 305 to determine an estimated value of output intensity in the next Step. Operation of the output intensity estimation means 305 will be described later. According to the result, the CPU 312 determines in the step S7107 whether or not the estimated value PDPRD exceeds the final target intensity APCTGT (see FIG. 33, in the Figure, the estimated value exceeds the final target value). When the estimated intensity does not exceed the final target intensity, the execution procedure returns to the step S7102, and when the estimated intensity exceeds the final target intensity, the execution procedure goes to the step S7108 and on. In the step S7108, the CPU 312 sets the setting value of DRLD at that time as an initial value DEi of final adjustment into the initial value storage means 308 (memory in the CPU 312) and, in the step S7109, resets the setting value of DRLD to level zero (0) to complete the initial control.

Figure 23:
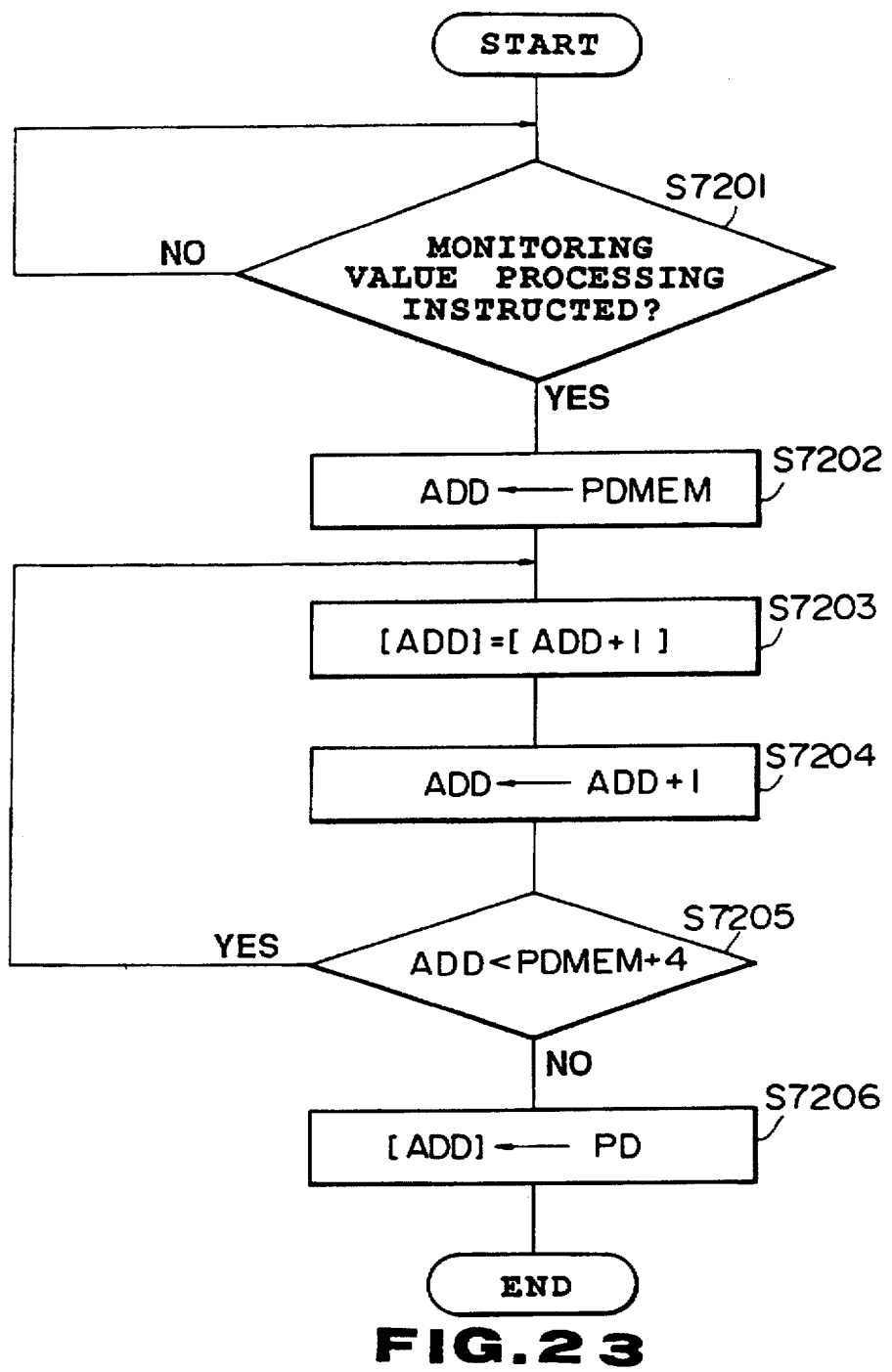
FIG. 23 is a flowchart showing the procedure for intensity control.
Figure 24:
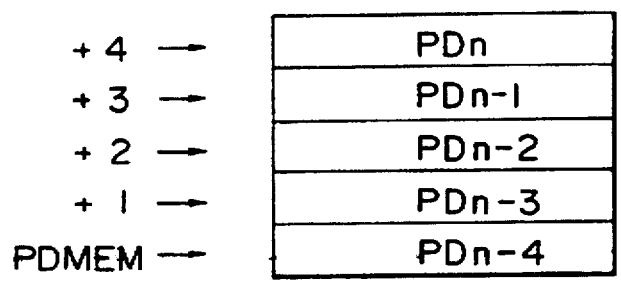
FIG. 24 is a schematic diagram showing data used for intensity control.
Figure 25:
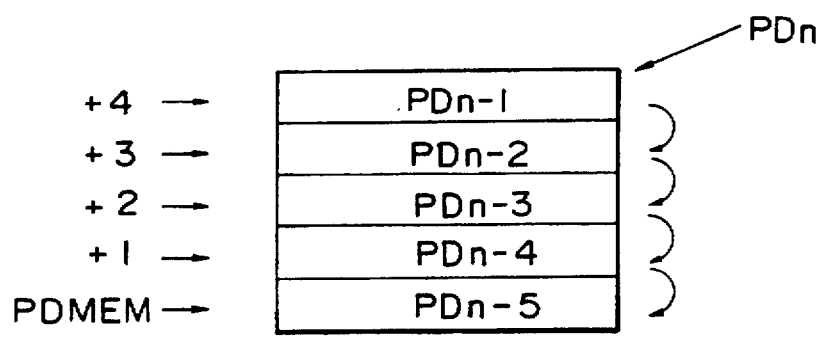
FIG. 25 is a schematic diagram showing data used for intensity control.

The input monitor value processing means 303, according to the instruction from the intensity adjustment control means 302, reads the intensity monitoring value DPD and rewrites the storage content of the monitoring value storage means (memory in the CPU 312) 304. The monitoring value storage means 304, as shown in FIG. 24, stores monitoring values of five times of data read. It stores old monitoring values in the order from the least significant address (PDMEM) of the monitoring value storage means, and the latest monitoring value in the most significant address. When the output value is counted up by 1, the execution time n advances by 1, and the data storage location is shifted as shown in FIG. 25. When an input processing instruction is received from the intensity adjustment control means 302, the input monitor value processing means 303 shifts data of the monitoring value storage means 304 to the next lower address, and writes the monitoring value PDn read at that time in the highest address. FIG. 23 shows a flowchart showing the above procedure. That is, in the step S7201, a monitoring value processing instruction is waited for from the intensity adjustment control means 302. When the monitoring value processing instruction is outputted, the execution procedure goes to the step S7202, where the lowest address PDMEM of the monitoring value storage area is written in the pointer ADD. In the step S7203 to the step S7205, the CPU 312 sequentially shifts the individual data as shown in FIG. 3. In the step S7203, the CPU 312 writes the content of the higher next address into the area indicated by the pointer at that time. In the step S7204, the CPU 312 advances the pointer by 1. In the step S7205, the CPU 312 checks that the advanced pointer is the highest address of the monitoring value storage area and, when the pointer is not the most significant address, the execution procedure of the CPU 312 returns to the step S7203. When the pointer is in the most significant address, in the step S7206 the CPU 3312 writes the monitoring value PD at that time in the address location indicated by the pointer, and completes the write procedure.

The CPU 312 functions as the SLOPE efficiency calculation means 311 executes calculation and correction of the SLOPE efficiency according to the instruction from the intensity adjustment control means 302.

When calculation of SLOPE efficiency is instructed, the CPU 312 first determines whether the SLOPE efficiency is convergent or not according to data stored in the monitoring value storage means 304 and, when it determines the SLOPE efficiency to have converged, obtains the SLOPE efficiency and stores it in the SLOPE efficiency storage means 310 (memory in the CPU 312). The determination method of the convergence of the SLOPE efficiency is as follows:

As described above, since the degree of the variety in the drive current at every data read is constant (DRLD is increased by 1 count) during the preliminary adjustment, the SLOPE efficiency can be represented by the increase in the intensity monitoring value at every read.

First, from data stored in the monitoring value storage means 304, an increase $\Delta_n$ in intensity monitoring value at the last time is determined by:

$$\Delta_n = PD_n - PD_{n-1}. \tag{10}$$

Then, an average increase $AV\Delta_n$ between before five times and the last read is determined:

$$AV\Delta_n = (PD_n - PD_{n-5})/5. \tag{11}$$

The above values are compared and, when the difference is within one (1), the SLOPE efficiency is determined to be converged. That is, the SLOPE efficiency is determined to be converged when the following relation is met by:

$$AV\Delta_n + 1 \geq \Delta_n \geq AV\Delta_{n-1}. \tag{12}$$

However, the initial values of the individual values of the monitoring value storage means 304 are zero (0), and the condition of Formula (12) may be satisfied at the initial stage of the control, the SLOPE Efficiency is unconditionally determined not to be converged when the value of $AV\Delta_n$ is less than the estimated minimum value $\Delta_{min}$.

On the other hand, when correction of the SLOPE efficiency is instructed, the increase $\Delta_n$ in intensity monitoring value at the last time is determined from data stored in the monitoring value storage means 304 using Formula (10), and increases DR and DD in rough adjustment and fine adjustment at that time are used for the determination:

$$\alpha = 8\Delta_n(8DR + DD). \tag{13}$$

Figure 26:
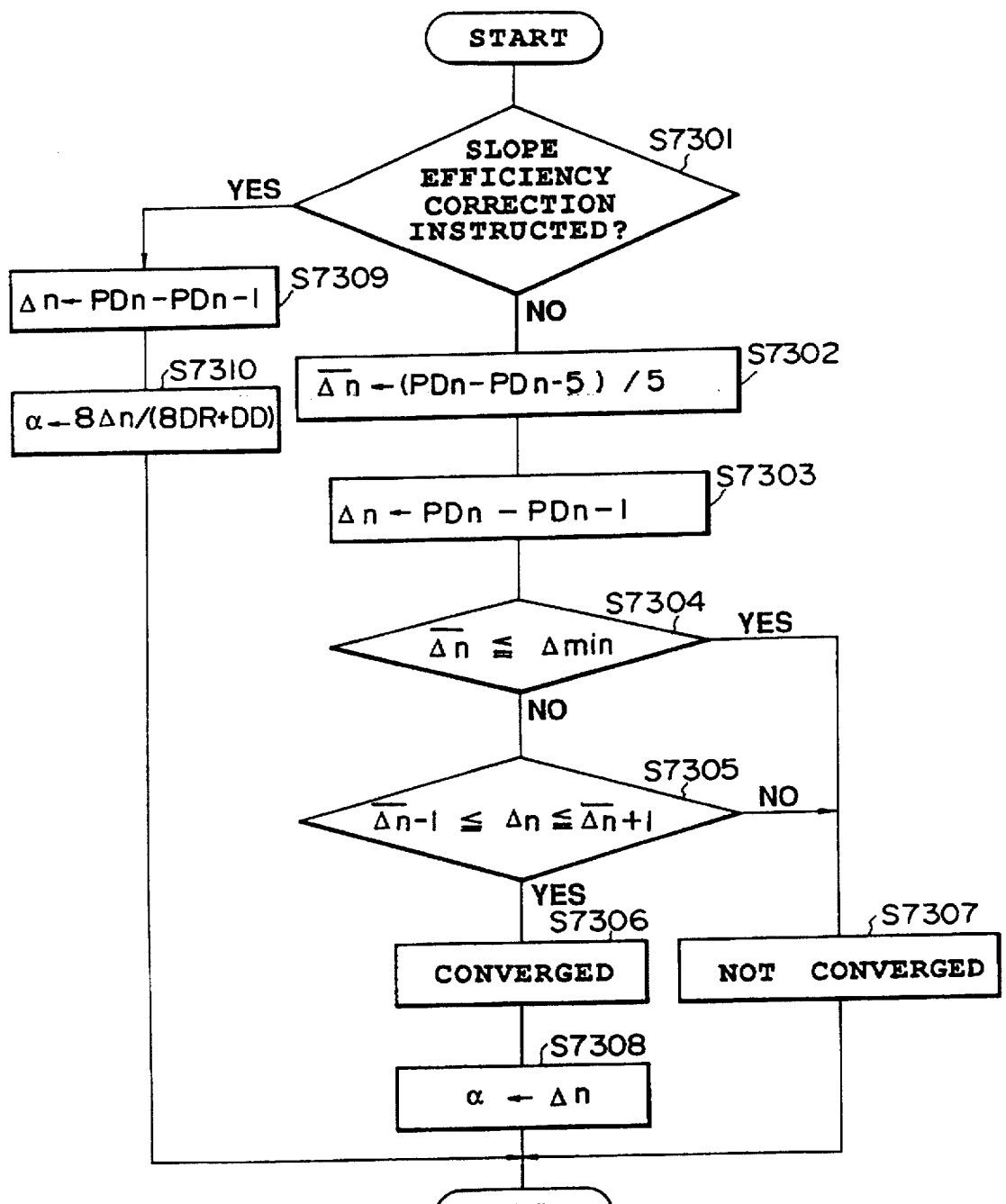
FIG. 26 is a flowchart showing the procedure for intensity control.

The flowchart to execute the above control procedure by the CPU 312 is shown in FIG. 26. In the step S7301, the CPU 312 checks whether or not the instruction from the intensity adjustment control means 302 is SLOPE efficiency correction request, when the instruction is correction request, the execution procedure goes to the correction procedure in the step S7309 and the step S7310 and, when the instruction is not correction request, the execution procedure goes to the convergence determination and calculation in the step S7302 to the step S7308. In the convergence determination and calculation, $AV\Delta_n$ is determined in the step S7302 by Formula (10) and $\Delta_n$ is determined in the step S7303 by Formula (11). Then, the CPU 312 checks in the step S7304 whether or not the $AV\Delta_n$ is less than the minimum value $A_{min}$ and, when $AV\Delta_n$ is less than the minimum value, the SLOPE efficiency is determined not to be converged, and the execution procedure goes to the step S7307. On the other hand, when $AV\Delta_n$ is greater than the minimum value, and the execution procedure goes to the step S7305, where determination is made as to whether or not the condition of Formula (12) is satisfied. When the condition is satisfied, the CPU 312 determines the SLOPE efficiency to be "converged" and, in the step S7308, stores $AV\Delta_n$ as the SLOPE efficiency $\alpha$ in the SLOPE efficiency storage means 310. When the condition of Formula (10) is not satisfied, the CPU 312 in the step S7307 determines it to be "not converged."

Figure 27:
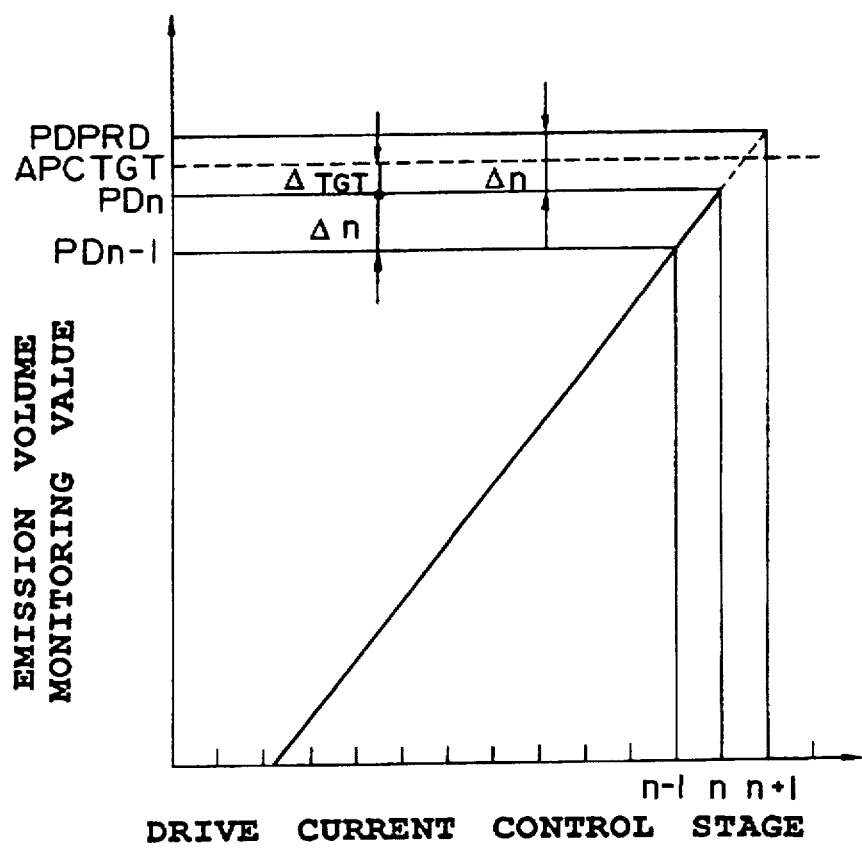
FIG. 27 is a schematic diagram showing relation between the drive current control Step and the light emission intensity monitoring value.

In the correction Step, the CPU 312 determines $\Delta_n$ by Formula (10), in the step S7310 determines again the SLOPE efficiency by Formula 13, and stores it in the SLOPE efficiency storage means 310. When the CPU 312 operates as the output intensity estimation means 305, it determines a light emission estimation value after the next 1 control Step by the instruction from the intensity adjustment control means 302. As shown in FIG. 27, where control Step at a point is n, since the monitoring value $PD_n$ and the previous monitoring value $PD_{n-1}$ are stored in the monitoring value storage means 304 as shown in FIG. 24, the output intensity estimation means 305 determines the monitoring value increase $\Delta_n$ between the control Step (n−1) to n and the intensity estimation value PDPRD at the next Step by the following Formulae:

$$\Delta_n = PD_n = PD_{n-1}, \tag{14}$$

$$PDPRD = PD_n + \Delta_n. \tag{15}$$

In the final adjustment, the intensity adjustment control means 302 determines the output value to reach the target intensity according to the SLOPE efficiency determined in the preliminary adjustment.

Figure 28:
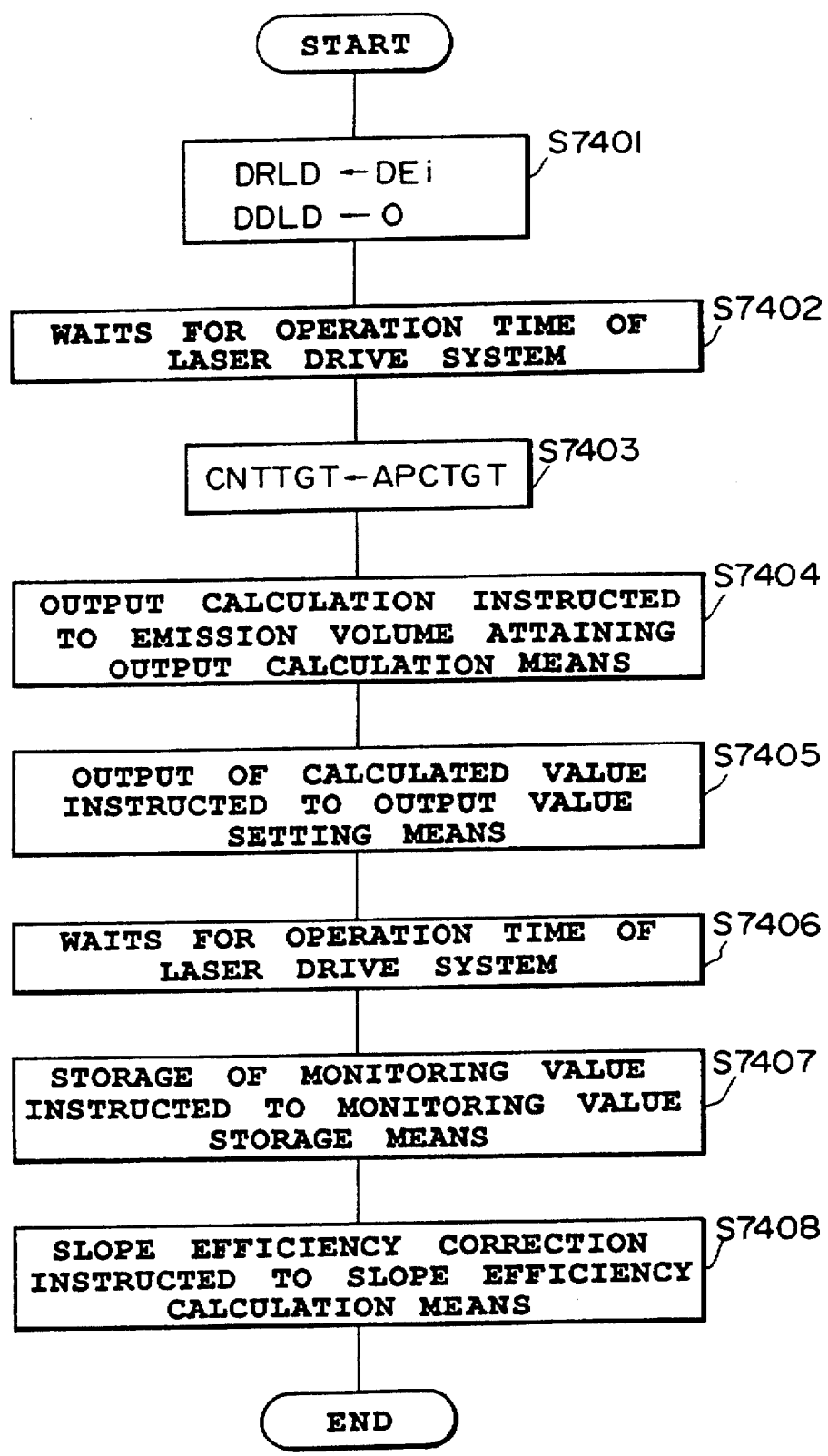
FIG. 28 is a flowchart showing the procedure for intensity control.

FIG. 28 is a flowchart showing details of the final adjustment control Step (Step S7005) in FIG. 21. First, in the step S7401, the CPU 312 makes initial setting of DE stored in the initial value storage means 308 as a value of DRLD (rough adjustment), and instructs the output value setting means 306 to output zero(0) as the value of DDLD (fine adjustment) as initial value setting. The CPU 312 in the step S7402 waits for the operation time of the laser intensity control system. This is the waiting Step same as in the preliminary adjustment (Step S7103). In the step S7403, the CPU 312 sets the final target intensity APCTGT as the control target intensity CNTTGT into the control condition storage means 310. After that, the CPU 312 instructs the intensity attaining output calculation means 307 to calculate the output value to attain the control target intensity using the intensity monitoring value corresponding to the initial output value and the SLOPE efficiency (Step S7404). The CPU 312 instructs the output value setting means 306 to output the determined output values to DRLD and DDLD (Step S7405). Operation of the intensity attaining output calculation means 307 will be described later. After that, in the step S7406, the CPU 312 waits for the operation time of the intensity control system as in the step S7402. In the step S7407, the CPU 312 instructs the monitoring value storage means 304 to store the above monitoring value, and then in the step S7408 instructs the SLOPE efficiency calculation means 311 to correct the SLOPE efficiency.

The CPU 312 when functioning as the intensity attaining output calculation means 307, takes in the intensity monitoring value PD, SLOPE efficiency $\alpha$, and control intensity CNTTGT corresponding to the output at that time from the intensity monitoring storage means 304, the control intensity storage means 309, and the SLOPE efficiency storage means 310 by the instruction from the intensity adjustment control means 302. Furthermore, the CPU 312, obtains the output value at that time from the initial value storage means 308, calculates the rough adjustment output value DRLD TGT and the fine adjustment output value DDLD TGT for attaining the target intensity, and outputs the calculated results to the output value setting means 306. Calculation method for the DRLD TGT and DDELD TGT is as follows:

The difference $\Delta T$ between the control intensity and the present intensity value for the initial output is $$\Delta T = CNTTGT - PD. \tag{16}$$

If the degree of the variety in intensity per 1 count of rough adjustment is α, since the intensity change per 1 count of fine adjustment is ⅛ of the rough adjustment, the intensity change is α/8. Therefore, where the outputs of the rough adjustment and fine adjustment at that time are respectively $DRLD_X$ and $DDLD_X$, outputs to obtain the target intensity are:

$$DRLD_{TGT}=DRLD_n+(\Delta_T/\alpha), \quad (17)$$

$$DDLD_{TGT}=DDLD_n+(<<\Delta_T/\alpha>>\times 8/\alpha), \quad (18)$$

((x/y): quotient of x/y, <<x/y>>: residual of x/y)

Figure 29:
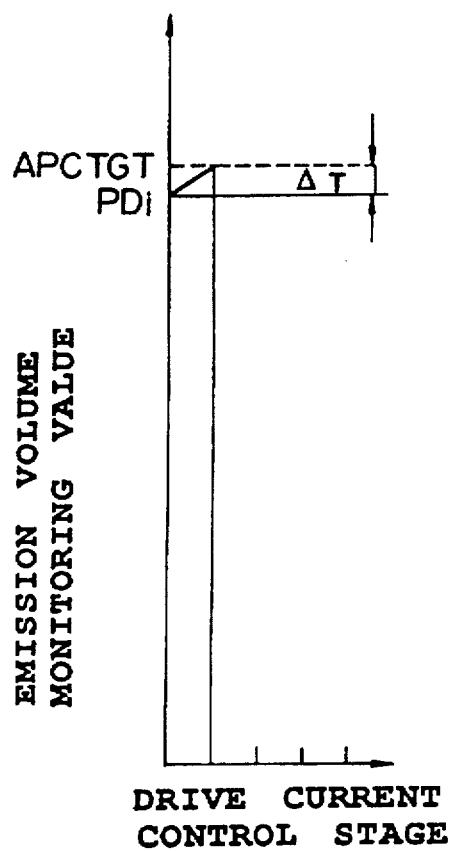
FIG. 29 is a schematic diagram showing relation between the drive current control Step and the light emission intensity monitoring value.

The output value setting means 306, according to the instruction from the intensity adjustment control means 302, outputs the rough adjustment output and the fine adjustment output as DRLD and DDLD, respectively. By executing the above control by the laser intensity comparison control means 301, when the initial control for adjustment of the laser printer is executed once, at the starting up at power ON of the laser printer, thereafter, merely the final adjustment of the laser printer is required before printing. When the initial adjustment has been completed with the control Step n as shown in FIG. 27, the final adjustment before printing is completed by one(1) control Step as shown in FIG. 29, considerably accelerating the intensity adjustment before printing.

Figure 37:
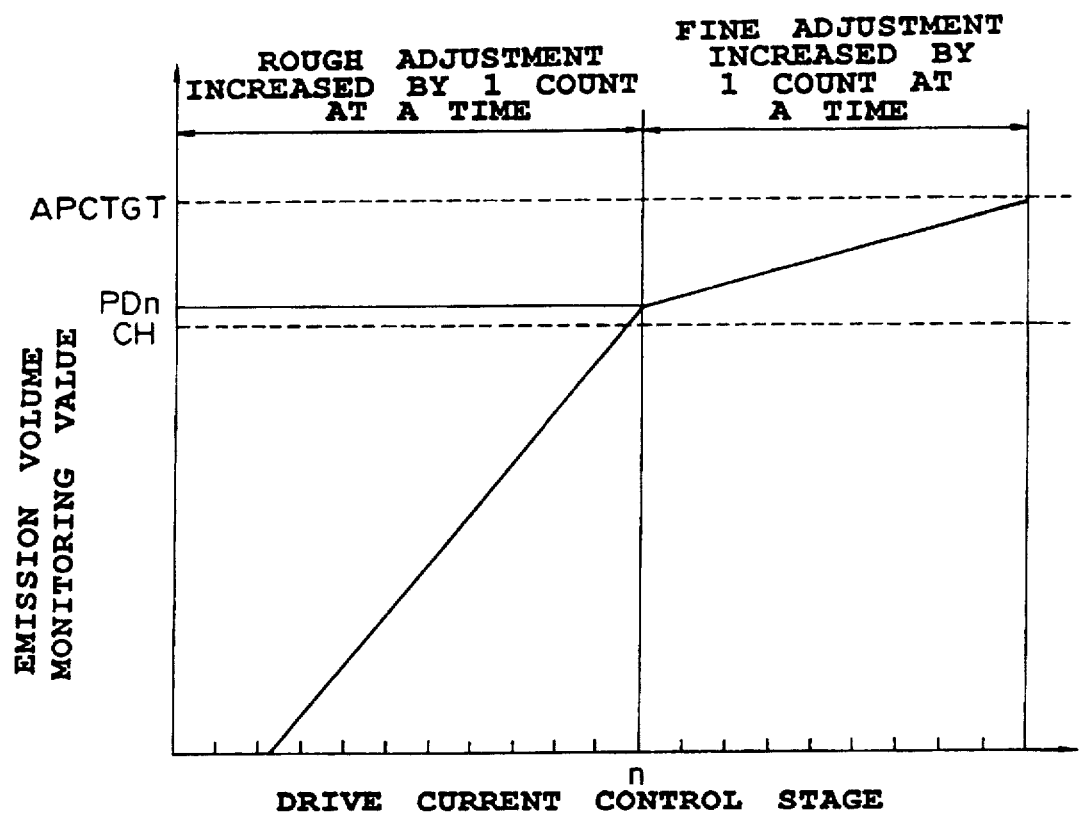
FIG. 37 is a graph showing relation between the light emission current and the laser intensity.

This method is compared with the prior art control method. For example, in the prior art method in which up to a certain proportion of the target intensity is adjusted by the rough adjustment, and thereafter adjusted by the fine adjustment, changes as shown in FIG. 37 are obtained. That is, the drive current is adjusted by rough adjustment up to a stage n where an intensity value CH of a proportion of the final target intensity APCTGT, and the intensity monitoring value PD are exceeded and, thereafter, adjusted by fine adjustment up to the final target intensity APCTGT. Comparing the change shown in FIG. 29 using the inventive method with the change shown in FIG. 37, it can be seen that the prior art method has a substantial difference in the number of control Steps. Furthermore, with the control according to the present invention, a very efficient laser intensity adjustment is possible.

(Eighth embodiment)

An eighth embodiment will now be described. In the above embodiments, the final adjustment is made according to the SLOPE efficiency in the course of adjustment. However, the SLOPE efficacy of a semiconductor laser varies with ambient conditions, and there may be a substantial error in the final adjustment result from the final target intensity with the passage of time. Then, an example will be described in which when actually once outputted result in the final adjustment has a substantial error, the SLOPE efficiency is corrected and the adjustment is retried.

Figure 30:
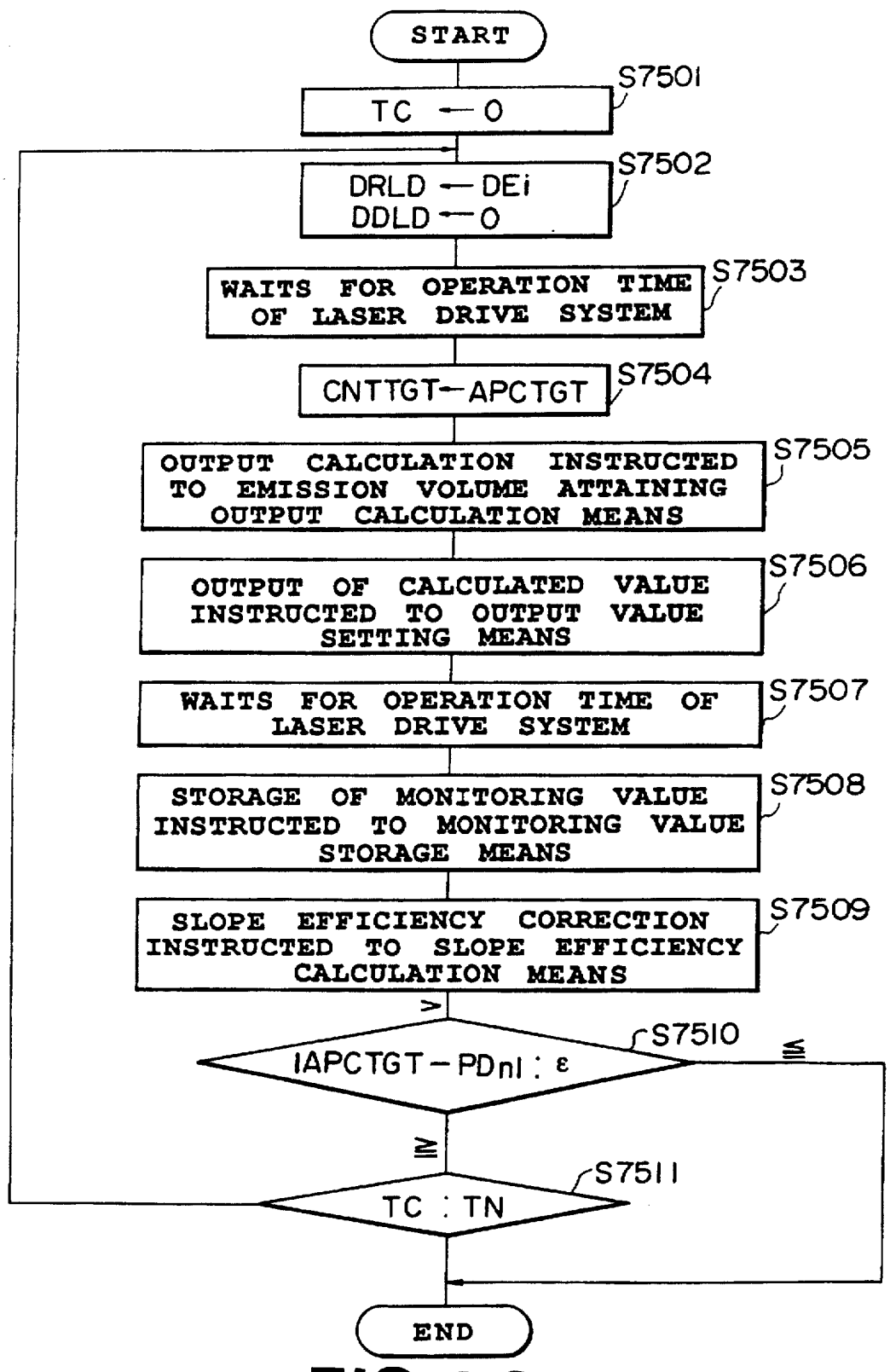
FIG. 30 is a flowchart showing another procedure (eighth embodiment) for intensity control.

The whole arrangement of the laser intensity comparison control means 301 in this example is the same as that shown in FIG. 20. Basic control contents of the intensity adjustment control means 302 are also almost the same as those shown in FIG. 21, except that details of the final adjustment in the step S7005 are different. FIG. 30 is a flowchart showing details of the final adjustment in this example. First, in the step S7501, the CPU 312 resets a counter TC which manages the retry repetitions to 0. The procedure of step S7502 to the step S7509 is the same as that of step S7401 to the step S7408 in FIG. 28. That is, after step S7509, in the step S7510, a difference between the monitoring value PD n and the final target intensity APCTGT is checked and when the difference is larger than the specified a, the procedure goes to the step S7511. In the step S7511, the counter TC, for managing numbers of the retry, is checked, and when the value of the counter TC is smaller than the repetition times TN, the execution procedure returns to the step S7502, to repeat the same processing. However, when in the step S7511, the counter TC is more than a predetermined repetition times TN, the execution is completed as is. With the above control, the accuracy of final adjustment can be improved even further.

(Ninth embodiment)

A ninth embodiment will now be described. In the above-described example, in the initial adjustment, control is executed by the rough adjustment up to a point where a maximum intensity is obtained that does not exceed the final target intensity APCTGT, and the remnant is adjusted by the final adjustment. As an alternative method, in the initial adjustment up to final intensity APCTGT, the adjustment is executed with sufficient interval and in the final adjustment, the control can be made up to just before the final target intensity, the SLOPE efficiency is corrected, and the control can be executed up to the final target intensity using the corrected SLOPE efficiency.

The whole arrangement of the laser intensity comparison control means 301 in this example is also the same as that shown in FIG. 20. Basic control contents of the intensity adjustment control means 302 is also the same as those show in FIG. 21, except that details of the preliminary adjustment in the step S7004 and the final adjustment in the step S7005 are different.

Figure 31:
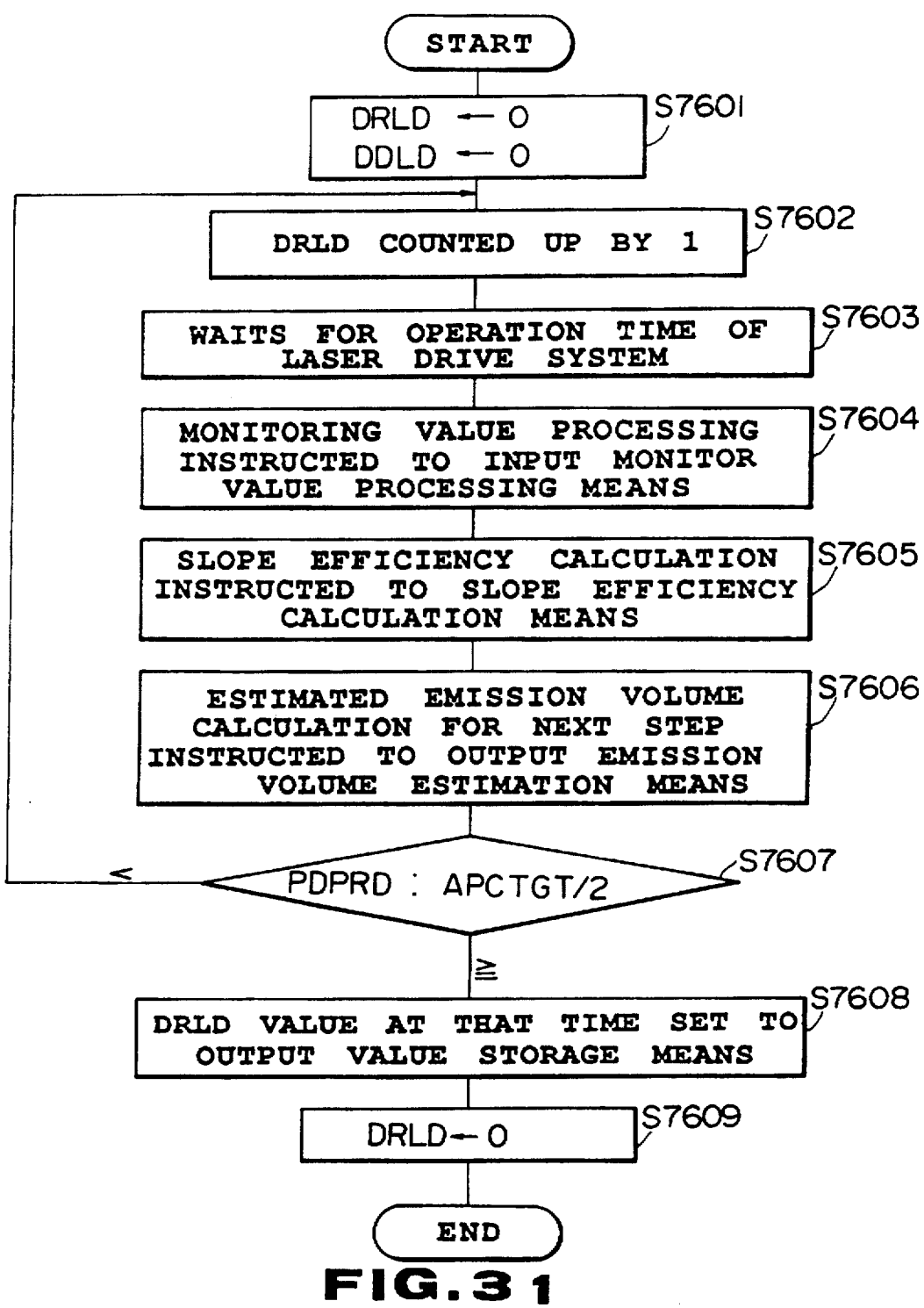
FIG. 31 is a flowchart showing a further procedure (ninth embodiment) for intensity control.

FIG. 31 is a flowchart showing details of the preliminary adjustment in this example. This preliminary adjustment is almost the same as the preliminary adjustment in FIG. 22, but the processing in the step S7607 in FIG. 22 differs from the processing in the step S7107 in FIG. 22. That is, in the step S7107 of FIG. 22, preliminary adjustment is executed until the estimated intensity PDPRD exceeds the final target intensity APCTGT, whereas in the example in FIG. 31, in the step S7607, the estimated intensity PDPRD is compared with the final target intensity APCTGT/2, and the preliminary adjustment is executed until ½ of the final target intensity.

Figure 32:
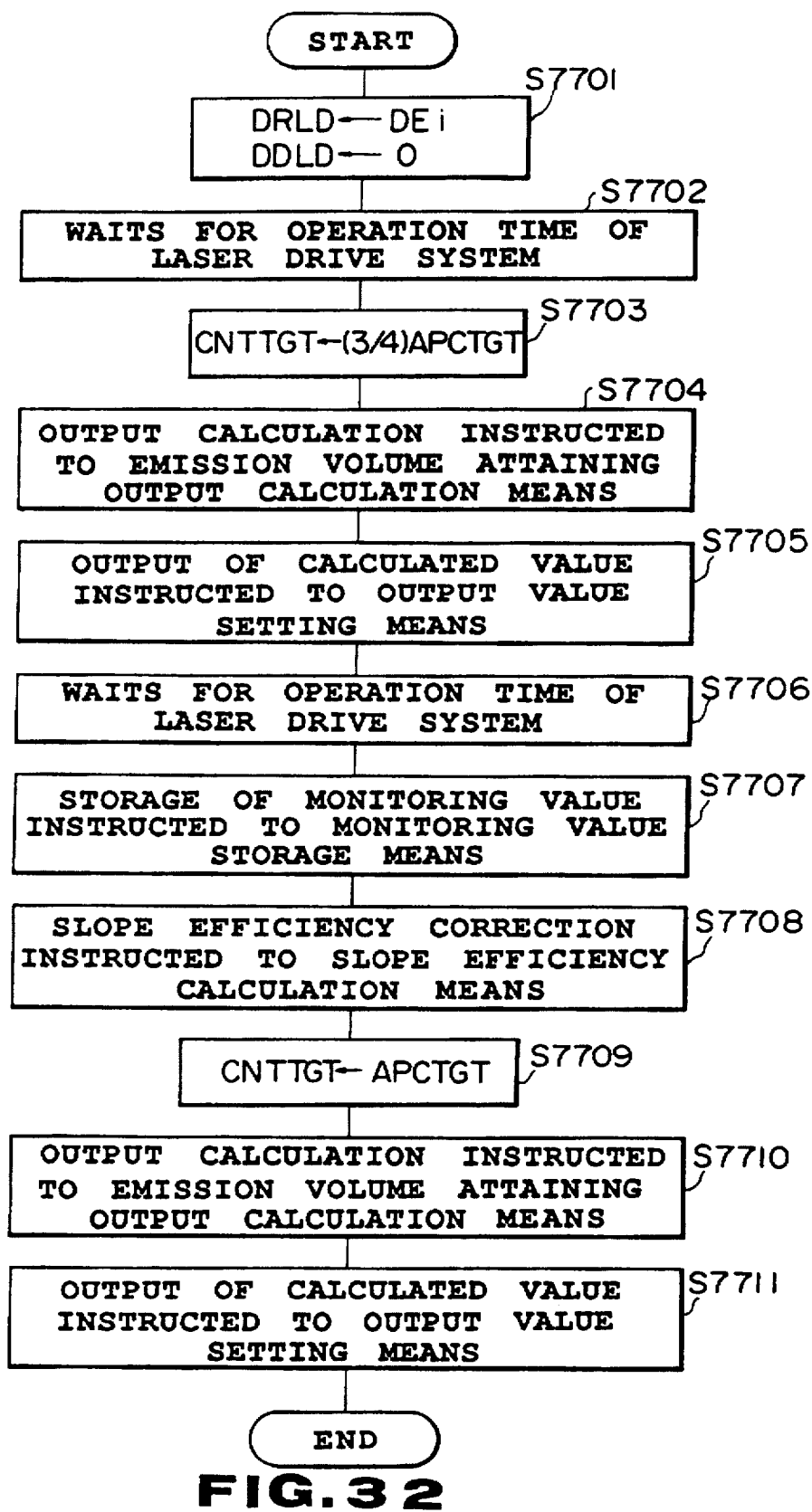
FIG. 32 is a flowchart showing a still further procedure for intensity control.

FIG. 32 is a flowchart showing details of final adjustment in this example. The step S7701 to the step S7708 in FIG. 32 are almost the same as step S7401 to the step S7408 of FIG. 28 but, in the step S7703 of FIG. 32, the first control target is set to (¾)APCTGT. This is the first stage of final adjustment, in which control is executed up to just before the final target value to predetermine the SLOPE efficiency at that point. Therefore, in the step S7408 of FIG. 28, the SLOPE efficiency is corrected for next intensity adjustment but, in the step S7708 of FIG. 32, the SLOPE efficiency is corrected for intensity adjustment at that time. The processing in the step S7709 and on of FIG. 32 is the second stage of final adjustment, in which the control is executed up to the final target intensity APCTGT using the SLOPE efficiency corrected in the step S7708. First, in the step S7709, the final target value APCTGT is set as a control target CNTTGT. Then, in the step S7710, an output calculation instruction is sent to the intensity attaining output calculation means 307, and finally, an instruction is sent to the output value setting means 306 to output the calculated output value, thus, the final adjustment is completed.

Figure 33:
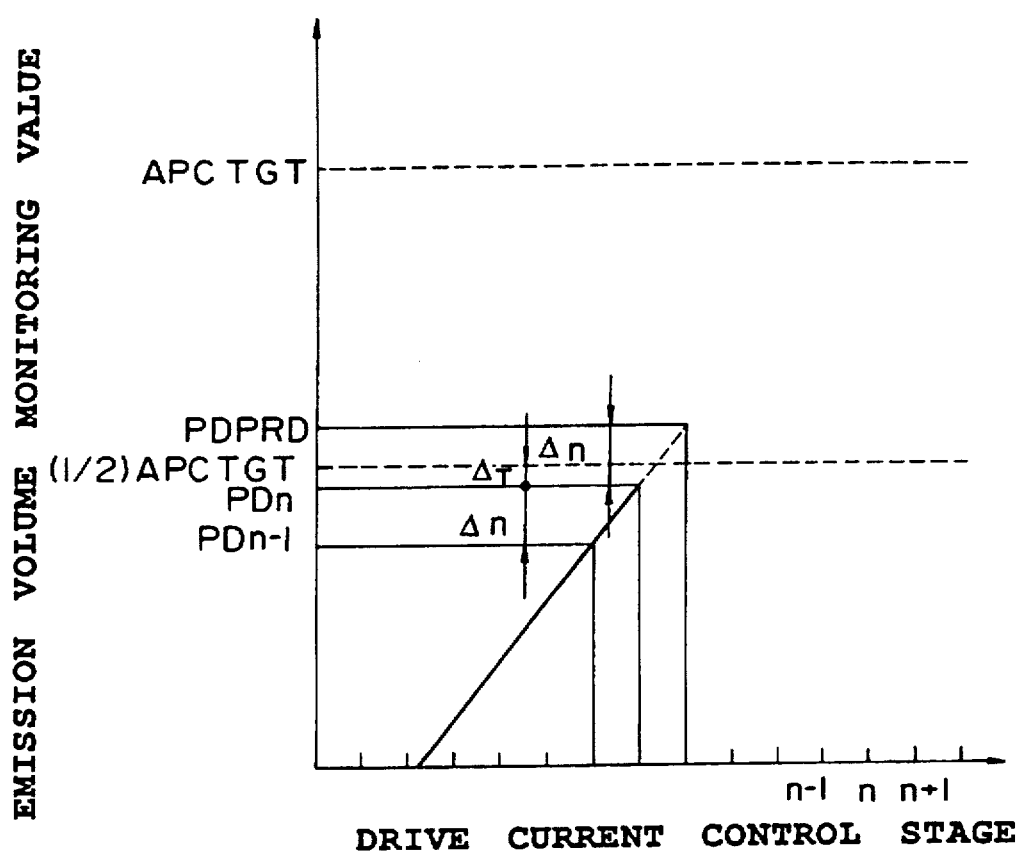
FIG. 33 is a schematic diagram showing relation between the drive current control Step and the light emission intensity monitoring value.
Figure 34:
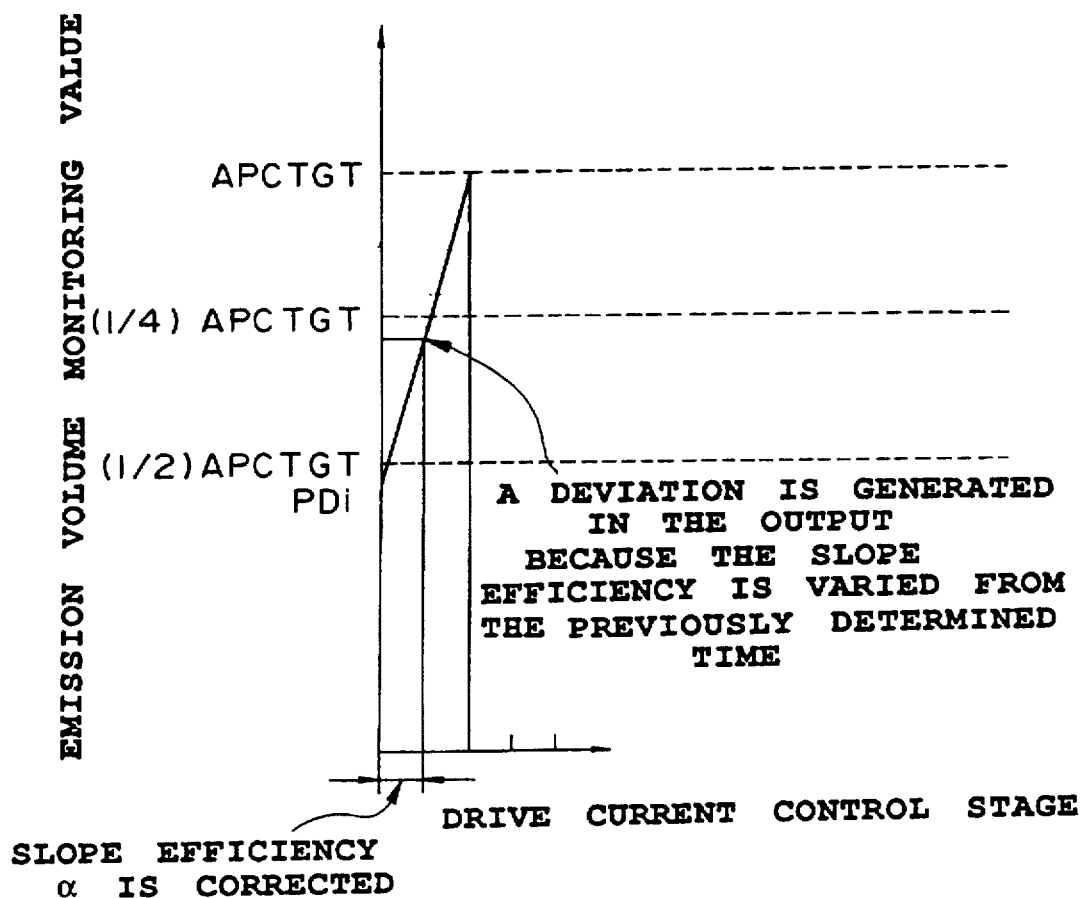
FIG. 34 is a schematic diagram showing relation between the drive current control Step and the light emission intensity monitoring value.
Figure 35:
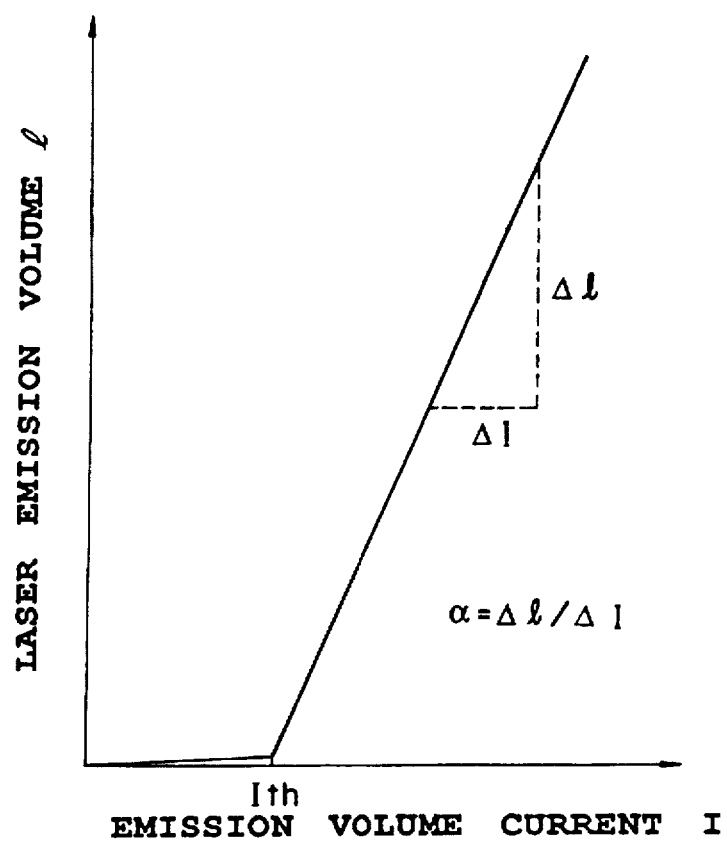
FIG. 35 is a graph showing relation between the light emission current and the laser intensity.
Figure 36:
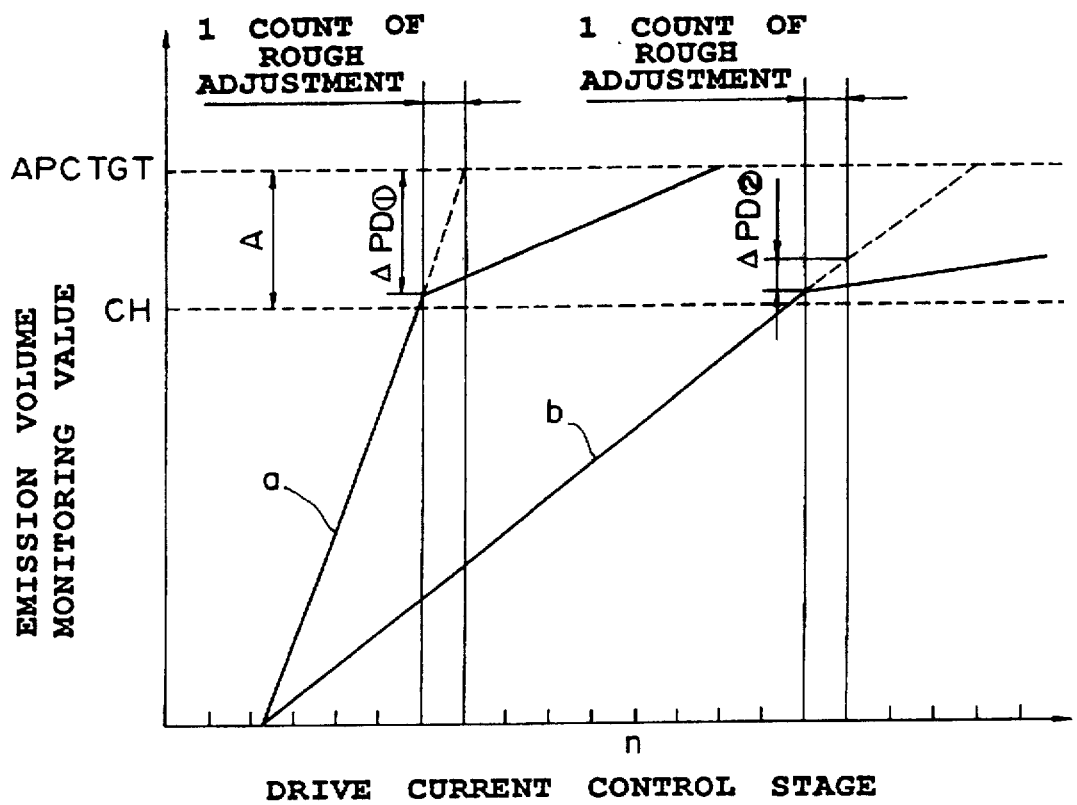
FIG. 36 is a graph showing relation between the light emission current and the laser intensity.

The preliminary adjustment and final adjustment of this example are shown in FIG. 33 and FIG. 34, respectively. Comparing FIG. 29 (third embodiment) with FIG. 34 (further version of third embodiment), it can be seen that in the example of FIG. 34, the control stage is increased from one(1) Step in FIG. 29 to two(2) Steps but, since the SLOPE efficiency is determined and corrected at the time of the control, the control accuracy is improved.

(Tenth embodiment)

Figure 39:
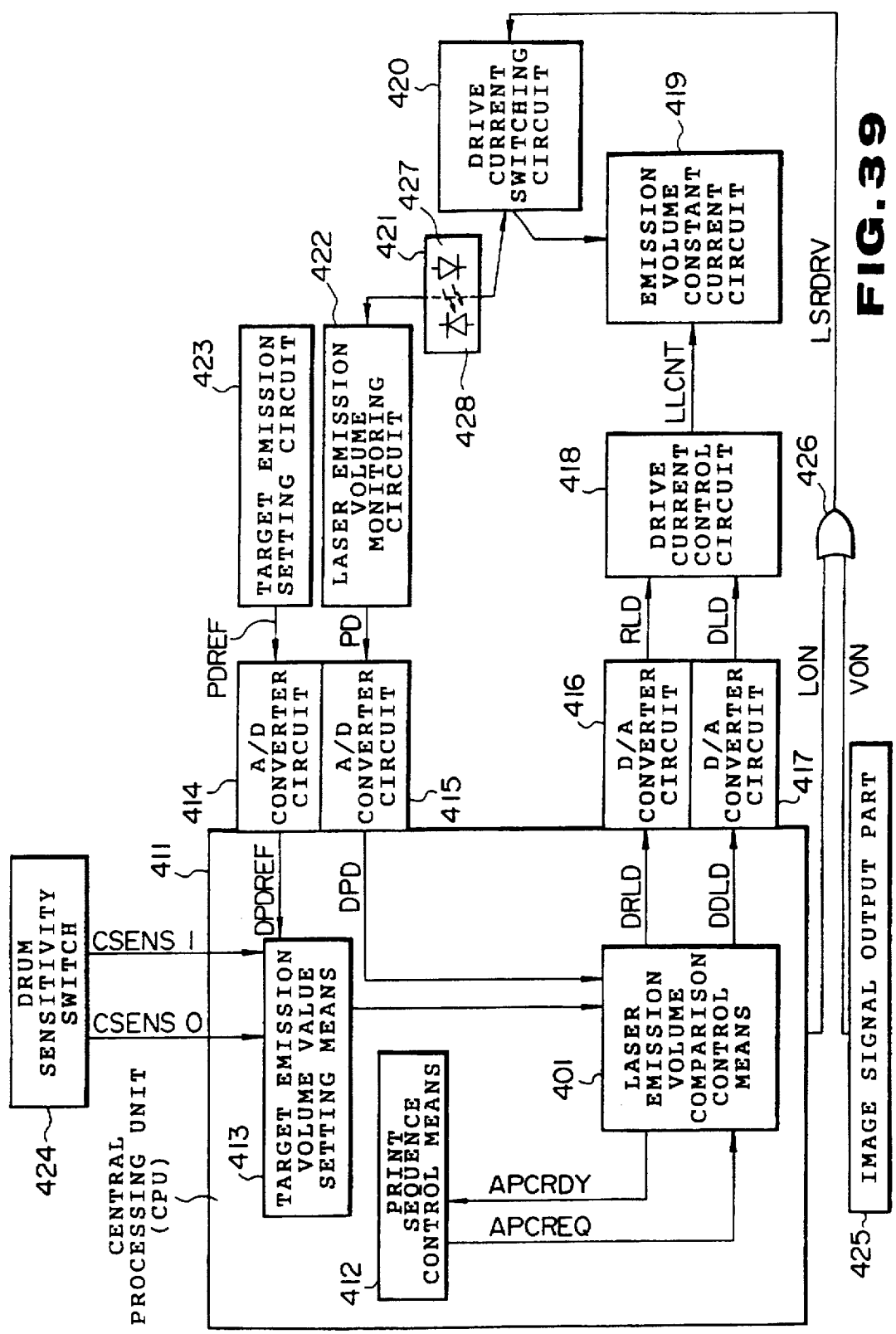
FIG. 39 is a block diagram showing an arrangement of the laser intensity comparing control means.

FIG. 39 shows the system arrangement of the laser drive circuit of the present embodiment. In FIG. 39, the reference numeral 411 indicates a central processing unit (CPU), and the reference numeral 418 indicates a drive current control circuit. The reference numeral 419 indicates a light emission constant current circuit, and the reference numeral 420 indicates a drive current switching circuit. The reference numeral 421 indicates a laser unit, and the reference numeral 422 indicates a laser intensity monitoring circuit. The reference numeral 423 indicates a target emission setting circuit. The reference numeral 424 indicates a drum sensitivity switch, and the reference numeral 425 indicates an image signal output part. The reference numeral 426 indicates an OR gate.

The CPU 411 comprises print sequence control means 412, laser intensity comparison control means 401, target emission value correction means 413, an A/D (analog-digital) converter circuits 415 and 416, D/A (digital-analog) converter circuits 416 and 417, and the like. The laser unit 421 comprises a semiconductor laser 427 and a photodiode 428.

The CPU 411 executes control management for the whole printer including print sequence control, laser emission control and the like. The print sequence control means executes control for whole printing action of laser beam printer and sends an APCREQ signal to the laser intensity comparison control means 401 at a specified timing during print sequence to instruct starting of laser intensity control.

The laser intensity comparison control means 401, while comparing a laser intensity monitoring value DPD from the laser intensity monitoring circuit 422 converted to a digital value through the A/D converter circuit 415 with a final target intensity value APCTGT given from the target intensity correction means 413, converts the output values DRLD and DDLD to analog outputs RLD and DLD through the D/A converter circuits 416 and 417, which are outputted to control the drive current control circuit 418 for adjusting so that the laser light emission reaches the target emission intensity. When it is determined the laser light emission to reach the target intensity, it sends an APCRDY signal to the print sequence control means 412 to notify the completion of laser intensity adjustment. Intensity control of the laser intensity comparison control means 401 will be described later in detail.

The drive current control circuit 418 controls the current value of the light emission constant current control circuit 419 according to the output from the laser intensity comparison control means 401. The output from the laser intensity comparison control means 401 includes two systems of RLD (D/A converter circuit 416) and DLD (D/A converter circuit 417), and the drive current control means adds the outputs RLD and DLD in a ratio of 8:1 to determine the value of drive current. That is, DLD can adjust the drive current with 8-times higher accuracy than RLD, and the laser intensity comparison control means 401 can use RLD for rough adjustment of the laser intensity and DLD for fine adjustment. The embodiment uses this arrangement bring the laser intensity as close as possible to the target value, but the output from the laser intensity comparison control means 401 may be single system.

The light emission constant current circuit 419 flows a predetermined current to the semiconductor laser 427 through the drive current switching circuit 420 according to the control from the drive current control circuit 418. In the laser unit 421, the photodiode 428 receives laser light of the semiconductor laser 427 which emits light by the drive current, and sends a corresponding signal to the laser intensity monitoring circuit 422.

The laser intensity monitoring circuit 422 is supplied with the detection signal from the photodiode 428, converts a voltage PD corresponding to the detected intensity to a digital value DPD through the A/D converter circuit 415, and outputs it to the laser intensity comparison control means 401.

The target emission setting circuit 423 is a circuit for setting a standard target emission value on which the target value is based. The target emission setting circuit 423 converts voltage PDREF corresponding to a value PD of voltage outputted from the laser intensity monitoring circuit 422 into digital value DPDREF to give to the target emission value correction means 413 when the laser 427 emits at the level being necessary for the drum having standard sensitivity. The drum sensitivity switch 424 sets the steps of sensitivity of the photosensitive drum disposed in the laser beam printer. In this embodiment, two switches CSENS0 and CSENS1 are arranged, and the drum sensitivity can be set in four Steps manually by turning on and off the switches or automatically when the drum is set. The target intensity correction means 413 corrects according to the drum sensitivity which is set by the drum sensitivity switch 424, the standard target emission value given from the target emission setting circuit 423 and converted into a digital value through the A/D converter 414 and outputs it as a final target intensity APCTGT to the laser intensity comparison control means 401. The image signal output part 425 outputs VON signal of the image for printing. The OR gate 426 ORs a LON signal outputted from the laser intensity comparison control means 401 with a VON signal outputted from the image signal output part 425, and outputs the calculation result to the drive current switching circuit 420. That is, when one of the LON and VON signals is ON, a predetermined current flows through the semiconductor laser 427. Digital data in the embodiment are all processed in 8 bits (0-255).

Figure 38:
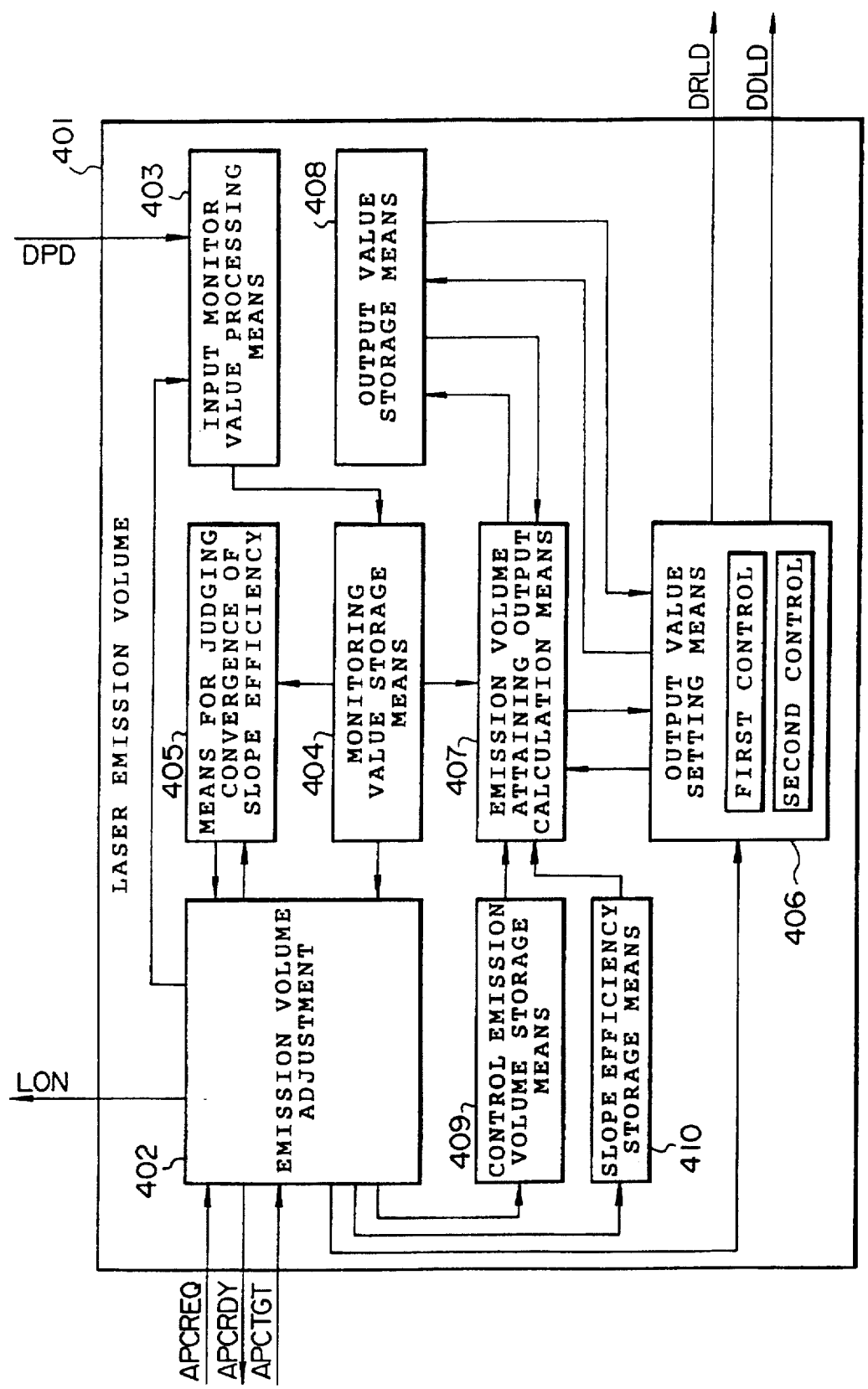
FIG. 38 is a block diagram showing a system arrangement as a tenth embodiment of the present invention.

Then, control of the laser intensity comparison control means 401 will be described in detail. FIG. 38 is a block diagram showing an arrangement of the laser intensity comparison control means 401 of the embodiment. The laser intensity comparison control means 401 comprises intensity adjustment control means 402, input monitor value processing means 403, monitor value storage means 404, output intensity estimation means 405, output value setting means 406, target intensity attaining output value calculation means 407, output value storage means 408, control intensity storage means 409, SLOPE efficiency storage means 410, and SLOPE efficiency calculation means 412.

The intensity adjustment control means 402 receives an APCREQ signal from the print sequence control means 412, and controls operation of the input monitor value processing means 403, the means for judging convergence of slope efficiency 405, and setting means 406, to execute intensity adjustment. In the intensity adjustment, when determination that real emission intensity reached the target emission intensity, is made, the APCRDY signal is outputted to the print sequence control means 412. Here, the intensity adjustment control means 402 starts controlling from zero level of output DRLD (rough adjustment) and DDLD (fine adjustment) together and indicates the control (first control) in which in the start condition, DRLD (rough adjustment) is incremented by count one. In this control the judgement (described later) in the means 405 for judging convergence of slope efficiency is supervised and when it is judged that the slope efficiency was convergent, the control (second control) in which the drive current is increased to the target intensity level, at one time, is indicated to the output value setting means 406.

Figure 46:
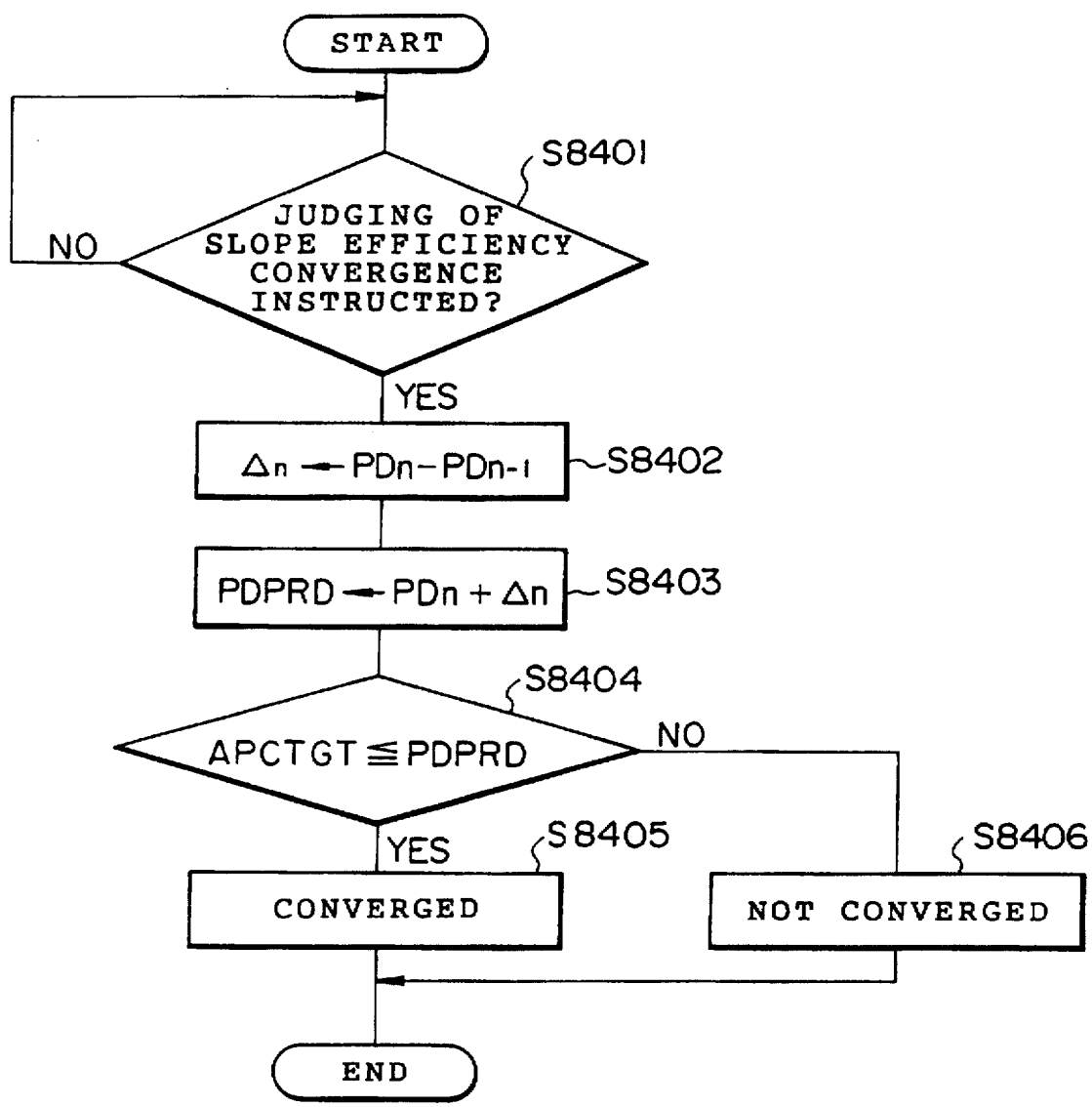
FIG. 46 is a flowchart showing a still further procedure as the eleventh embodiment.

FIG. 46 is a flowchart showing the execution procedure of the intensity adjustment control means 402. First, in the step S8001, the intensity adjustment control means 402 waits until the APCREQ signal is outputted from the print sequence control means 412. When APCREQ is TRUE, the execution procedure goes to the step S7002, where the LON signal is set to TRUE to make a condition to flow the drive current, and a condition in which intensity adjustment is possible.

In the step S7003, the first control is indicated to the output value setting means 406. By this process, the output setting means 406 increases the output of the rough adjustment by one count and outputs as described later. Next, the control procedure waits during the operation of the laser drive system in step S8004. This is waiting time until the real emission intensity responds to the increase of the output value of the output value setting means 406 and will be stable. Then, in the step S8005, the instruction to the input monitor value processing means 403 to input and store the monitoring value which will be described later is executed. In the step S8006, the instruction to the means for judging convergence of SLOPE efficiency to judge SLOPE efficiency regarding convergence being described later is executed. According to the result, the intensity adjustment control means 402 determines in the step S8007 whether or not the SLOPE efficiency was convergent. When the SLOPE efficiency was not convergent, the execution procedure returns to the step S8003, to repeat the first control. On the other hand, and when the SLOPE efficiency was convergent, the execution procedure goes to the step S8008 and the step S8009. In the step S8008, and the step S8009, the SLOPE efficiency $\Delta_n$ is stored in the SLOPE efficiency storage means 410 and the setting value of APCTGT time as an initial value DEi of final adjustment is storaged in the control intensity storage means 409.

Figure 40:
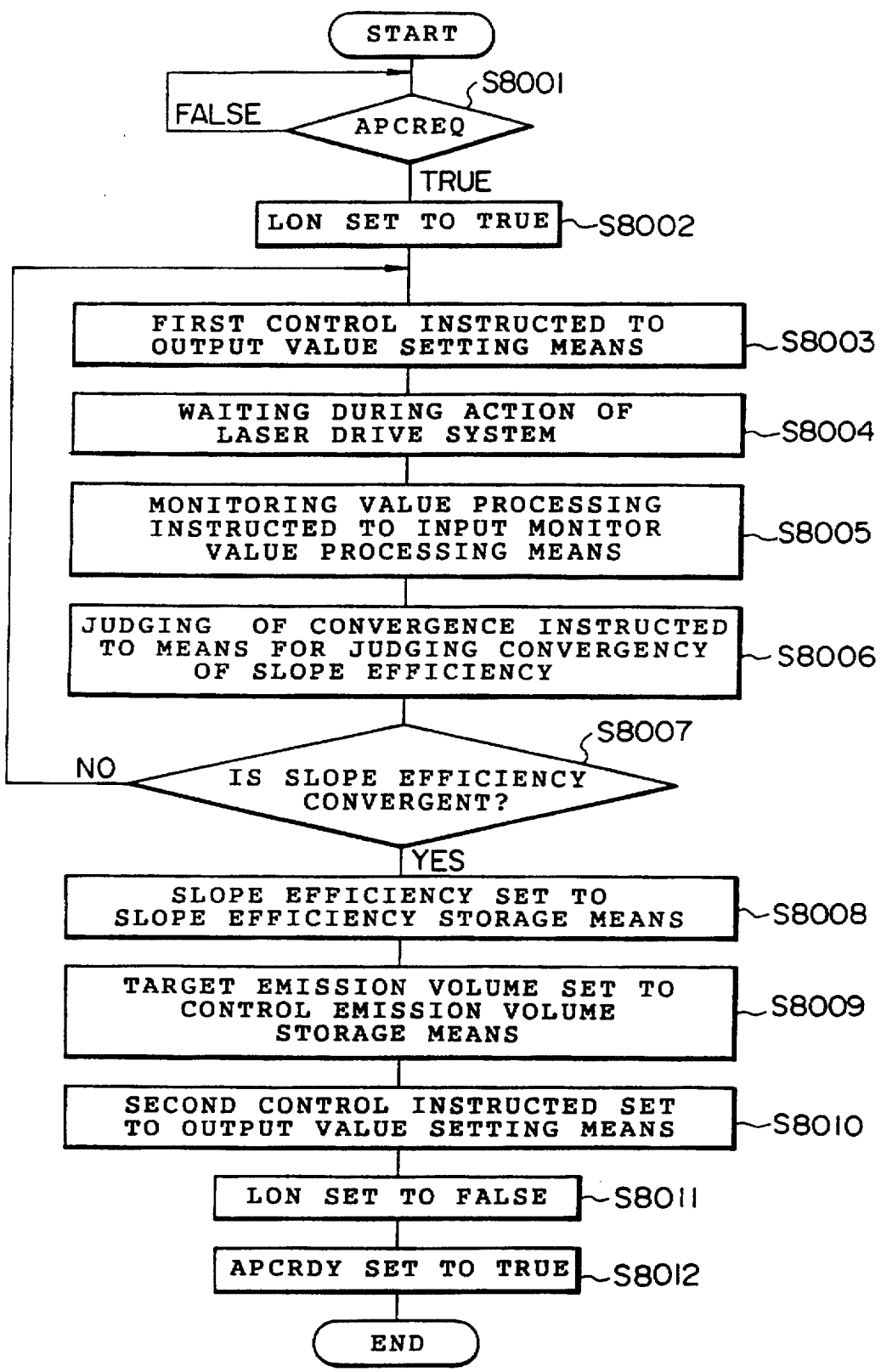
FIG. 40 is a flowchart showing the procedure for intensity control.
Figure 41:
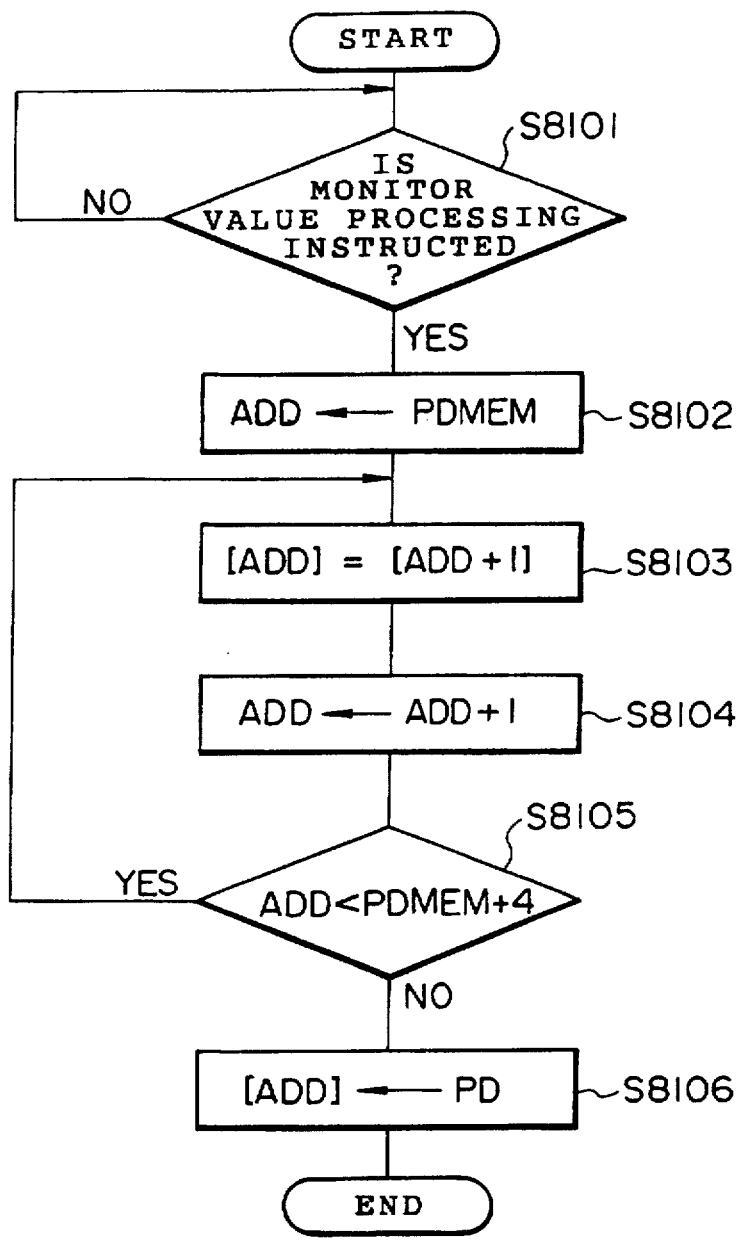
FIG. 41 is a flowchart showing the procedure for intensity control.
Figure 42A:
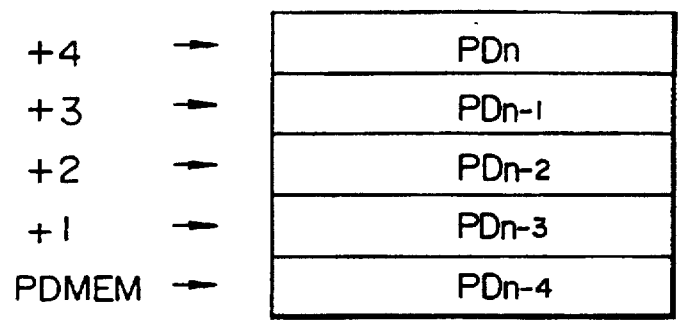
FIGS. 42A and 42B are schematic diagrams showing data used for intensity control.
Figure 42B:
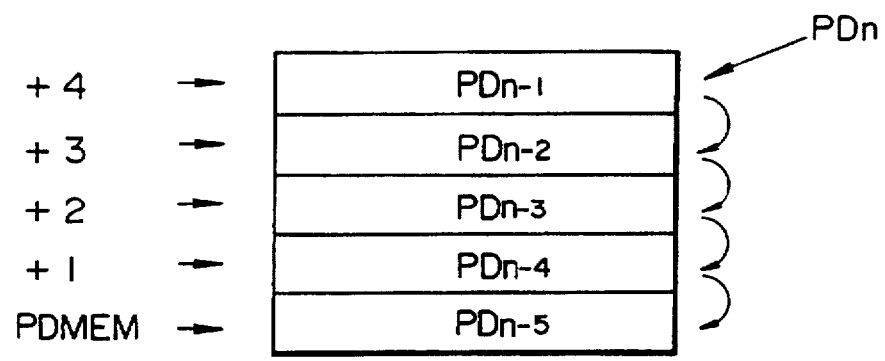

These values are used for the calculation of the output value for attaining the target intensity in the target intensity attaining output value calculation means 407. In the step S8010, the second control is instructed to the output value setting means 406. By this, the output value setting means 406 indicates the calculation of the output value to target intensity attaining output value calculation means 407 and outputs obtained value in response to this indication. Finally, in the step S8011, LOW is set with false and in the step S8012, APCRDY is set with true to complete the emission intensity control. The monitoring value processing means 403 modifies the content of the monitoring value storage means 404 corresponding to the indication from intensity adjustment control means 402. The monitoring value storage means 304, as shown in FIG. 42, stores monitoring values of five times of data read. It stores old monitoring values in the order from the least significant address (PDMEM) of the monitoring value storage means 404, and the latest monitoring value in the most significant address. When the output value is counted up by 1, the execution time n advances by 1, and the data storage location is shifted as shown in FIG. 25. When an input processing instruction is received from the intensity adjustment control means 402, the input monitor value processing means 403 shifts data of the monitoring value storage means 404 to the next lower address, and writes the monitoring value PDn read at that time in the highest address. FIG. 41 shows a flowchart showing the above procedure. That is, in the step S8101, a monitoring value processing instruction is waited for from the intensity adjustment control means 402. When the monitoring value processing instruction is outputted, the execution procedure goes to the step S8102, where the lowest address PDMEM of the monitoring value storage area is written in the pointer ADD. In the step S8103 to the step S8105, the individual data are sequentially shifted as shown in FIG. 40. In the step S8103, the content of the higher next address is written into the area indicated by the pointer at that time. In the step S8104, the pointer is advanced by 1. In the step S8105, the check that the advanced pointer is the highest address of the monitoring value storage area is executed. When the pointer is not the most significant address, the execution procedure returns to the step S8103. When the pointer is in the most significant address, in the step S8106 the monitoring value PD at that time is written in the address location indicated by the pointer, and completes the write procedure.

The means for judging convergence of the SLOPE efficiency 405 judges whether or not the SLOPE efficiency of that time was convergent in response to the instruction from the intensity adjustment control means 402. The method to judge is as follows.

As described above, since the degree of the variety in the drive current at every data read is constant (DRLD is increased by 1 count) during the first control, the SLOPE efficiency can be represented by the increase in the intensity monitoring value at every read.

First, from data stored in the monitoring value storage means 304, an increase $\Delta_n$ in intensity monitoring value at the last time is determined by:

$$\Delta_n = PD_n - PD_{n-1}. \tag{19}$$

Then, an average increase "Δ" between before five times and the last read is determined:

$$"V\Delta_n"(PD_n - PD_{n-5})/5. \tag{20}$$

The above values are compared and, when the difference is within one (1), the SLOPE efficiency is determined to be converged. That is, the SLOPE efficiency is determined to be converged when the following relation is met by:

$$"\Delta"+1 \geq \Delta_n \geq "\Delta"-1. \tag{21}$$

Figure 43:
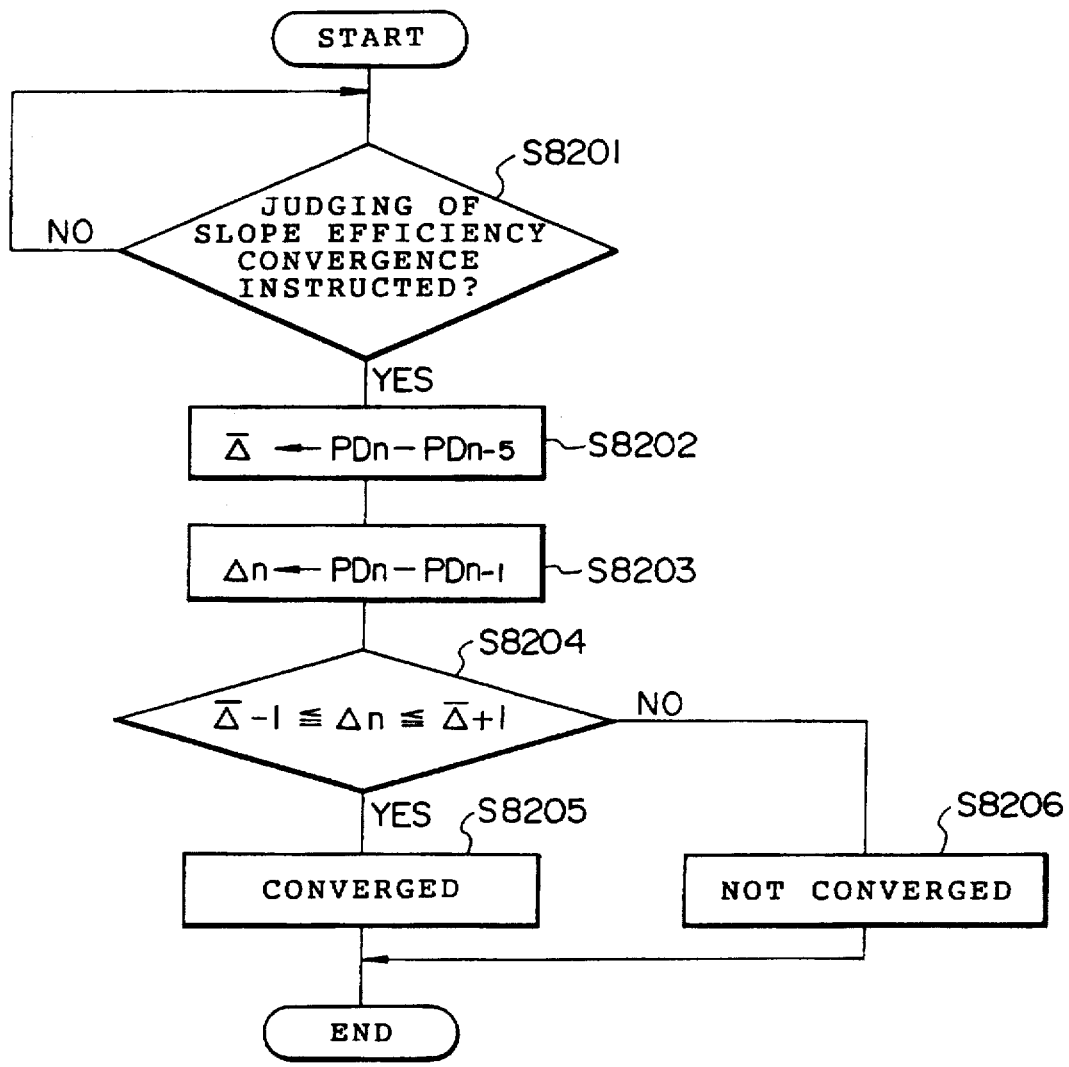
FIG. 43 is a flowchart showing the procedure for intensity control.
Figure 44:
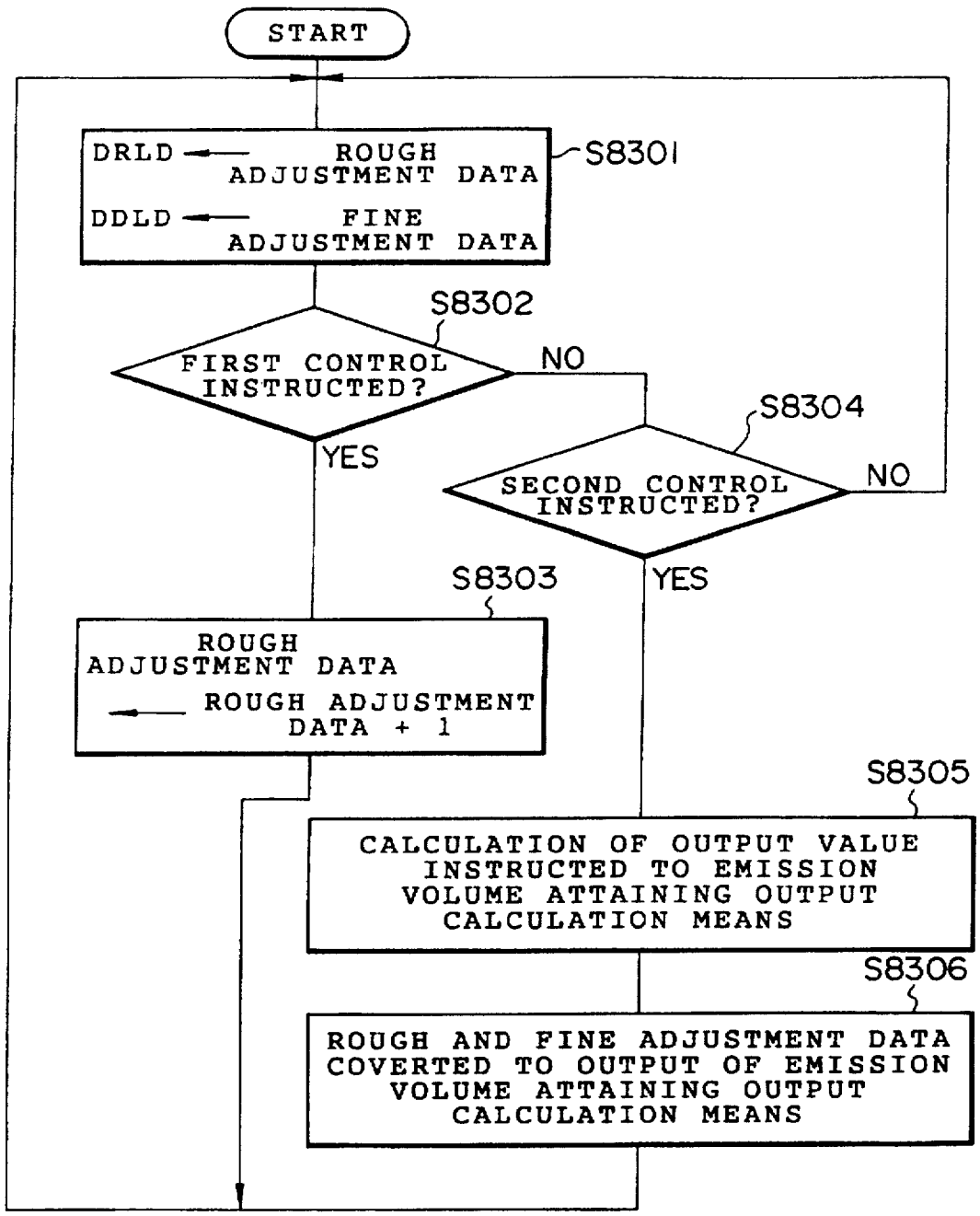
FIG. 44 is a flowchart showing the procedure for intensity control.

The above control procedure is shown in FIG. 43. In the step S8206, the instruction from the intensity adjustment control means is waited and when the instruction is caused, and in the step S8202, the value "Δ" is obtained by formula (20). In the step S8203, the value $\Delta_n$ is obtained by Formula (19). In the step S8204, the check that the condition of Formula (21) is satisfied or not is executed. If it is satisfied, in the step S8205, convergence is determined. If it is not satisfied, in the step S8206, it is judged that convergence has not come. The output value setting means 406 outputs the rough and fine adjustment value stored in the output value storage means 408 as DRLD and DDLD. Then, in response to the instruction from the intensity adjustment control means 402, the data stored in the output value storage means is modified and outputted. As described above, when the instruction of the first control from the intensity adjustment control means 402 has come, the output value setting means 406 writes the output value calculated by the target intensity attaining output value calculation means 407 and outputs it. The above procedure is shown in FIG. 44. In the step S8301, the output value setting means outputs the output values for rough and fine adjustment stored in the output value storage means 408 as DRLD and DDLD respectively. This processing is always executed independent of the instruction of the first control from the intensity adjustment control means 402. Next, in the step S8302, the output values setting means judges whether or not the instruction of the first control is given from the intensity adjustment control means. When the first control is given, the procedure goes to the step S8303 wherein the rough adjustment data in the output value storage means 408 is increased by 1 and returns to the step S8301. When the instruction of the first control is not given in the step S8302, the procedure goes to the step S8304 wherein the check in which the second control in given or not from the intensity adjustment control means is executed. Here, when the instruction of the second control is not given, the procedure returns without processing to continue to output same values. When the instruction of the second instruction is given, in the step S8304, the procedure goes to the step S8305 to instruct the calculation of the output value to the target intensity attaining output value calculation means 407. In the step S8306, each data of rough and fine adjustment obtained by the above calculation means, is written in the output value storage means 408. Then, the procedure returns to the step S8301 wherein the re-written output value is outputted.

The target intensity attaining output value calculation means 407 inputs the monitor value PDn from the monitor value storage means 404, SLOPE efficiency $\Delta s$ from the SLOPE efficiency storage means 410 and control intensity CNTT and obtains the output values of the rough and fine adjustment to calculate output values $DRLD_{n+1}$ and $DDLD_{n+1}$ of the rough and fine adjustment for reaching the target intensity level. The result of the calculation is outputted to the output value setting means. The calculation method of $DRLD_{n+1}$ and $DDLD_{n+1}$ is as follows.

The difference $\Delta T$ between the control intensity and the present intensity value is $$\Delta_T = CNTTGT - PD. \quad (22)$$

Since the intensity change per 1 count of fine adjustment is ⅛ of the rough adjustment, the intensity change is $\Delta s/8$. Therefore, the outputs of the rough adjustment and fine adjustment for obtaining the target intensity are:

$$DRLD_{TGT} = DRLD_n + (\Delta_T/\Delta s), \quad (23)$$

$$DDLD_{TGTn+1} = DDLD_n + [<<\Delta_T/\Delta s \geq \geq \times 8/\Delta s] \quad (24)$$

([x/y]: quotient of x/y, <<x/y>>: residual of x/y)

Figure 45:
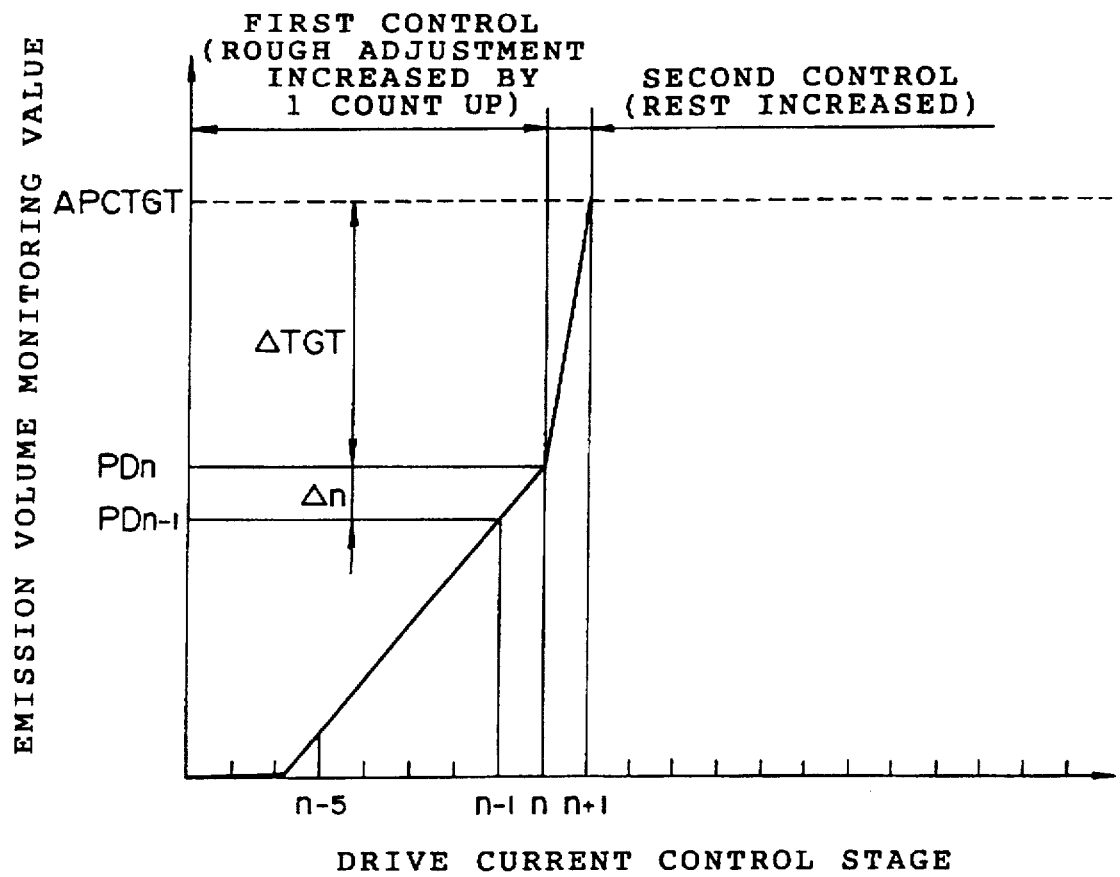
FIG. 45 is a schematic diagram showing relation between the drive current control Step and the light emission intensity monitoring value.

The relation between the step of the intensity control and the value of intensity monitoring is shown in FIG. 45 when the above control was executed by the laser intensity comparison control means. Since the SLOPE efficiency is table from the n–5 step which is 5 times before the n step in the FIG. 45, the SLOPE efficiency of the n step is judged convergence. Then in the n+1 step, the real intensity is directly increased to the target value APCTGT of the intensity so that the intensity control become speedier.

Figure 53:
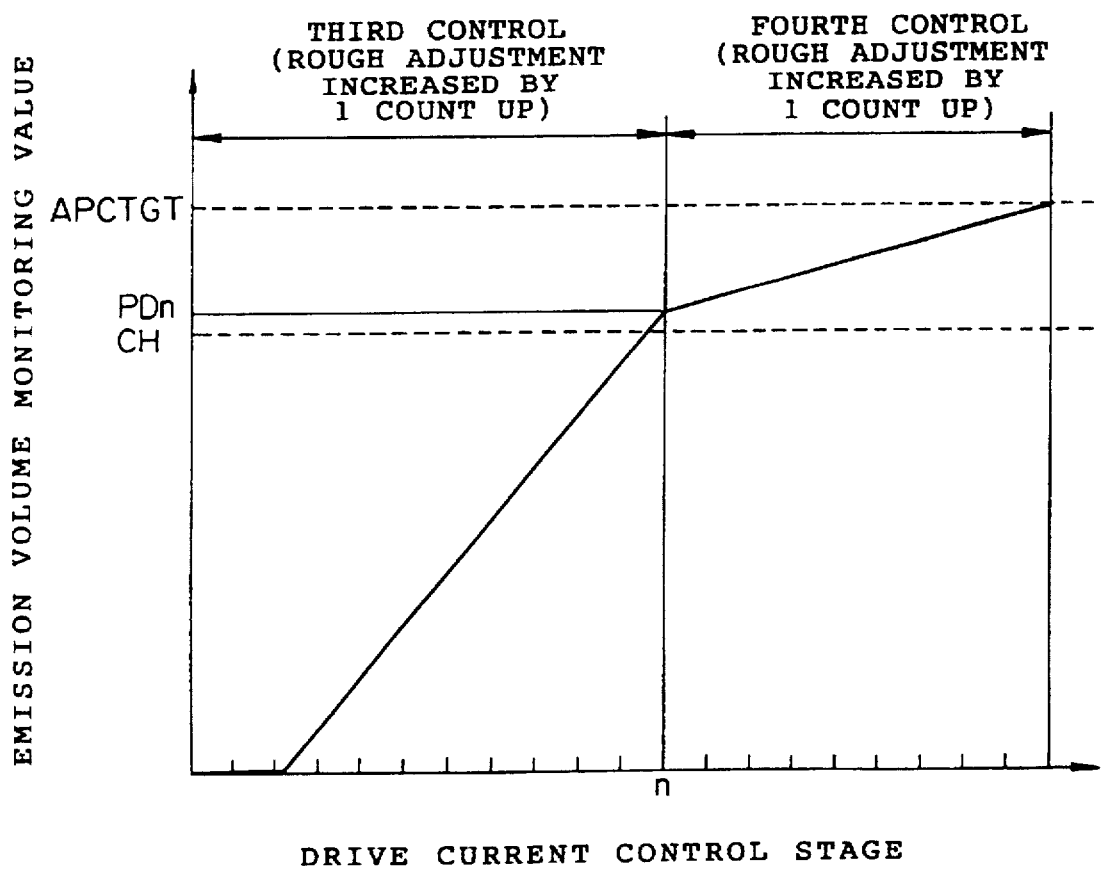
FIG. 53 is a schematic diagram showing relation between the drive current control Step and the light emission intensity monitoring value.

Comparing this control method with the convention control method, for instance, the variety by the method is shown in FIG. 53, in which the rough adjustment control is executed until the real intensity reaches the specified ratio of the target intensity and the fine adjustment control is executed when the real intensity is over the ratio of the target intensity. In this case, the rough adjustment control (third control) is executed until the monitoring value PD of the intensity exceeds the specified ratio (the intensity CH) of the target intensity APCTGT, that is, the step is m. From the step, the fine adjustment control (the fourth control) is executed for obtaining the target intensity APCTGT.

Comparing FIG. 7 with FIG. 16, it is considered that since the SLOPE efficiency is stable before the control step reaches the step m, the step n is smaller than the step m. In the fourth control, the control needs adjustment of a few steps. Since in the second control, the control is completed with 1 step, the control method of the invention is more efficient. Therefore, by the control of the invention, the control of laser intensity being higher efficient became possible.

(Eleventh embodiment)

In the tenth embodiment, the convergence of the SLOPE efficiency is judged by comparing at each step the average SLOPE efficiency of 5 steps before the step with the SLOPE efficiency of the last step. But this judgement is a little complicated. In stead of this control method, it is possible to execute the control method in which, the first control is executed until the real intensity reaches the point being near the target intensity and considered as convergence at the point and when the real intensity reached at the point. The SLOPE efficiency is obtained to adjust the last real intensity by the second control.

For this control predicative (estimate) value PDPRD in each of the step of the first control is obtained. When this value exceeds the target intensity APCTGT, it is judged that real intensity reached the target intensity satisfactorily and the SLOPE efficiency was convergent too. The means 405 for judging convergence of SLOPE efficiency in the eleventh embodiment judges convergence of the SLOPE efficiency by the following method.

$$PDPRD = PD_n + \Delta_n \quad (25)$$

$\Delta_n$ is an increment value from the n–1 step to the n step, which is obtained by Formula (19).

The predictive intensity PDPRD which is obtained by Formula (25) and is a value at the n+1 step, is compared with the target value APCTG. When the value PDPRD exceeds the value APCTGT, it is judged convergence.

Figure 47:
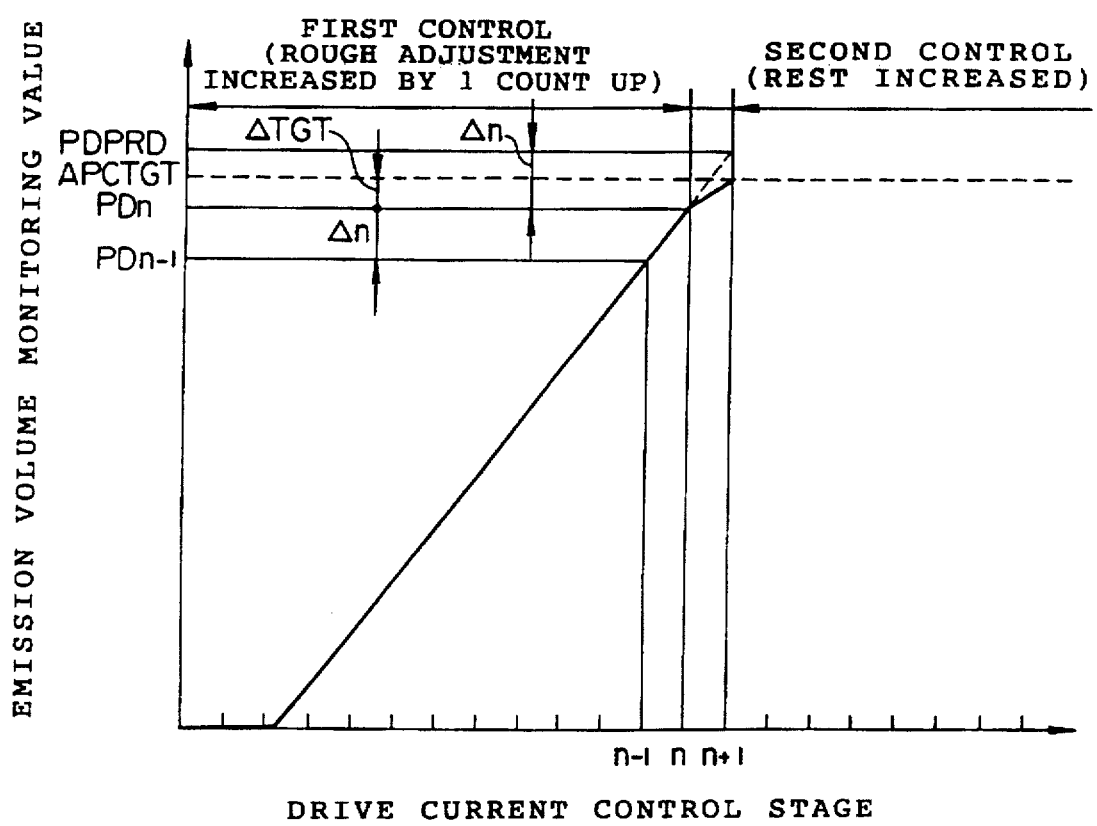
FIG. 47 is a schematic diagram showing relation between the drive current control Step and the light emission intensity monitoring value.

The control procedure of the means 405 for judging convergence of SLOPE efficiency in the embodiment is shown in FIG. 46. The relation between the monitoring value of the intensity and the steps of the intensity control is shown in FIG. 47 when the control in the embodiment is executed according to the eleventh embodiment. In the procedure, the instruction from the intensity adjustment control means 402 is waited in the step S8401. The instruction is generated, the procedure goes to the step S8402 and value $\Delta_n$ is obtained by Formula (19). Next, the value PDPRD is obtained by Formula (25) in the step S8403. In the step S8404, the value PDPRD is compared with the target intensity value APCTGT. If the value PDPRD exceeds or equals to the value APCTGT, the procedure goes to the step S8405 to judge that the SLOPE efficiency was convergent. If the value PDPRD is smaller than the target intensity value APCTGT, the procedure goes to the step S8406 to judge that it is not convergent. The arrangement and control procedure except the above description are same as those in the tenth embodiment.

Comparing the FIG. 47 with FIG. 45 in the tenth embodiment and FIG. 53 in the prior art respectively. The efficiency is less than the one shown in FIG. 18 of the tenth embodiment, but higher than the on shown in FIG. 16 of the prior art since the processing for judgement of SLOPE efficiency about convergence is simple.

(Twelfth embodiment)

In the tenth embodiment, the convergence of the SLOPE efficiency is judged by comparing at each step the average SLOPE efficiency of 5 steps before the step with the SLOPE efficiency of the last step. In the eleventh embodiment, the convergence of the judgement is judged by comparing at each step the target intensity with the predictive intensity value at the next step. In stead of these methods following method is applicable. That is, the intensity value CSP in which the SLOPE efficiency will be fully convergent is set in advance. When the real intensity value exceeds the intensity value CSP by the first control, it is judge that the SLOPE efficiency was convergent.

Figure 48:
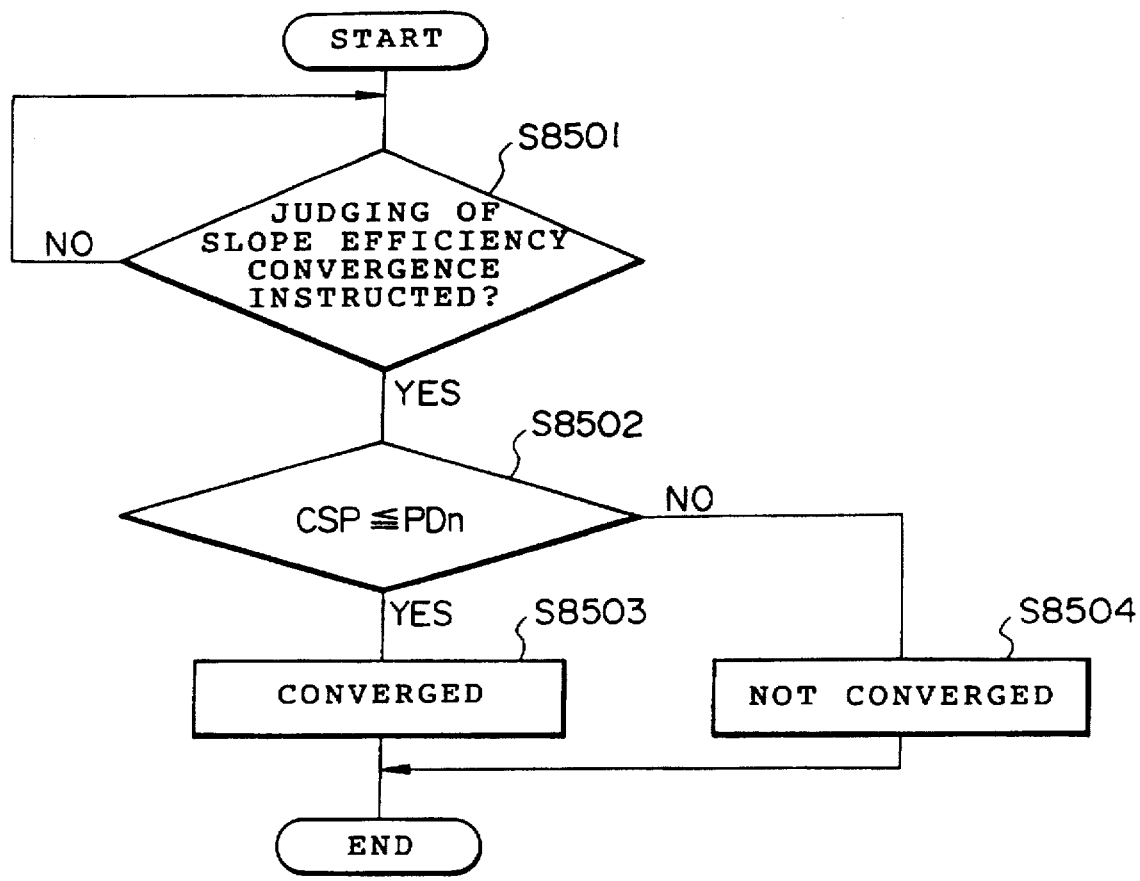
FIG. 48 is a flowchart showing a still further procedure as the twelfth embodiment.
Figure 49:
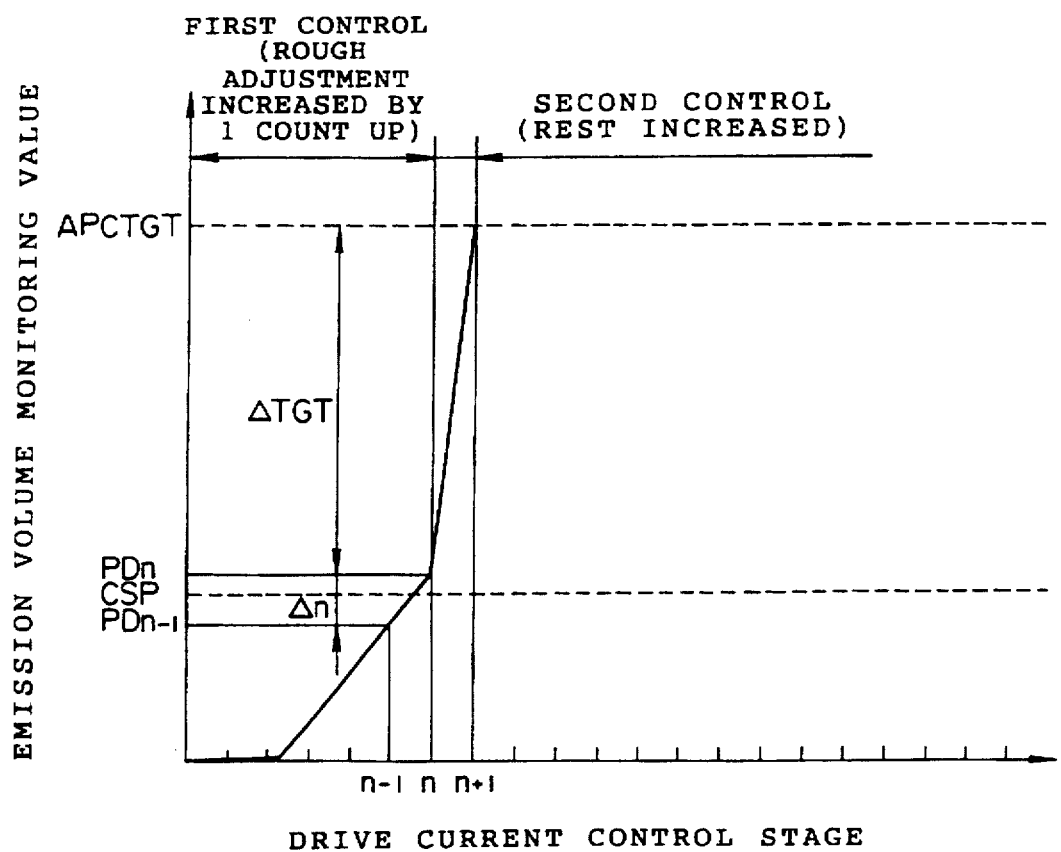
FIG. 49 is a schematic diagram showing relation between the drive current control Step and the light emission intensity monitoring value.

The flowchart of the control procedure of the means 405 for judging convergence of SLOPE efficiency in the twelfth embodiment, is shown in FIG. 48. The relation the steps of the intensity control and the intensity monitoring value by the control method in the twelfth embodiment is shown in FIG. 49. The relation between the steps of the intensity control and the intensity monitoring value is shown in FIG. 49 when the intensity control is executed according to the twelfth embodiment. At the step S501, the instruction from the intensity adjustment control means 402 is waited. When the instruction is generated, the procedure goes to the step S502 and the monitoring value PDn of the intensity at that time is compared with the intensity value CSP for judging convergence of SLOPE efficiency. When the value PDn is larger than the value CSP, the procedure goes to the step S8503 to judge convergence. When the value PDn is smaller than the value CSP, the procedure goes to the step S8504 to judge non-convergence. Other arrangement and control procedure are same as those of the tenth embodiment or the eleventh embodiment. Comparing FIG. 49 with FIG. 45 of the tenth embodiment, FIG. 47 of the eleventh embodiment and FIG. 53 of the prior art, it is apparent that the efficiency of the twelfth embodiment is better than that of the tenth embodiment if the suitable value CSP for judging convergence of the SLOPE efficiency is set. In general, the control method in this embodiment can complete the intensity control speedily than the others. Further, in the convergence proceeding, the control method in this embodiment is easier than those of the tenth embodiment and the eleventh embodiment as described above. This method is very effective, since the laser is almost used within the specified range in which the characteristic of the laser is limited in general.

(Thirteenth embodiment)

The method in which the real intensity reaches directly the target level with one step in the second control such as the tenth, eleventh and twelfth embodiment is effective in control speed. But, in final accuracy (an error between the target intensity and the real intensity), this method is not so higher. Therefore, in the thirteenth embodiment, the real intensity is not increased directly with one step in the second control. In the second control, the first step control such that from the real intensity at that timing, the real intensity is increased until the specified rate of the target intensity, is executed. Next, according to the result of the first step control, the second step control such that the SLOPE efficiency is corrected to obtain the output value to reach the target intensity, is executed. By this, final accuracy of the intensity of laser becomes higher.

Figure 50:
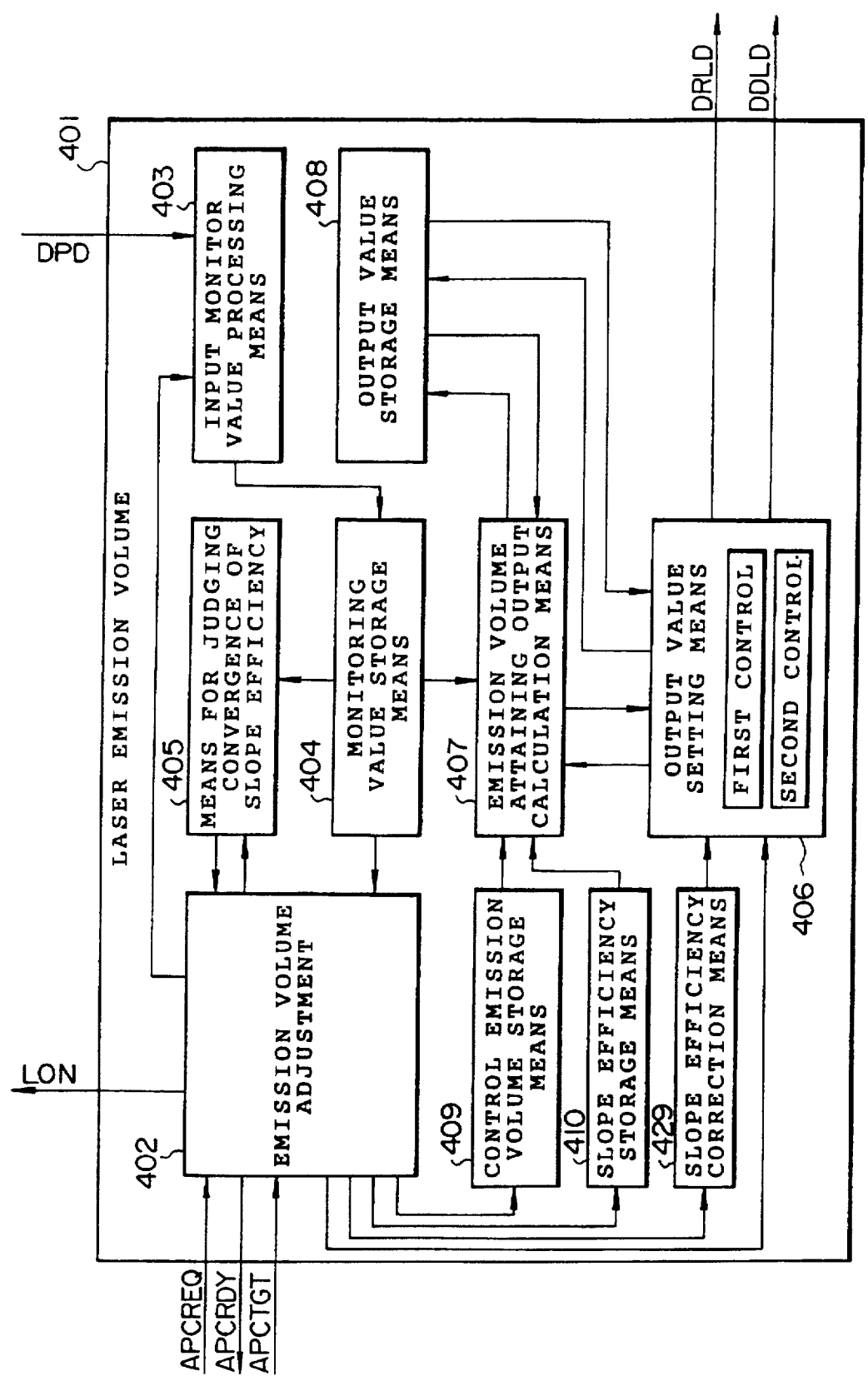
FIG. 50 is a block diagram showing an arrangement of the laser intensity comparing control means as the thirteenth embodiment.

The arrangement of laser intensity comparison control means 401 in the thirteenth embodiment is shown in FIG. 50. This arrangement is almost same as that of the tenth embodiment shown in FIG. 38. The difference is that SLOPE efficiency correction means is added. The SLOPE efficiency correction means rewrite the corrected value on the value in the SLOPE efficiency storage means 410. In the embodiment, when the first step control in the second control described later is completed, the instruction of the correction and variety value of outputted value in the first step control are outputted and the SLOPE efficiency is obtained again on the base of the data in the monitor value storage means 404 to write to the SLOPE efficiency storage means 410.

Figure 51:
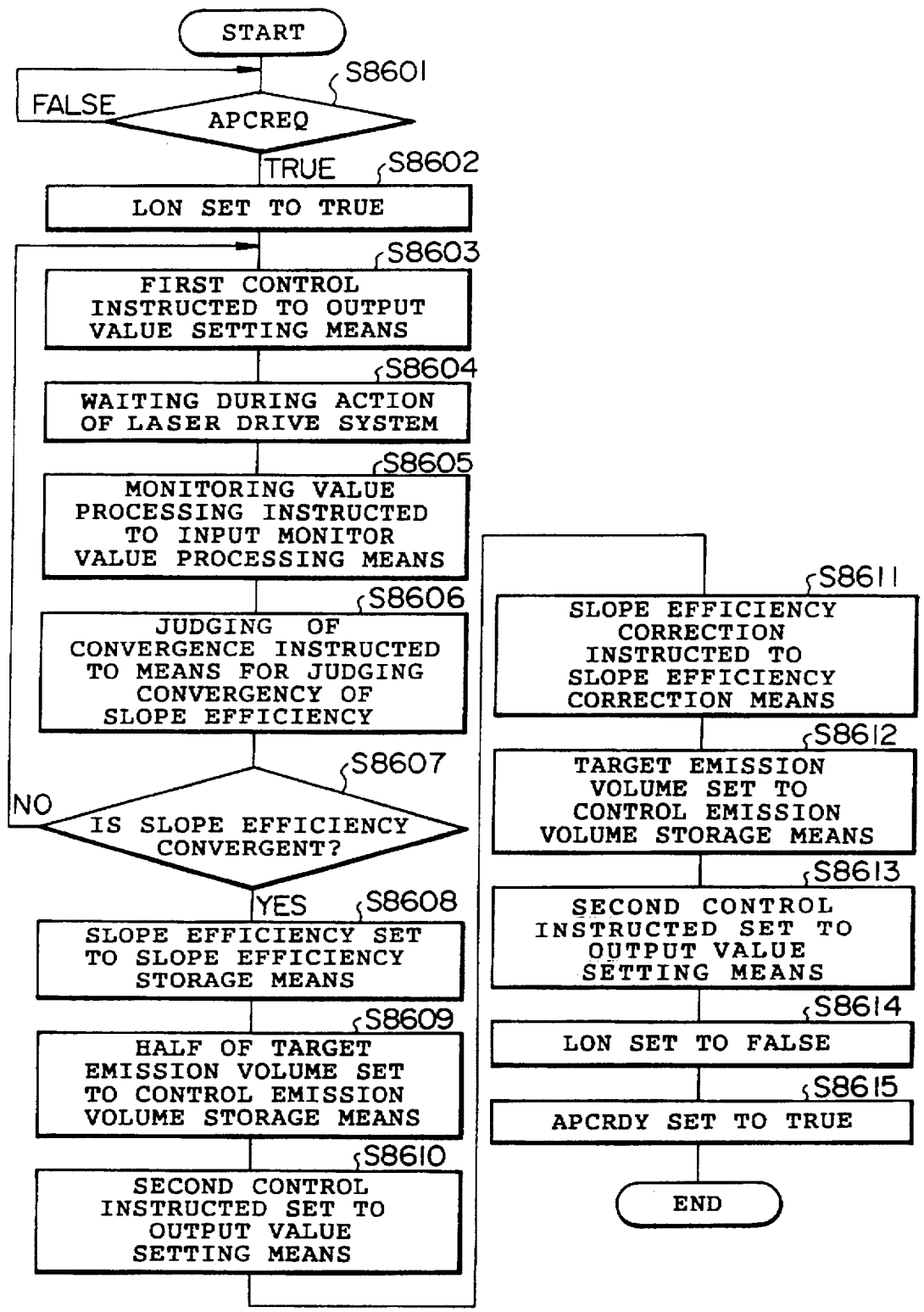
FIG. 51 is a flowchart showing the procedure for intensity control.

The flowchart for the control procedure of the intensity adjustment control means 402 is shown in FIG. 51. The relation between steps of the intensity control and intensity monitoring value when the intensity control is executed according to this embodiment. The procedure of the first control from the step S8601 to the step S8607 is same as the procedure from the step S8001 to the step S8007 shown in FIG. 40. In the embodiment, since the real intensity is controlled to increase to the middle point of the target intensity level in the first step of the second control, according to the judgement of the convergence of the SLOPE efficiency in the step S8607, the procedure goes to the step S8608 to set the SLOPE efficiency at that time on the SLOPE efficiency storage means 410. In the step S8609, the middle value between the target value and the present intensity value (APCTGT-PDn)/2 is set on the control intensity storage means 409 and the SLOPE efficiency $A_n$ at that timing is set on the SLOPE efficiency storage means 400. According to this procedure, the target intensity attaining output value calculation means 407 calculates output value by which the middle intensity between the present intensity and the target intensity is obtained. Then, in the step S8610, the output value setting means 406 is instructed to execute the second control. The above processing is the first control processing. Then, n the step S8611, the instruction for the correction is outputted to the SLOPE efficiency correction means 429. At this timing the variety of the output value from the target intensity attaining output value calculation means 407 is brought to the SLOPE efficiency correction means 429. Here, the SLOPE efficiency correction means 429 obtains the correct SLOPE efficiency $A_{rev}$ as follows.

$$A_{rev}=8\cdot(PD_n-PD_{n-1})/(8\cdot\Delta DRLD+\Delta DDLD) \qquad (26)$$

ΔDRLD is an increment value of rough adjustment value. ΔDDLD is an increment value of fine adjustment value. According to Formula (26), variety value of output intensity per 1 count of rough adjustment is obtained. In the step S8612, the target intensity value APSTGT of the control intensity storage means 409 is set. In the step S8613, the second control is instructed again to the output intensity setting means 406. Since the value of the SLOPE efficiency storage means 410 is corrected already by the SLOPE efficiency correcting means 429, the target intensity attaining output value calculation means 407 calculate the output value to obtain the target level accurately furthermore.

Figure 52:
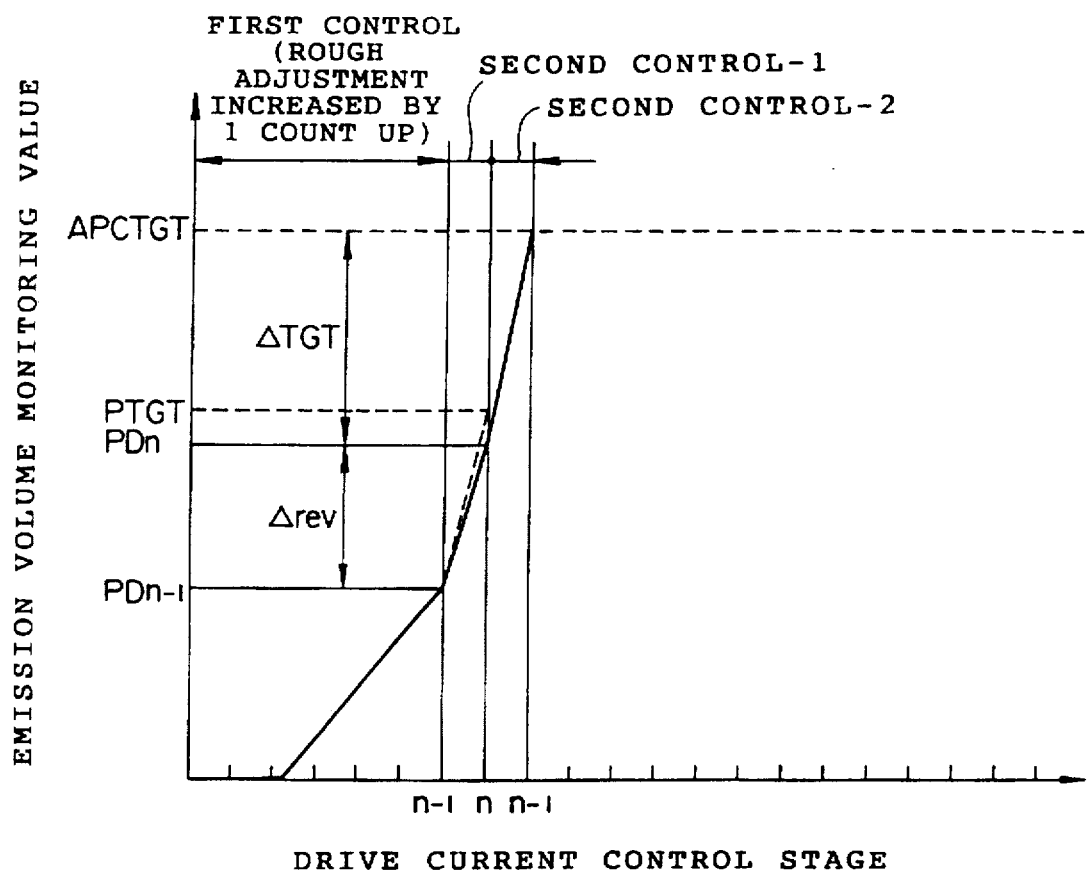
FIG. 52 is a schematic diagram showing relation between the drive current control Step and the light emission intensity monitoring value.

Comparing the first control in FIG. 52 with the one in FIG. 45, it is apparent that high accurate control without change of the control time is possible though the number of the step times in the second control is increased by 1 step.

The present invention has been described in detail with respect to preferred embodiments, and it will now be that changes and modifications may be made without departing from the invention in its broader aspects, and it is the intention, therefore, in the appended claims to cover all such changes and modifications as fall within the true spirit of the invention.

What is claimed is:

1. An apparatus using a semiconductor laser comprising:
   measuring means for measuring a slope efficiency of the semiconductor laser;

detecting means for detecting emission intensity of a laser beam outputted from the semiconductor laser; and control means for controlling a drive current to the semiconductor laser;

wherein said control means includes a first mode in which the drive current to the semiconductor laser is varied stepwisely on the basis of the output from said detecting means and a specified value and a second mode in which the drive current to the semiconductor laser is determined on the basis of the slope efficiency measured by said measuring means.

2. An apparatus using a semiconductor laser as claimed in claim 1, wherein said control means controls the drive current to the semiconductor laser by outputting a control signal which is quantified roughly in the first mode and controls the drive current to the semiconductor laser by outputting a control signal which is quantified finely in the second mode.

3. An apparatus using a semiconductor laser as claimed in claim 1, wherein said control means increases the drive current into the semiconductor laser stepwisely in the first mode and completes the first mode before the output from said detecting means reaches the specified value.

4. An apparatus using a semiconductor laser as claimed in claim 1, wherein said measuring means measures the slope efficiency in the first mode.

5. An apparatus using a semiconductor laser as claimed in claim 4, wherein on the basis of a difference between the output of said detecting means corresponding to the drive current determined in the second mode and the specified value, said control means corrects the slope efficiency measured by said measuring means and executes the second mode again.

6. An apparatus using a semiconductor laser as claimed in claim 1, further comprising image forming means for forming an image with the laser beam outputted from the semiconductor laser.

7. An apparatus using a semiconductor laser as claimed in claim 6, wherein said control means operates in the first mode during a preparation period of said apparatus, and operates in the second mode during image forming operation.

8. An apparatus using a semiconductor laser as claimed in claim 6, wherein said image forming means includes a photosensitive member and deflecting means for scanning on the photosensitive member by the laser beam from the semiconductor laser.

9. An apparatus using a semiconductor laser as claimed in claim 8, wherein said apparatus uses a different specified value according to a kind of said photosensitive member for controlling the emission intensity of the laser beam.

10. An apparatus using a semiconductor laser as claimed in claim 1, wherein said control means includes A/D converting means for converting the output of said detecting means into a digital value, a microprocessor for generating a digital value corresponding to the drive current to the semiconductor laser, and D/A converting means for converting the digital value corresponding to the drive current to the semiconductor laser.

11. An image forming apparatus using a laser diode comprising:

laser emission detection means for detecting laser emission intensity of said laser diode;

drive current supply means for supplying drive current to said laser diode; and laser emission intensity comparison control means for controlling the laser emission intensity of said laser diode by varying the drive current of said drive current supply means according to the detection result of said laser emission detection means;

wherein said laser emission intensity comparison control means makes laser emission intensity adjustment in two steps including a preliminary adjustment made under a condition other than image forming of said image forming apparatus, the preliminary adjustment being executed before starting of image formation, and a final adjustment made before starting of image forming;

wherein said laser emission intensity comparison control means determines, as the slope efficiency, emission intensity change ratio which corresponds to the drive current change of the laser diode in the preliminary adjustment and determining, as an initial value of the final adjustment, an output value of the drive current for obtaining emission intensity in a range which does not exceed the target emission intensity; and wherein said laser emission intensity comparison control means in the final adjustment starts adjustment from the initial value of the final adjustment, and calculates an output value of the drive current for obtaining a final target emission intensity using a difference between the emission intensity and the target emission intensity by the initial drive current and using the slope efficiency.

12. An image forming apparatus using a laser diode as claimed in claim 11, wherein said preliminary adjustment is executed at initial drive of a component which differs from said laser diode drive current supply means.

13. The image forming apparatus using a laser diode as claimed in claim 11, wherein said initial value of the final adjustment and said slope efficiency are corrected every time in which said final adjustment is executed.

14. The image forming apparatus using a laser diode as claimed in claim 11, wherein when a deviation between an emission intensity after the final adjustment and the final target emission intensity is greater than a specified value, the slope efficiency is corrected according to an actual output result, and the final adjustment is repeated until the emission intensity is within the specified deviation from the final target emission intensity.

15. An apparatus using a semiconductor laser diode comprising:

detection means for detecting laser emission intensity of said semiconductor laser; and control means for controlling supply current to said semiconductor laser to make said semiconductor laser generate at target emission intensity on the basis of the result of the detection of said detection means;

wherein said control means includes judge means for judging that a slope efficiency showing a change ratio of laser emission intensity of said semiconductor laser has converged, and calculation means for calculating a value of the supply current being necessary for making said semiconductor laser emit at specified intensity emission on the basis of the intensity of the emission detected by said detection means and the slope efficiency judged to have converged by said judge means.

16. An apparatus using a semiconductor laser as claimed in claim 15, wherein said control means includes a first emission control mode in which the supply current to said semiconductor laser is varied sequentially and a second emission control mode in which the value of supply current calculated by said calculation means is used after the slope efficiency is judged to have converged by said judge means in the first mode.

17. An apparatus using a semiconductor laser as claimed in claim 16, wherein said judge means judges convergence of the slope efficiency by comparing an average of the slope efficiency at multiple previous steps in said first emission mode with a slope efficiency at a current step.

18. An apparatus using a semiconductor laser as claimed in claim 16, wherein said judge means predicts emission intensity at a step one successive to a current step, and judges that the slope efficiency has converged at a step in which is determined that the predicted emission intensity exceeds the target emission intensity in said first emission control mode.

19. An apparatus using a semiconductor laser as claimed in claim 16, wherein said judge means judges that the slope efficiency has converged when the emission intensity detected by said detection means exceeds a specified emission intensity which is set previously in said first emission control mode.

20. An apparatus using a semiconductor laser as claimed in claim 16, wherein said calculation means calculates a value of supply current necessary for making said semiconductor laser emit at the target emission intensity as the specified emission intensity.

21. An apparatus using a semiconductor laser as claimed in claim 16, wherein in the second control mode, said calculation means makes a first calculation in which a value of supply current necessary for making said semiconductor laser emit at a level of emission intensity which is close to the target emission intensity is calculated as the specified emission intensity, and makes a second calculation in which a value of supply current necessary for making said semiconductor laser emit at the target emission intensity is calculated as the specified emission intensity.

22. An apparatus using a semiconductor laser as claimed in claim 21, wherein said control means includes slope efficiency correction means for correcting the value of the supply current calculated in the first calculation of the second emission control mode on the basis of the result of the detection of said detection means.

23. An image forming apparatus having a semiconductor laser, comprising:
input means for inputting image information externally;
image forming means for forming an image by modulating a laser beam emitted from said semiconductor laser in accordance with the inputted image information;
manual operating means for forming an operation signal in response to manual manipulation thereof;
means for driving said semiconductor laser independently of image formation by said image forming means, and for measuring a slope efficiency of said semiconductor laser in response to the manual operation signal from said manual operating means; and
output means for visually outputting the measured slope efficiency.

24. An image forming apparatus as claimed in claim 23, further comprising a memory for storing a plurality of sets of measured slope efficiency, said output means also for outputting the plurality of sets of measured slope efficiency stored in said memory.

25. An image forming apparatus as claimed in claim 23, further comprising:
means for measuring said slope efficiency at a predetermined time interval; and
a memory for storing the measured slope efficiency,
wherein said output means visually outputs a content stored in said memory in such a way that a change of the measured slope efficiency according to a time lapse is visually apparent.

26. An image forming apparatus as claimed in claim 23, wherein said output means visually outputs the measured slope efficiency by way of said image forming means.

27. An apparatus having a semiconductor laser comprising:
measuring means for measuring a slop efficiency of said semiconductor laser;
recognizing means for recognizing degradation of said semiconductor laser in accordance with a measurement value by said measuring means; and
image forming means for forming an image by a laser beam generated by said semiconductor laser and modulated according to an image signal.

28. An apparatus as claimed in claim 27, wherein said recognizing means comprises first judging means for judging whether or not the measurement value by said measuring means has reached a first specified value.

29. An apparatus as claimed in claim 28, wherein said first specified value is a slope efficiency at which said semiconductor laser emits at a target laser emission intensity if a maximum drive current were to be supplied to said semiconductor laser.

30. An apparatus as claimed in claim 29, further comprising notification means for notifying that said semiconductor laser is to be replaced when said first judging means judges that the measurement value reaches said first specified value.

31. An apparatus as claimed in claim 28, wherein said recognizing means comprises second judging means for judging whether or not the measurement value by said measuring means has reached a second specified value.

32. An apparatus as claimed in claim 31, wherein said second specified value is a slope efficiency at which said semiconductor laser emits at an intolerable laser emission intensity if a maximum drive current were to be supplied to said semiconductor laser.

33. An apparatus as claimed in claim 31, further comprising notification means for making independently distinguishable notifications when the measured slope efficiency reaches said first and second specified values.

34. An apparatus as claimed in claim 31, further comprising means for forbidding said semiconductor laser to be driven when said second judging means judges that the slope efficiency reaches said second specified value.

35. An apparatus as claimed in claim 28, wherein said first specified value is a slope efficiency at which said semiconductor laser emits at an intolerable laser emissions intensity if a maximum drive current were to be supplied to said semiconductor laser.

36. An apparatus as claimed in claim 35, further comprising means for forbidding said semiconductor laser to be driven when said first judging means judges that the measurement value reaches said first specified value.

37. An apparatus as claimed in claim 27, wherein said measuring means measures said slope efficiency at a predetermined time interval.

38. An apparatus as claimed in claim 27, further comprising means for displaying the measured slope efficiency.

39. An apparatus as claimed in claim 27, wherein said image forming means forms an electrographic image.

40. An apparatus as claimed in claim 27, wherein said recognizing means comprises predicting means for predicting a slope efficiency after a specified time according to a previously-measured slope efficiency by said measuring means and a currently-measured slope efficiency by said measuring means.

41. An apparatus as claimed in claim 40, further comprising notification means for notifying that said semiconductor laser is to be replaced in accordance with the prediction result by said predicting means.

42. An apparatus as claimed in claim 41, wherein said recognizing means comprises judging means for judging whether or not the predicted slope efficiency by said predicting means has reached a predetermined value and said notification means notifies that said semiconductor laser is to be replaced in accordance with a result of judgment by said judging means.

* * * * *

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana Page 1 of 15

It is certified that error appears in the above-identified patent and that said Letters Patent is hereby corrected as shown below:

<u>IN THE DRAWINGS</u>

Sheet 1, Figure 1, change "THROVE" to --SLOPE--.

Sheet 2, Figure 2, change "THROVE" to --SLOPE--.

<u>COLUMN 1</u>

Line 21, change "deposed" to --disposed--.

<u>COLUMN 2</u>

Line 41, change "laser shows" to --lasers show--.

Line 42, change "turns" to --turn--.

Line 57, change "is suffered" to --suffers--.

Line 62, change "laser" to --the laser--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana It is certified that error appears in the above-identified patent and that said Letters Patent is hereby corrected as shown below:

COLUMN 3

Line 17, change "the" to --a--.

Line 34, change "Stepwise" to --stepwise--.

Line 46, change "Stepwise" to --stepwise--.

Line 49, change "until" to --to--.

Line 64, change "Stepwise" to --stepwise--.

COLUMN 4

Line 10, change "a" to --an--.

Line 11, change "increases" to --to increase--.

Line 13, change "laser" to --lasers--.

Line 34, change "to solve" to --of solving--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana Page 3 of 15

It is certified that error appears in the above-identified patent and that said Letters Patent is hereby corrected as shown below:

COLUMN 4

Line 49, delete "from the".

Line 52, after "malfunction" insert --,--.

Line 61, change "continues" to --continuous--.

Line 65, change "is possible to" to --is capable of--.

Line 66, change "execute" to --executing--.

COLUMN 5

Line 41, before "first" insert --a--.

Line 43, change "stepwise" to --stepwisely--.

Line 44, before "second" insert --a--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita,
Yuzo Seino, Kaoru Sato and
Tatsuto Tachibana It is certified that error appears in the above-identified patent and that said Letters Patent is hereby corrected as shown below:

COLUMN 6

Line 1, change "reduces" to --decreases--.

Line 3, change "reduces" to --decreases--.

Line 5, change "reduces" to --decreases--.

Line 45, change "object" to --objects--.

COLUMN 7

Line 41, change "Step" to --step--.

Line 46, change "Step" to --step--.

Line 56, change "Step" to --step--.

Line 59, change "Step" to --step--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana Page 5 of 15

It is certified that error appears in the above-identified patent and that said Letters Patent is hereby corrected as shown below:

COLUMN 8

Line 17, change "Step" to --step--.

Line 22, change "Step" to --step--.

Line 27, change "Step" to --step--.

Line 36, change "Step" to --step--.

Line 39, change "Step" to --step--.

Line 67, after "be" insert --at--.

COLUMN 9

Line 6, change "When regarding" to --With regard--.

Line 11, change "set" to --sets--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana It is certified that error appears in the above-identified patent and that said Letters Patent is hereby corrected as shown below:

COLUMN 10

Line 22, change "When regarding" to --With regard--.

Line 28, change "set" to --sets--.

COLUMN 11

Line 12, change ">" to --<--.

Line 57, change "$\eta$" to --$\eta'$--.

Line 67, change "measure" to --measured--.

COLUMN 12

Line 4, change "measure" to --measured--.

Line 51, change "When regarding" to --With regard to--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita,
Yuzo Seino, Kaoru Sato and
Tatsuto Tachibana It is certified that error appears in the above-identified patent and that said Letters Patent is hereby corrected as shown below:

COLUMN 14

Line 47, after "the" insert --end of the--.

COLUMN 15

Line 27, change "characteristics" to --characteristic--.

Line 29, change "degradation characteristics" to --a degradation characteristic--.

COLUMN 16

Line 5, delete "give".

Line 11, change "the laser light emission to reach" to --that the laser light emission has reached--.

Line 28, change "uses this arrangement bring" to --using this arrangement brings--.

Line 49, change "Steps" to --steps--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita,
Yuzo Seino, Kaoru Sato and
Tatsuto Tachibana It is certified that error appears in the above-identified patent and that said Letters Patent is hereby corrected as shown below:

COLUMN 17

Line 23, delete "a".

Line 50, change "Step" to --step--.

Line 58, change "of" to --for--.

Line 61, change "response" to --respond--.

COLUMN 18

Line 3, change "Step" to --step--.

COLUMN 19

Line 20, delete "by".

Line 53, change "$A_{min}$" to --$\Delta_{min}$--.

UNITED STATES PATENT AND TRADEMARK OFFICE
CERTIFICATE OF CORRECTION

PATENT NO.  : 5,754,576

DATED       : May 19, 1998

INVENTORS   : Akihisa Kusano, Izumi Narita,
              Yuzo Seino, Kaoru Sato and
              Tatsuto Tachibana It is certified that error appears in the above-identified patent and that said Letters Patent is hereby corrected as shown below:

COLUMN 20

Line 5, change "Step" to --step--.

Line 6, change "Step" to --step--.

Line 11, change "Step" to --step--.

Line 12, change "Step" to --step--.

Line 24, change "Step" (first occurrence) to --step--.

Line 31, change "Step" to --step--.

Line 59, change "DRLD TGT" to --$DRLD_{TGT}$--.

Line 60, change "DDLD TGT" to --$DDLD_{TGT}$--.

Line 63, change "DRLD TGT" to --$DRLD_{TGT}$--; and
         change "DDELD TGT" to --$DDLD_{TGT}$--

UNITED STATES PATENT AND TRADEMARK OFFICE
CERTIFICATE OF CORRECTION

PATENT NO. : 5,754,576
DATED : May 19, 1998
INVENTORS : Akihisa Kusano, Izumi Narita, Yuzo Seino, Kaoru Sato and Tatsuto Tachibana Page 10 of 15

It is certified that error appears in the above-identified patent and that said Letters Patent is hereby corrected as shown below:

COLUMN 21

Line 47, change "efficacy" to --efficiency--.

Line 51, change "actually once" to --an--.

Line 65, change "PD n" to --$PD_n$--.

Line 67, change "a" to --$\varepsilon$--.

COLUMN 22

Line 26, change "show" to --shown--.

Line 40, change "until" to --up to--.

COLUMN 23

Line 21, delete "an".

Line 22, change "415 and 416" to --414 and 415--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana It is certified that error appears in the above-identified patent and that said Letters Patent is hereby corrected as shown below:

COLUMN 23

Line 43, change "the laser light emission to" to --that the laser light emission has--.

Line 44, change "reach" to --reached--.

Line 61, change "uses this arrangement bring" to --using this arrangement brings--.

COLUMN 25

Line 40, change "storaged" to --stored--.

COLUMN 26

Line 38, after "$_n$""insert ---=--.

Line 42, delete "by".

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana It is certified that error appears in the above-identified patent and that said Letters Patent is hereby corrected as shown below:

COLUMN 27

Line 12, change "in" (second occurrence) to --is--.

Line 46, change "$\geq\geq$" to -->>--.

Line 52, change "table" to --stable--.

Line 55, change "convergence" to --to be convergent--.

Line 57, change "become" to --becomes--.

COLUMN 28

Line 8, delete "the" (third occurrence).

Line 9, "control of laser intensity being higher efficient became" to --more efficient control of laser intensity becomes--.

Line 16, change "In stead" to --instead--.

Line 20, before "reached" insert --is--.

UNITED STATES PATENT AND TRADEMARK OFFICE
CERTIFICATE OF CORRECTION

PATENT NO. : 5,754,576

DATED : May 19, 1998

INVENTORS : Akihisa Kusano, Izumi Narita, Yuzo Seino, Kaoru Sato and Tatsuto Tachibana It is certified that error appears in the above-identified patent and that said Letters Patent is hereby corrected as shown below:

COLUMN 28

Line 24, change "step" to --steps--.

Line 38, change "it is judged convergence" to --a judgment to be convergent--.

Line 48, change "value" ($1^{st}$ occurrence) to --the value of--.

Line 52, delete "to" (first occurrence).

Line 57, before "same" insert --the--.

Line 60, change "respectively. The" to --respectively, the--.

Line 62, change "on" to --one--.

COLUMN 29

Line 5, change "In stead" to --instead--; and before "following" insert --the--.

UNITED STATES PATENT AND TRADEMARK OFFICE
CERTIFICATE OF CORRECTION

PATENT NO. : 5,754,576
DATED : May 19, 1998
INVENTORS : Akihisa Kusano, Izumi Narita, Yuzo Seino, Kaoru Sato and Tatsuto Tachibana It is certified that error appears in the above-identified patent and that said Letters Patent is hereby corrected as shown below:

COLUMN 29

Line 9, change "judge" to --judged--.

Line 19, change "S501" to --S8501--.

Line 22, change "S502" to --S8502--.

Line 29, change "cedure are same" to --cedures are the same--.

Line 37, before "speedily" insert --more--.

Line 50, change "higher" to --much better--.

Line 59, before "laser" insert --the--.

Line 65, change "rewrite" to --rewrites--.

COLUMN 30

Line 4, change "base" to --basis--.

Line 12, before "same" insert --the--.

Line 31, change "n" to --in--.

UNITED STATES PATENT AND TRADEMARK OFFICE
CERTIFICATE OF CORRECTION

PATENT NO. : 5,754,576
DATED : May 19, 1998
INVENTOR(S) : Akihisa Kusano, Izumi Narita, Yuzo Seino, Kaoru Sato and Tatsuto Tachibana It is certified that error appears in the above-identified patent and that said Letters Patent is hereby corrected as shown below:

COLUMN 30

Line 44, change "APSTGT" to --APCTGT--.

Line 50, change "calculate" to --calculates--.

Line 53, change "high" to --highly--.

Line 57, after "be" insert --seen--.

COLUMN 33

Line 56, change "forming an" to --providing a manual--.

COLUMN 34

Line 17, change "slop" to --slope--.

Signed and Sealed this

Thirteenth Day of July, 1999

Attest:

Attesting Officer

Q. TODD DICKINSON

Acting Commissioner of Patents and Trademarks